(12) United States Patent
Shelnutt et al.

(10) Patent No.: US 9,049,800 B2
(45) Date of Patent: Jun. 2, 2015

(54) IMMERSION SERVER, IMMERSION SERVER DRAWER, AND RACK-MOUNTABLE IMMERSION SERVER DRAWER-BASED CABINET

(71) Applicant: Dell Products L.P., Round Rock, TX (US)

(72) Inventors: Austin Michael Shelnutt, Pflugerville, TX (US); James D. Curlee, Round Rock, TX (US); Jimmy Pike, Georgetown, TX (US); Joseph M. Sekel, Austin, TX (US); Stephen P. Rousset, Round Rock, TX (US); Joseph Vivio, Santa Rosa, CA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 13/757,724

(22) Filed: Feb. 1, 2013

(65) Prior Publication Data

US 2015/0062806 A1    Mar. 5, 2015

(51) Int. Cl.
*H05K 7/20* (2006.01)
*H05K 5/00* (2006.01)
*H05K 5/06* (2006.01)
*H05K 5/02* (2006.01)

(52) U.S. Cl.
CPC ............... *H05K 7/203* (2013.01); *H05K 7/208* (2013.01); *H05K 5/00* (2013.01); *H05K 5/067* (2013.01); *H05K 5/061* (2013.01); *H05K 5/0221* (2013.01); *H05K 7/20318* (2013.01)

(58) Field of Classification Search
USPC ........................ 361/679.46–679.53, 688, 689, 361/698–702, 715–727; 165/80.2–80.5, 165/104.19, 104.33, 164–170, 185; 62/259.2, 259.3, 457.2, 457.9; 174/15.1, 16.3; 257/714
See application file for complete search history.

(56) References Cited

U.S. PATENT DOCUMENTS

| | | | | |
|---|---|---|---|---|
| 3,586,101 | A * | 6/1971 | Chu et al. | 165/101 |
| 4,590,538 | A * | 5/1986 | Cray, Jr. | 361/700 |
| 6,393,853 | B1 * | 5/2002 | Vukovic et al. | 62/259.2 |
| 7,466,549 | B2 * | 12/2008 | Dorrich et al. | 361/699 |
| 7,639,499 | B1 * | 12/2009 | Campbell et al. | 361/699 |
| 8,035,972 | B2 * | 10/2011 | Ostwald et al. | 361/699 |
| 8,184,436 | B2 * | 5/2012 | Campbell et al. | 361/700 |
| 8,654,529 | B2 * | 2/2014 | Attlesey | 361/699 |
| 8,749,968 | B1 * | 6/2014 | Branton | 361/679.53 |
| 2005/0254214 | A1* | 11/2005 | Salmon | 361/699 |
| 2011/0132579 | A1* | 6/2011 | Best et al. | 165/104.31 |
| 2012/0075797 | A1* | 3/2012 | Attlesey | 361/679.53 |
| 2014/0211412 | A1* | 7/2014 | Best | 361/679.47 |

* cited by examiner

*Primary Examiner* — Michail V Datskovskiy
(74) *Attorney, Agent, or Firm* — Isidore PLLC

(57) ABSTRACT

An information handling system includes: an immersion server drawer (ISD) having: an impervious enclosure which holds a volume of dielectric cooling liquid within/at the enclosure bottom. The ISD is configured with dimensions that enable insertion of liquid-cooled servers within the enclosure bottom. A plurality of liquid-cooled servers can be placed in a side-by-side configuration along one dimension of the ISD, with one or more heat dissipating components of the servers being placed below a surface layer of the cooling liquid. Submerged components of the immersion server are liquid-cooled, while the other heat generating components above the liquid surface are air cooled by rising vapor generated by boiling and vaporization of the cooling liquid. The ISD is placed in an ISD cabinet, which is configured with an upper condenser that allows for multi-phase cooling of the electronic devices placed within the immersion server drawer. The ISD cabinet can be rack-mountable.

27 Claims, 29 Drawing Sheets

IMMERSION SERVER, IMMERSION SERVER DRAWER, AND RACK-MOUNTABLE IMMERSION SERVER DRAWER-BASED CABINET

BACKGROUND

1. Technical Field

The present disclosure generally relates to liquid cooling of information handling systems and in particular to an immersion cooling vessel that is specifically designed for cooling of immersion-based cooling of electronics such as an information handling system. Still more particularly, aspects of the present disclosure relate to an immersion server drawer and associated immersion server drawer (ISD) cabinet that is rack mountable. Additional aspects of the present disclosure relate to an information handling system that is specifically designed to facilitate both liquid cooling and vapor cooling of specific devices within an immersion cooling vessel.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Large scale server systems are examples of information handling systems. These servers can perform significant workloads and generate and/or dissipate a large amount of heat during their operation. Due in part to the large amount of heat generated, these servers are typically rack mounted and cooled via fans built on the devices and a large system of fans attached to or placed directly behind, or adjacent to, the rack of servers. As the need for access to greater and greater processing and storage resources continues to expand, limitations arise surrounding available space for expansion, building and equipment costs, and communication latency. This trend creates a need to increase the density of server systems (i.e., the amount of processing power and/or storage placed on a single server, the number of servers placed in a single rack, and/or the number of servers and/or racks deployed on a single server farm. With the increasing processing and/or storage density in these rack-based server systems, the thermal challenges that result continue to be one of the biggest obstacles. Conventional fan based cooling systems require large amounts of power, and the cost of power required to drive high flow fans increases exponentially with the increase in server densities. Additionally, cooling of electronic components with air requires special consideration for air-quality parameters including: temperature, humidity, altitude, and airborne particulate and contamination. What is therefore needed is an efficient, low power usage system and method for cooling these servers and server systems.

BRIEF SUMMARY

Disclosed are an information handling system configured as a vertically-oriented liquid and vapor cooled immersion server (vLVCIS) or an immersion server, an immersion server drawer, and an immersion server drawer (ISD) cabinet. Also disclosed is a method and system that enables cooling of functional components of an immersion server via an vaporization-condensation cycle utilizing a volatile (i.e., low boiling point) immersion liquid within an immersion server drawer.

According to a first aspect, an immersion server comprises: a motherboard having a lower surface and an upper surface; a vertical arrangement of memory modules within receiving slots on the lower surface of the motherboard; and at least one processor located on the upper surface of the motherboard and communicatively coupled to connectors of the receiving slots by signal traces passing through the motherboard from the upper surface to the lower surface. According to one embodiment, the immersion server further includes voltage regulators affixed to the upper surface of the motherboard. In one embodiment, the motherboard is a first printed circuit board (PCB). In one embodiment, the memory modules are dual inline memory modules (DIMMs).

The immersion server further includes a panel to which the motherboard is communicatively and/or physically connected at one edge. In one embodiment, the panel is oriented at an angle relative to the motherboard such that the mother board extends horizontally, when the panel is placed in a vertical orientation. The immersion server also includes one or more storage devices, which are physically located above the components of the PCB and connected to and/or supported by the solid panel. In one embodiment, the motherboard can be a second PCB. The storage devices can be communicatively connected to the components on the motherboard via connecting traces or wires extending on the panel to the motherboard. According to one embodiment, the storage devices are hard disk drives (HDDs). According to one embodiment, the HDDs can be supported by the backplane. Also, in an alternate embodiment, the HDDs are not supported by the backplane, but are instead supported by some other form of sheet metal support which can be used to supplement or entirely carry the load of the HDDs.

The above described information handling system provides a vertically-oriented arrangement of functional components that enables a bifurcation of cooling where lower components are cooled via liquid cooling and upper components are cooled via vapor cooling. Specifically, the design/arrangement of the vLVCIS enables a first set of components attached to the motherboard (processor, memory modules, etc.) to be submerged in a cooling liquid and be liquid cooled during operation, while a second set of components (specifically the HDDs) attached on the panel above the motherboard are air cooled by rising vapor generated as the liquid evaporates.

As a second aspect, an immersion server drawer is provided that includes an external impervious enclosure configured with opposing side walls, opposing front and rear walls and a bottom wall. The immersion server drawer has a depth dimension extending from the front wall to the rear wall that is sized to receive one or more immersion servers in one of a first and a second orientation. The immersion server drawer also has a width dimension extending from a first side wall to a second side wall that is sized to receive one or more immersion servers in one of a first and a second orientation. Finally, the immersion server drawer has a height dimension extending from the bottom wall to a top of the opposing side walls and sized to receive a single immersion server placed in an upright position. One or more immersion servers are placed within the enclosure in an upright position with a motherboard having the processor and memory components located within a bottom region of the enclosure and the storage devices located closer to the top region of the enclosure. In one embodiment where a plurality of (i.e., multiple) immersion servers are placed within the immersion server drawers, the immersion servers are placed in a side-by-side configuration along the depth of the immersion server drawer, adjacent to each other. In an alternate embodiment involving multiple immersion servers, the immersion servers can be placed in a side-by-side configuration along the width of the immersion server drawer. In yet another embodiment, multiple immersion servers can be placed in both of the width dimension and the depth dimension of the immersion server drawer.

A dielectric cooling fluid is placed within the lower enclosure of the immersion server drawer to a first fluid level that covers the components on the motherboard. In one embodiment, the fluid level is below the storage devices, and cooling of the storage devices occurs via convectional flow of rising vapor from the dielectric fluid. In one embodiment, the immersion server drawer further includes a handle disposed within a front surface of the front wall.

As a third aspect, disclosed is an immersion server drawer (ISD) cabinet, which is a rack-mountable enclosure designed to hold one or more immersion server drawers having one or more immersions servers immersed in a dielectric fluid held therein. In one or more embodiments, the immersion server drawer (ISD) cabinet can be configured to be compatible with standard IT racks that are currently utilized in datacenters. The ISD cabinet can then be inserted into the IT rack with all cooling of the processing and storage components occurring within the drawer enclosure. The ISD cabinet includes at least one drawer receptacle configured to accommodate insertion of an immersion server drawer therein. When fully inserted into the drawer receptacle, the front wall of the immersion server drawer compresses against the exterior front surface of the receptacle to create an air-tight seal, which prevents a loss of dielectric vapor during operation of the one or more immersion servers. A latching mechanism holds the immersion drawer in place to maintain the air-tight seal.

The ISD cabinet includes a condenser located within an upper section above the top of an inserted immersion server drawer. The condenser receives a flow of condensation fluid from an external source and operates to condense rising vapor that evaporates off the surface of the dielectric fluid as the one or more servers dissipate heat. In one or more embodiments, the ISD cabinet includes a top cover within which is disposed a bellows expansion lid that moderates pressure build up due to the rising vapor. Each inserted immersion server drawer can be individually removed from the corresponding receptacle once the latching mechanism is unlatched. The sealed ISD cabinet can be placed within a standard (non-sealed) IT rack or other type of enclosure as the vapor/liquid sealing is completed at the cabinet level.

According to one aspect of the disclosure, at least one of the immersion server, the immersion server drawer, and the immersion server drawer rack enclosure comprises a condensate liquid deflector that channels the condensed dielectric liquid back to the lower enclosure of the immersion server drawer without the condensed dielectric liquid coming into contact with the HDDs of the one or more immersion servers within the immersion server drawer.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
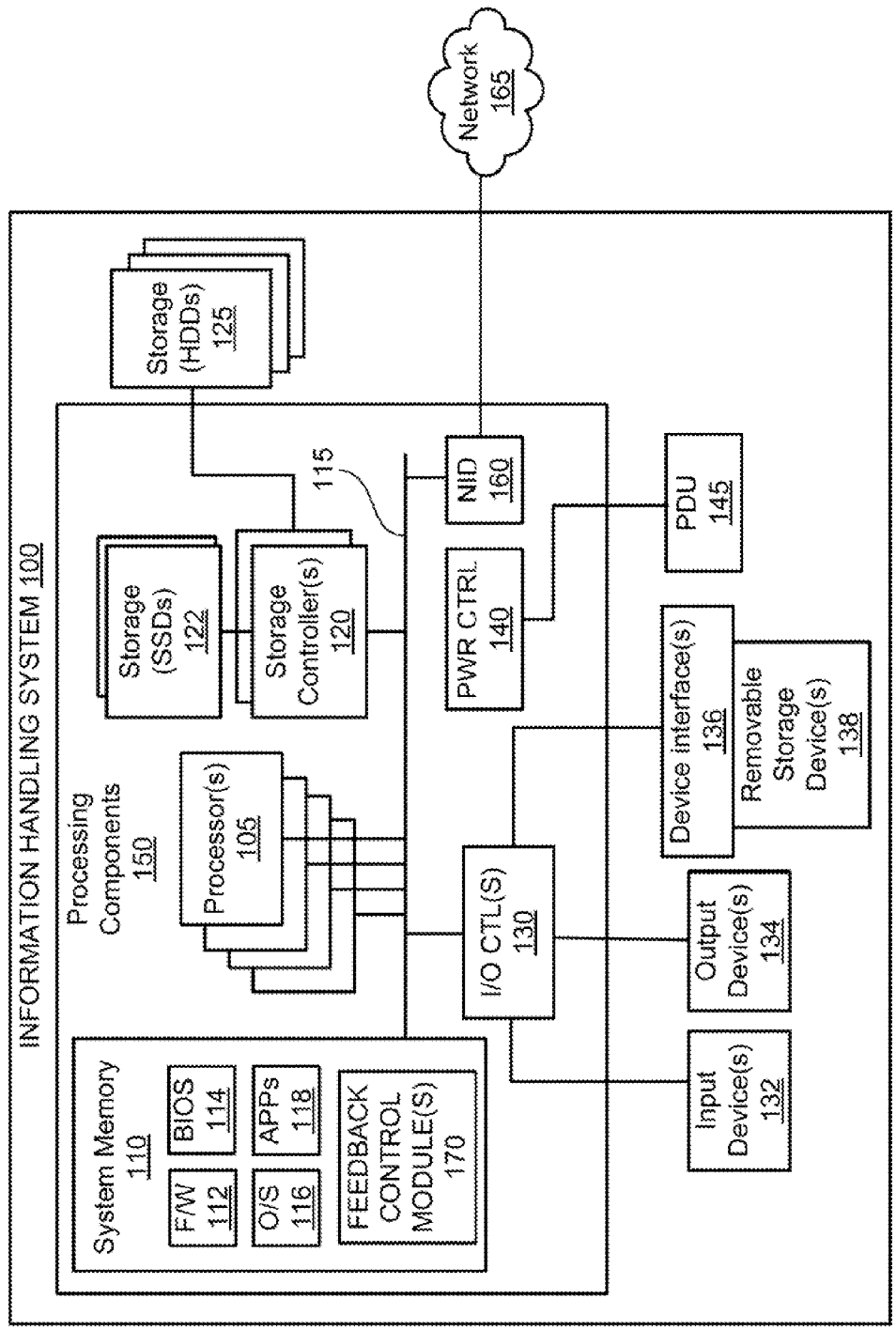
FIG. 1 illustrates one embodiment of an example information handling system with internal processing components and externally located hard disk drives (HDDs), according to one aspect of the disclosure.

The present disclosure provides illustrative embodiments of various aspects of and/or different configurations and implementations of one or more systems, methods, and multiphase heat transfer immersion cooling vessels that enable direct cooling of information handling systems, such as servers, by submerging at least a portion of the physical information handling systems in a dielectric liquid within a multiphase heat transfer immersion cooling vessel.

The disclosure generally includes a plurality of different aspects and multiple different embodiments, and each aspect along with the associated embodiments are described in detail below within one of the titled Sections A-K. A first aspect of the general disclosure, presented in Section A, provides examples of an information handling system and of two different servers configured and/or oriented for use within a rack-based immersion cooling system. Section B, which describes the second aspect of the general disclosure, introduces the design and operation of an example immersion cooling tank, including the description of certain functional characteristics of the immersion cooling tank. A third aspect of the general disclosure is presented in Section C, which provides techniques for cooling hard disk drives (HDDs) of a server by exposing the HDDs to rising vapor from a boiling dielectric liquid in which the processing components are submerged for cooling during processing operations of the server. The fourth aspect of the general disclosure is presented in Section D, which introduces the innovative concept of submerging PDUs in order to prevent electrical arching and improve the efficiency of the PDUs when utilized within an immersion cooling vessel. A fifth aspect of the general disclosure is presented in Section E, which provides a unique design and functionality of the condenser with multiple rotatable condenser sub-units. A sixth aspect of the general disclosure is presented in Section F, which describes a methodology for cooling a target space and/or a device that involves stepped sequencing of multiple heat exchangers (or condensers) with different working fluids. A seventh aspect of the general disclosure is presented in Section G and includes a unique interconnection among multiple immersion tanks to allow cooling liquid levels to be gravitationally equalized across the multiple interconnected immersion tanks. An eight aspect of the general disclosure is presented in Section H, which provides a series of techniques for controlling and/or mitigating the buildup of pressure within the tank, as well as other control functions, in order to maintain the integrity of the tank (e.g., from high pressure vapor leakage, etc.). Sections I and J introduce several novel server design aspects including a vapor deflector for isolating processors, an immersion server, immersion server drawer, and an immersion server drawer-based cabinet, all designed to facilitate immersion-based liquid cooling of the processors and memory modules of the immersion server and vapor cooling of the HDDs. Finally, an eleventh aspect of the general disclosure is presented in Section K, which provides a Stand-alone Immersion Tank Data Center (SITDC) with self-contained cooling.

Additional functional aspects of the general disclosure are presented throughout the description of one or more of the sections. It is appreciated that the description of certain functional aspects of the disclosure within a particular section (rather than in a different section, for example) is presented in that section solely to simplify the order of presentation of information and does not and/or is not intended to limit the specific disclosure content to discrete implementation within only each identified section. Rather, the sections work together to provide a description of a single generally innovative concept with multiple different aspects and/or embodiment corresponding thereto.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments. In the illustration of the various embodiments, two different figures can be provided that have overlaps and/or similarities in the components within the two figures (e.g., FIGS. 2 and 3, and FIGS. 4 and 5). In such instances, the descriptions of these figures can be presented together with associated similar reference numerals separated by commas and/or a slash. Some components that are not expected to be different from one implementation to the other are provided the same reference numerals within the figures, to simplify the descriptions of the figures.

Figure 21A:
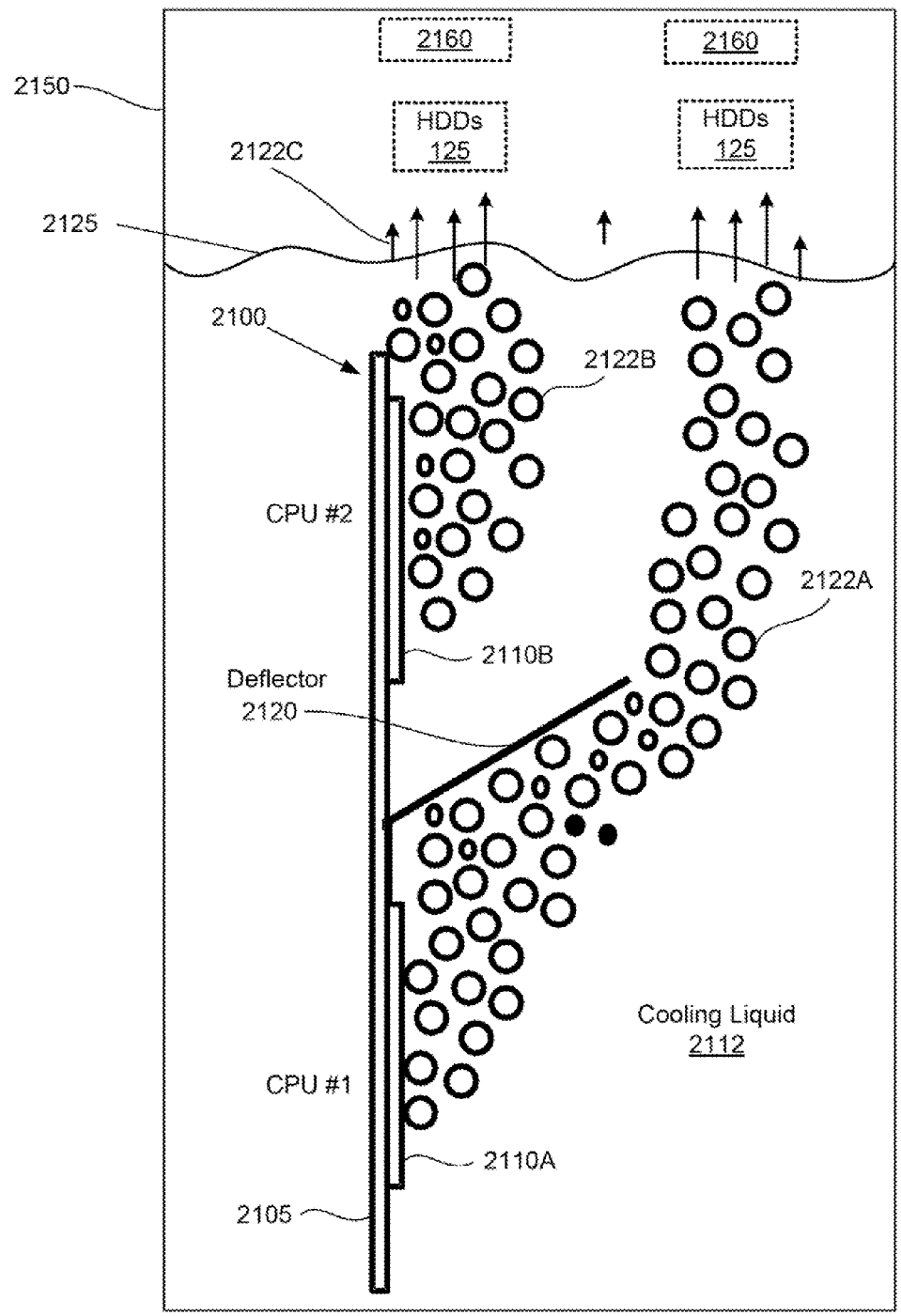
FIG. 21A illustrates an example vertically-oriented server configuration in which a vapor deflector is provided to direct rising vapor bubbles away from upper components that are submerged in cooling liquid, according to one embodiment.

Those of ordinary skill in the art will appreciate that the hardware components and basic configuration depicted in any of the figures illustrated by the drawings and described herein may vary. For example, the illustrative components within information handling system 100 (FIG. 1), example server 200, 300 (FIGS. 2 and 3), immersion server 2100, 2300 (FIGS. 21 and 23), and/or immersion cooling vessels/tanks 400, 500, 800 (FIGS. 4-5, 8), and other devices and systems are not intended to be exhaustive, but rather be representative of and highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

A. Information Handling System and Server Configuration or Orientation for Rack-Based Immersion Cooling Turning now to the figures, FIG. 1 illustrates a block diagram representation of an example information handling system (IHS) 100, with which one or more of the described features of the various embodiments of the disclosure can be advantageously utilized. For purposes of this disclosure, an information handling system, such as IHS 100 and/or server 200 (FIG. 2) or server 300 (FIG. 3) or immersion server 2200

(FIG. 22) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. It is however appreciated that the information handling systems of the present disclosure are described as being primarily rack-based server systems. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes processing components 150 (referred to as "internal" components) that are physically located on the device chassis and other functional components located externally to the processing components 150 (referred to as "external" components). Included within processing components 150 are a plurality of processor(s) 105 coupled to system memory 110 via system interconnect 115. System interconnect 115 can be interchangeably referred to as a system bus, in one or more embodiments. Also provided within the processing components 150 and coupled to system interconnect 115 is one or more storage controller(s) 120, to which is coupled local internal storage 122 and local external storage 125. Storage controller(s) 120 controls data storage operations on nonvolatile storage, of which local internal storage 122 and local external storage 125 are shown.

As presented herein, local internal storage 122 can be solid state drives (SSDs), while local, external storage 125 are hard disk drives (HDDs). It is appreciated that the presentation of local internal storage 122 separate from local external storage 125 within the present disclosure extends from the concept that certain types of non-volatile storage and particularly SSDs can be operated effectively while submerged in a fluid medium along with the processing components 150, while other types of non-volatile storage, such as HDDs, may operate better if not submerged in a liquid medium. However, in one embodiment, the local internal storage 122 can also comprise or be solely HDDs, while the local external storage 125 can include SSDs. Also, in an alternate embodiment, information handling system 100 can include only local internal storage 122, regardless of the type (i.e., SSD, HDD, etc.) of storage. As presented herein, the terminology "local external" indicates that the storage 125 is an integral part of the information handling system 100, but connected via a data cable at a short distance from the processing components 150 (i.e., off the device chassis) rather than being directly connected on the device chassis via the system interconnect 115. Also, in at least one embodiment, the local external storage 125 is located near enough to the main processing components 150 that there is minimal additional latency detected between accessing local internal storage 122 and accessing local external storage 125.

In one embodiment, the non-volatile storage (122/125) provides storage of application programs, software, firmware, and one or more sets of data for use by processors 105 during one or more data processing operations. As shown, system memory 110 can include therein a plurality of modules, including firmware (F/W) 112, basic input/output system (BIOS) 114, operating system (O/S) 116, and application(s) 118. System memory 110 further includes one or more feedback control modules 170. In one embodiment in which the immersion cooling tank is a self-controlled, intelligent device, program code of these feedback control modules 170 can be executed by processor 105 and can configure the information handling system 100 to control one or more operating features of the immersion cooling vessel and/or data center, as described in further detail herein. The various software and/or firmware modules 170 have varying functionality when their corresponding program code is executed by processor(s) 105 or other processing devices within IHS 100.

Within the above description and throughout the disclosure, references to processing components refers to components that execute task sequences, while storage components refers to components utilized to secure either the input or output of a processing event. Both processing and storage are needed in increasing densities across the computer and server industry, in varying degrees. It is appreciated that in one or more embodiments, the term "processing" can be defined to be the holistic inclusion of task execution and storage thereof.

IHS 100 further includes one or more input/output (I/O) controllers 130 which support connection by, and processing of signals received from, one or more connected input device(s) 132, such as a keyboard, mouse, touch screen, or microphone. I/O controllers 130 also support connection by, and forwarding of output signals to, one or more connected output devices 134, such as a monitor or display device or audio speaker(s). Additionally, in one or more embodiments, one or more device interfaces 136, such as an optical reader, a universal serial bus (USB), a card reader, Personal Computer Memory Card International Association (PCMCIA) slot, and/or a high-definition multimedia interface (HDMI), can be associated with IHS 100. Device interface(s) 136 can be utilized to enable data to be read from or stored to corresponding removal storage device(s) 138, such as a compact disk (CD), digital video disk (DVD), flash drive, or flash memory card. In one or more embodiments, device interface(s) 136 can also provide an integration point (e.g., a USB or serial port) for connecting other device(s), such as an external HDD, to IHS 100. In such implementation, device interfaces 136 can further include General Purpose I/O interfaces such as $I^2C$, SMBus, and peripheral component interconnect (PCI) buses. In the illustrative embodiment, each of input devices 132, output devices 134, and device interfaces 136 with removable storage devices 138 are illustrated as external to processing components 150, while I/O controller(s) 130 reside within processing components 150.

In one embodiment, IHS 100 includes a power controller 140, which is coupled to a power distribution unit (PDU) 145 that is located externally to IHS 100. PDU 145 provides a connection to the source of electrical power and power controller 140 provides and/or supports distribution of that electrical power within IHS 100 via a power distribution network (not shown). IHS 100 also comprises a network interface device (NID) 160, which is also included within processing components 150. NID 160 enables IHS 100 to communicate and/or interface with other devices, services, and components that are located external to IHS 100. These devices, services, and components can interface with IHS 100 via an external network, such as example network 165, using one or more communication protocols. Network 165 can be a local area network, wide area network, personal area network, and the like, and the connection to and/or between network 165 and IHS 100 can be wired or wireless or a combination thereof. For purposes of discussion, network 165 is indicated as a single collective component for simplicity. However, it is appreciated that network 165 can comprise one or more direct connections to other devices as well as a more complex set of interconnections as can exist within a wide area network, such as the Internet.

Figure 2:
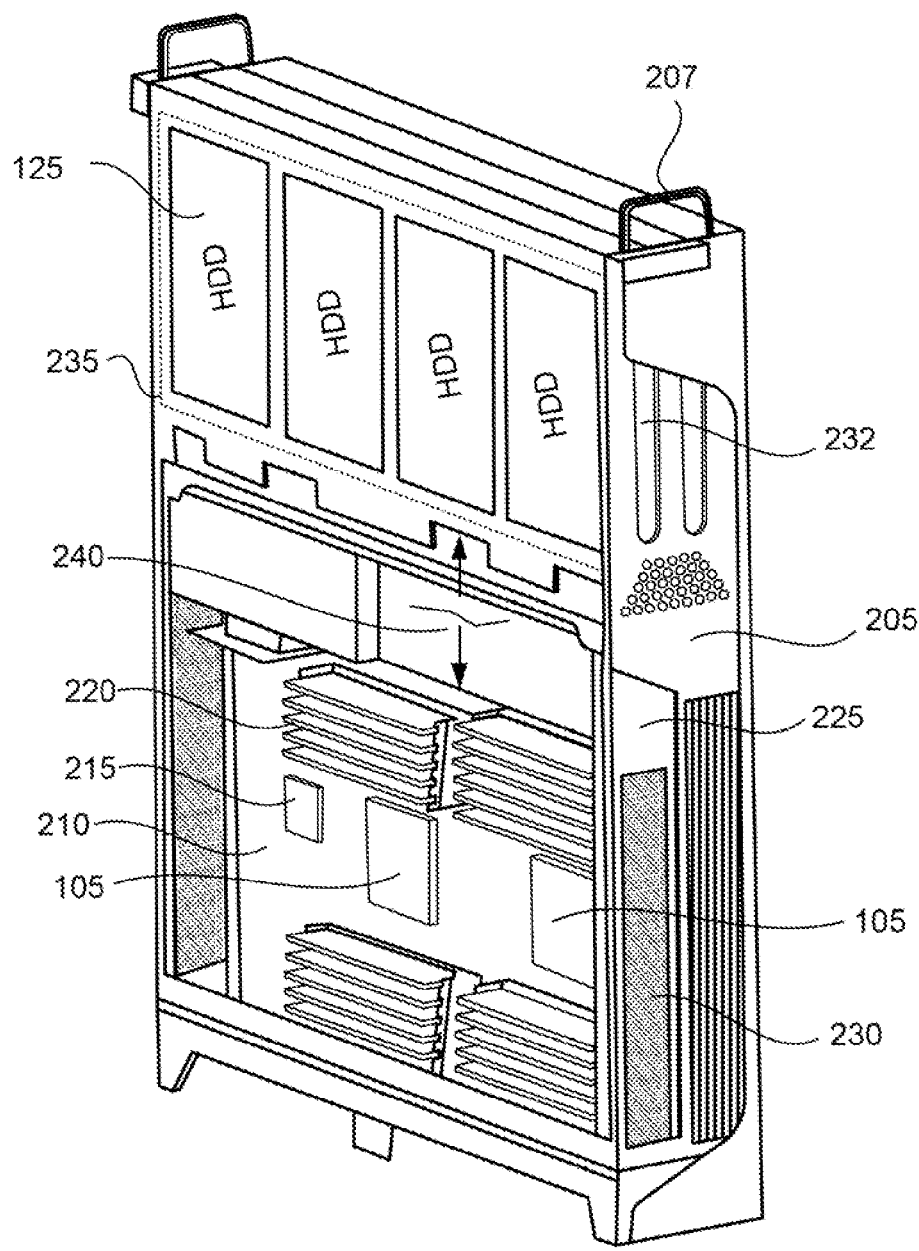
FIG. 2 is a schematic diagram of an information handling system configured as a server with an upper section of hard disk drives when oriented to stand on a back section of the chassis, according to one or more embodiments.
Figure 3:
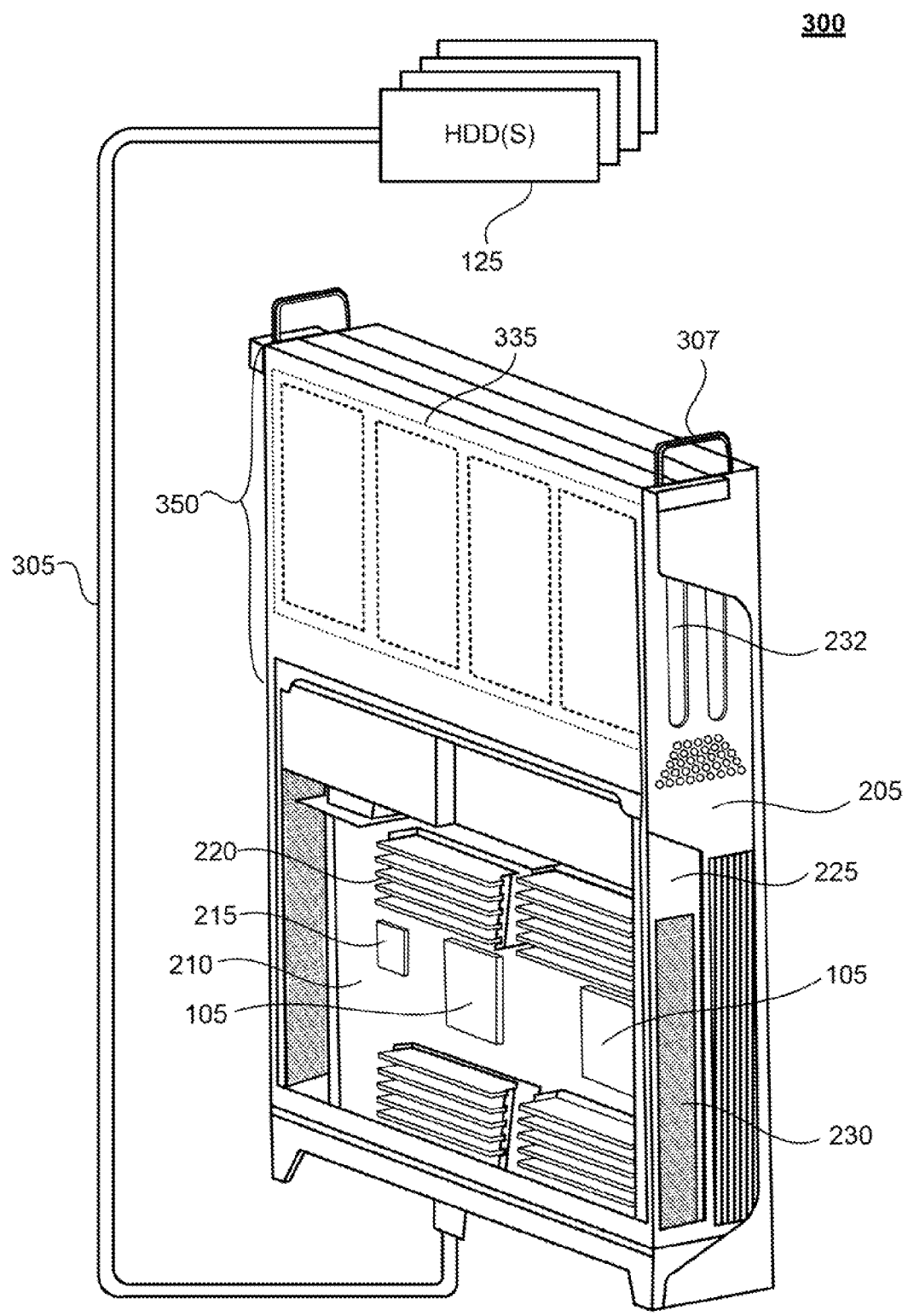
FIG. 3 is a schematic diagram of another example of an information handling system configured as a server with a set of external locally-connected hard disk drives, according to one or more embodiments.

With reference now to FIGS. 2 and 3, there are presented schematic diagrams of respective information handling systems presented as two configurations of a server. First server 200 and second server 300 differ with respect to the location and connectivity of HDDs 125 relative to the server chassis. First server 200 and second server 300 (collectively referenced herein as server 200/300) include a casing 205 within which the majority of the functional components are assembled. The casing 205 is designed to be able to insertably fit within a server rack and allow connection to power cables and/or data cables and other connecting cables provided at or by the server rack. Casing 205 includes a pair of handles 207/307 for lifting and/or pulling server 200/300 when the entire server unit needs to be moved from one physical location to another or in order to insert and/or remove server 200/300 from a server rack (not shown). Located within casing 205 is a chassis or motherboard 210 on which is embedded or attached the various processing components of server 200/300. As illustrated, these processing components include a plurality of processors (or processor integrated circuit chips) 105, storage controller 215 and memory modules 220. Server 200/300 can also include heat dissipation surfaces (i.e., heat sinks) co-located with the processing components. According to one aspect of the disclosure, one or more embodiments provide that heat generated and dissipated from the surface of the processors 105 and memory modules 220 are directly absorbed by a cooling fluid in which the processing components of server 200/300 is submerged during operation. Thus, server 200/300 can be designed without heat sinks, in one or more embodiments. Casing 205 is designed with a porous sidewall 225 having a plurality of holes and/or openings 230, 232. Thus, server 200/300 can be a standard server that is designed for operation in an air environment (i.e., outside of a liquid-based immersion tank) such that the server components can be air-cooled. However, as described herein, aspects of the disclosure utilizes these holes and/or openings 230, 232 to allow for a cooling fluid to easily flow into and around the internal structure and/or components of server 200/300. The cooling fluid can thus surround the various processing components that dissipate heat and directly absorb the dissipating heat by conduction and convection forces. These features are described in greater detail in the descriptions of FIGS. 4-5 and 8.

Server 200/300 are representative of any information handling system that can be partially or completely immersed or submerged in a cooling liquid to cool one or more of the functional components operating thereon. As one related aspect of being an immersible or submersible server, server 200/300 is shown oriented in an upright or vertical position, with the processing components at the bottom and the drive space 235 for housing HDDs 125 located at the top. Notably, server 200 does include on-chassis hard drive space(s) 235 within which HDDs 125 are located, as an integral part of the server 200. In contrast, server 300 is shown having HDDs 125 external to and not an integral part of the server chassis 210. As indicated by the dashed line representations of HDDs, one embodiment can allow for a standard server chassis 210 and casing 105, wherein the HDDs 125 are removed and connected via cable 305 to allow for positioning above the server casing 205, when second server 300 is in a liquid cooled environment. Notably, however, drive space 335 of second server 300 can accommodate a plurality of HDDs 125 to enable second server 300 to be reconfigured with HDDs 125 located within drive space 335 when second server 300 is being air cooled.

In the illustrated configuration, the HDDs are referred to as locally external HDDs. Thus, because second server 300 is designed for use within an immersion cooling tank, second server 300 is shown as being configured with locally external HDDs 125, which are connected via cable 305 to second server 300. Cable 305 can be a data cable, power cable, and/or a combination data and power cable. This configuration of second sever 300 allows for a local external connection of one or more HDDs, separate from the other processing components of the device in order to be able to submerge the processing devices in liquid for cooling thereof. The presented example of second server 300 illustrates that the location of the HDDs can be at a short distance away and apart from the chassis/motherboard 210 due to expected immersion of the chassis 210 within the immersion cooling liquid. It is appreciated that the configuration of second server 300 can also be different, given the lack of on-chassis HDDs. The chassis 210 can, in one embodiment, be more compact, eliminating the upper section 350 including the drive space 335 altogether. In at least one embodiment, the configuration of first server 200 can also be different from a conventional server, by extending the middle portion 240 of the chassis between the processing components and the drive spaces 235 to provide more separation of the HDDs 125 decreasing the likelihood of contact by the HDDs 125 with the cooling liquid. Other differences can also be provided to enable use of server 200/300 within an immersion cooling vessel. However, given the possibility of these various differences, the configuration and/or design of example servers 200/300 presented herein are not intended to imply or convey any limitation with respect to the actual configuration and/or layout and/or type of server that is ultimately provided as the immersion server that is cooled by submerging at least the processing components within a cooling liquid that is provided in an immersion cooling tank, as described herein. FIGS. 22-25 and the descriptions thereof in Section I present a different configuration of immersion servers that are specifically designed to be liquid cooled, with integrated HDDs that are vapor cooled. However, for purposes of the general concepts of the disclosure, reference shall be made to server 200/300 to illustrate the application of the disclosed cooling concepts to existing server designs and configurations.

Further, it is appreciated that the specific designs and configurations of these servers (200/300) can in some instances affect the specific implementation of the immersion cooling vessel utilized and/or the immersion cooling features presented by the disclosure. However, the core concepts of immersion cooling apply to the various possible types of servers regardless of whether the servers include locally internal HDDs or locally external HDDs.

B. Immersion Cooling Tank Providing Cooling of Information Handling Systems with Two-Phase Vaporization-Condensation Cooling Cycle Turning now to FIGS. 4 and 5, there are presented an internal view of two different examples of immersion cooling tanks 400 and 500, respectively designed for insertion of first server 200 and second server 300. It is appreciated that the internal views provided of immersion cooling tank 200, 300 are transverse views running in the lateral direction of the illustrated server 200/300, such that the side of the server chassis is shown (without functional components). A lateral view running parallel to the direction of server 200/300 is presented by FIG. 8. Again, because of the similarities in the figures, the descriptions are presented together with associated similar reference numerals separated by commas and/or a slash.

Each immersion cooling tank 400/500 operates as a two-phase vaporization-condensation cooling vessel for cooling one or more information handling systems and in particular server 200/300 according to the various methodologies described hereinafter. Immersion cooling tank 400/500 includes an enclosure 405 having an exterior casing with an interior lower volume 402 within which cooling liquid 412 can be maintained and heated to a boiling point temperature. The cooling liquid 412 is generally located in the volume extending between the bottom of the enclosure 405 of cooling tank 400/500 up to the liquid surface 420, i.e., the topmost layer/level of cooling liquid 412. The interior of enclosure 405 also includes an upper volume 404 extending from the liquid surface 420 up to a tank cover 480. In the illustrative embodiments, tank cover 480 includes a handle 485 to allow for opening of the tank cover 480.

Also, according to one aspect, each immersion cooling tank 400/500 includes a server rack 410/510 (illustrated with a side rail and a base structure), which can be generally incorporated or placed within the sidewalls and base of the lower volume 402 of the tank enclosure 405, with at least one section extending below the liquid surface 420 of immersion cooling liquid 412. Within the lower volume 402 is shown a base portion and opposing side rails of the server rack 410/510. Server rack 410/510 can respectively provide support for holding server 200/300 in place while server 200/300 is submerged in cooling liquid 412. In one embodiment, server rack 410/510 is built into immersion cooling tank 400/500 or permanently attached to the interior sides of the side and/or bottom panels of casing 405/505. Server rack 410/510 can also be separate from and placed into the existing immersion cooling tank 400/500 following construction of the immersion cooling tank 400/500. Positioned within each server rack 410/510 is respective server 200/300 which are shown extending laterally across immersion cooling tank 400/500 from the first side rail (located on the left) to the opposing second side rail (located on the right).

Immersion server 200 is illustrated partially submerged below the liquid surface 420, with the section of the chassis holding the HDDs 125 above the liquid surface 420 of the cooling liquid. In contrast, immersion server 300 is illustrated with the chassis fully submerged below the liquid surface 420, with the locally external HDDs 125 above the liquid surface 420 of the cooling liquid 412. In this version of immersion cooling tank 500, immersion server 300 can include handles 307 extending from the cooling liquid 412 to allow for removal of the immersion cooling server 300 from the cooling liquid 412. The extension of handles 307 above the liquid surface 420 enables server 300 to be pulled up out of the cooling liquid without contacting the cooling liquid 412. In one or more embodiments, one or both of casing 405 and handles 207/307 of respective server 200/300 can be elongated to extend above the surface level 420 of cooling liquid 412 within immersion cooling tank 400/500. Alternatively, the level of cooling liquid 412 can be measured such that only the heat-dissipating components on server 200 that are to be liquid cooled are immersed in cooling liquid 412.

According to one embodiment, extending from casing 405 of immersion cooling tank 400/500 is a pipe connector 495 with an associated shutoff or flow control valve 497. One or more of the functionality or use of these components are described in Section G, which is provided below. As its simplest function, pipe connector 495 and flow control valve 497 enable cooling liquid 412 to be drained from immersion cooling tank 400/500, in order to facilitate tank maintenance, for example.

As shown in the figures, the HDDs 125 are located within a middle portion (or volume) of the immersion cooling tank 400/500 in which a plume of vapor is shown rising from the surface of the cooling liquid. This aspect of the design of the immersion cooling tank 400/500 and respective servers 200/300 will be described in greater detail in the following Section C.

Figure 5:
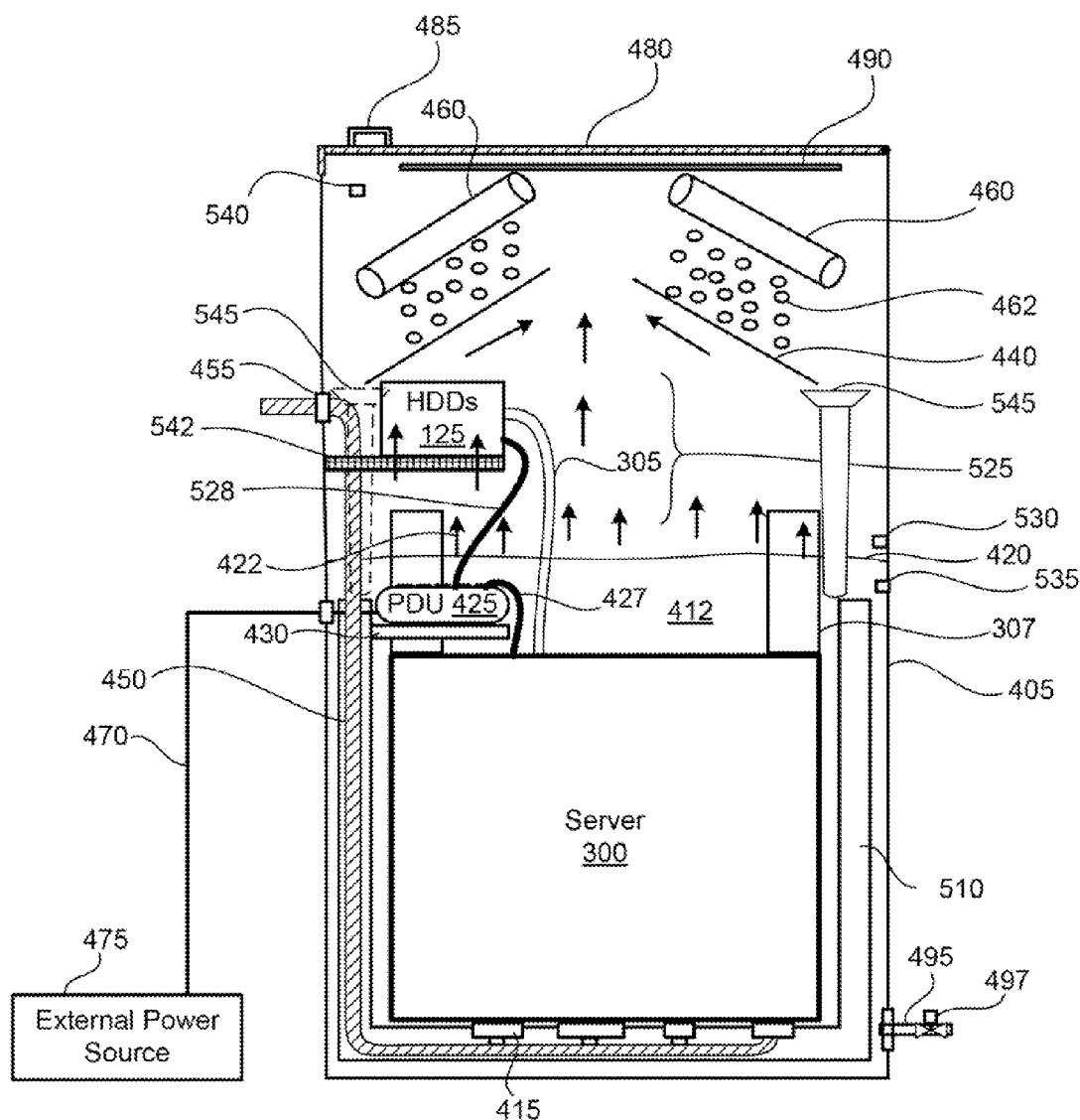
FIG. 5 is a schematic diagram illustrating a second example internal structure of a two-phase vaporization-condensation immersion cooling tank configured to support cooling of the example server of FIG. 3, with external locally-connected hard disk drives suspended above the dielectric cooling liquid in the path of the rising dielectric vapor, according to one or more embodiments.

The upper volume of the enclosure 405 includes at least one condenser 460, which as provided by the inset includes a condensation surface 465 and pipes 467 in which condensation fluid flows. The condensation fluid is maintained at a temperature that is lower than the condensation temperature of the rising vapor 422. At the condenser 460, the rising vapor 422 is condensed back to cooling liquid or condensate 462 by releasing latent heat to the condenser as the rising vapor 422 comes into contact with the condensation tubes or surface in which the condensation liquid flows. The condensation of the rising vapor 422 occurs as the flowing, cooler condensation fluid within the condenser absorbs the heat energy from the rising vapor 422, causing the rising vapor 422 to convert (i.e., undergo a phase change) from gas to liquid phase. The resulting converted/condensed cooling liquid 462 is then returned back to the lower volume of cooling liquid 412 in the bottom of the enclosure 405. In one embodiment, a cooling liquid return system 440 is provided below the condensers to catch the falling liquid condensate 462 in order to prevent the falling condensate 462 from coming into contact with the HDDs 125 located below the condenser 460. In at least one embodiment, as illustrated by FIG. 5, the condensate 462 is channeled via a secondary conduit 545.

In one embodiment, the condensed cooling liquid collection system 440 collects the condensed liquid as the liquid drops from the condensation surface 465, due to gravity, following condensation of the rising vapor 422. According to the illustrated embodiment, the condensation surface 465 is angled to at least one side relative to a horizontal plane to cause the condensate 462 generated from the condensation of the rising vapor 422 to flow off towards at least condensed cooling liquid collection system 440.

The condensation fluid (not shown) flows within the tubes/pipes close to the condensation surface 465 and maintains the condensation surface 465 at a lower temperature than a condensation point of the rising vapor 422. According to one or more embodiments, the condenser 460 and in particular the condensation surface 465 comprises at least one length of tubular piping extending from an external connection point running to the inside of the enclosure 405 and then back to the outside of the enclosure 405. The external surface of the tubular piping can, in one embodiment, provide the condensation surface 465, and the condensation fluid flows through the interior bore of the tubular pipe from an external fluid source/reservoir.

Indicated below liquid surface 420 in the lower volume 402 of enclosure 405 is a power distribution unit (PDU) 425 sitting atop a platform 430. This platform 430 can be simply a ledge or space at which PDU 425 can be nested. Alternatively, the platform 430 can be one specifically designed within immersion cooling tank 400 or as a part of server rack 410/510. PDU 425 is coupled via a power cable 470 to the external power source 475 located on the outside of immersion cooling tank 400/500. PDU 425 provides electrical power to server 200/300 as well as other electronic devices within immersion cooling tank 400/500, of which HDDs 125 is illustrated. HDDs 125 is shown located above liquid surface 420 on a platform 445, which can be porous (air accessible) in one embodiment. A first power connector 427 is shown extending from PDU 425 to server 200/300, while a second power connector 528 extends to HDDs 125. In FIG. 5, communication and data cable 305 is also shown connecting HDD 125 to server 300 to enable data transfer between server 300 and the HDD 125 during operation of both the server 300 and HDD 125 within immersion cooling tank 500.

Within immersion cooling tank 400/500, immersion server 200/300 is connected via a number of connectors 415 indicated at the bottom of server rack 410/510. These connectors 415 allow servers 200/300 to be insertiably coupled to the server rack 410/510. The connectors 415 are coupled to or are extensions of a network cable bundle 450 which enables immersion server 200/300 to communicate with other devices both within and outside of immersion cooling tank 400/500. In alternate embodiments, the communication and data cables of network cable bundle 450 can be connected within the enclosure 405 by running the cable bundle 450 through a trunking or sealed space (not expressly shown) that is provided within the enclosure 405, such as within the enclosure walls. The cable bundle 450 is then connected to the backs of the server(s) 200/300 via specific rack connectors 415.

For connections to endpoints outside of the enclosure 405, immersion cooling tank 400/500 includes network cable bundle 450 and power cable 470, which extend through a side wall of enclosure 405 into the exterior space outside the tank 400/500. To support the interconnection of multiple server racks, for example, a large number of network cables are required to access the immersion cooling tank 400/500. These cables require an opening to access the enclosure 405, and the size and number of openings can significantly increase the opportunity for loss of cooling fluid to the outside of the tank 400/500. Thus, communication in and out of the immersion tank 400/500 requires a design that enables the communication and data cables of network cable bundle 450 to enter the immersion cooling tank 400/500 without providing any seams through which the immersion fluid can escape. Similarly, the design must allow for the power cable 470 to be run into the tank 400/500 from the outside in order to provide power to the devices inside of the tank 400/500, without allowing for escape of the cooling fluid. This aspect of the disclosure thus provides a robust solution to seal the openings created by the numerous cables and any other openings that may be required within the side walls or cover of the immersion cooling tank 400/500.

In order to support the extension of network cable bundle 450 and power cable 470 from the outside of immersion cooling tank 400/500 to the inside, and vice versa, one aspect of the disclosure provides a rubber-based grommet 455 that operates to seal the areas at which the respective cables enter and/or exit the wall of the cooling tank 400/500. The rubber grommet 455 fits tightly around Cat 6 or fiber cables and power cables, and the rubber grommet 455 is then inserted into an opening in the wall of the immersion cooling tank 400/500. Once inserted into the opening, the rubber grommet 455 maintains a tight seal around the cables and the perimeter of the opening and prevents escape of vapor from inside the tank to the outside air and vice versa. This capability of preventing escape of the cooling fluid is an important aspect of the immersion tank 400/500 design.

Figure 6:
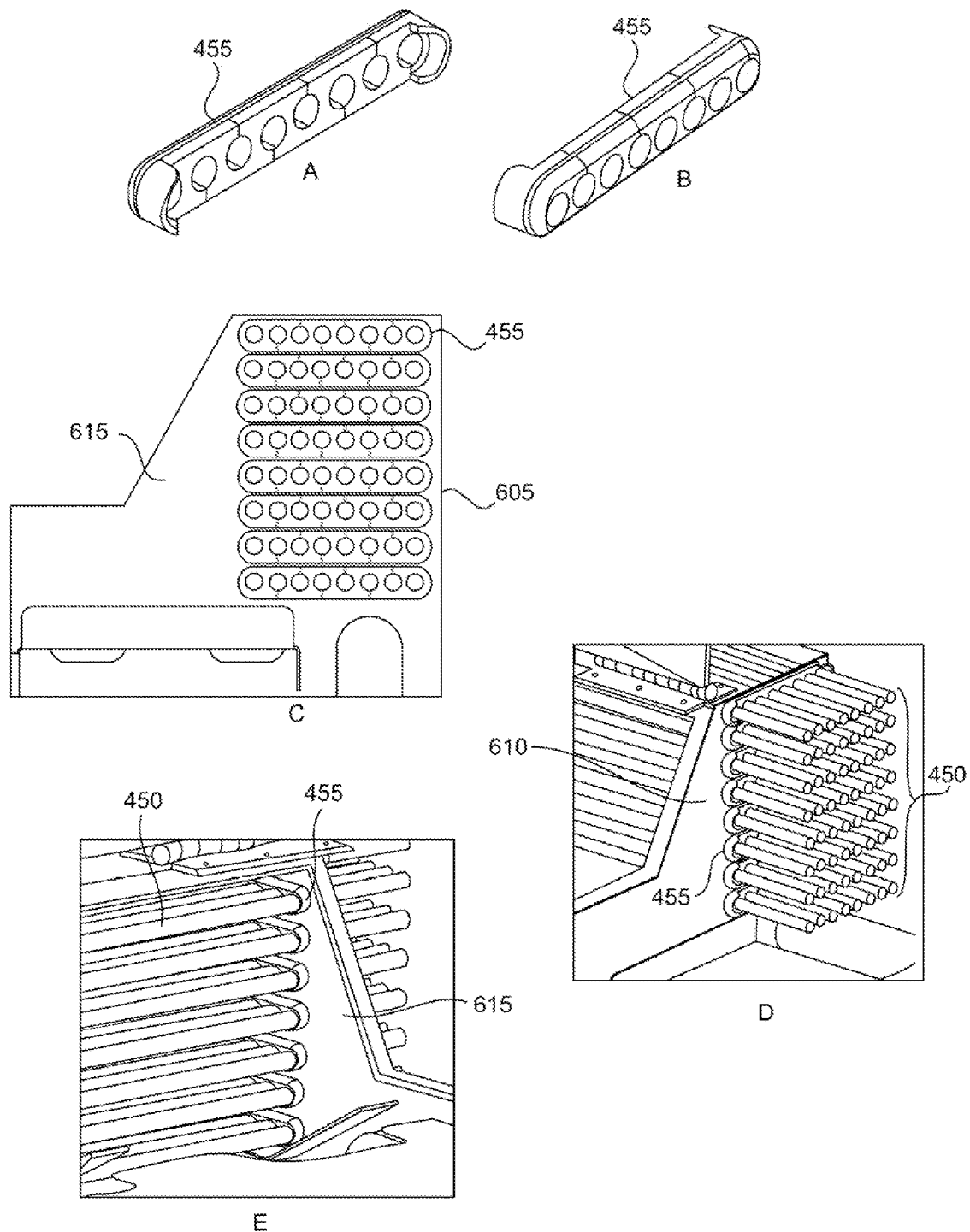
FIG. 6 provides various views of a rubber-based grommet that can be utilized within the immersion cooling tank to allow for insertion of power connectors and data cabling, while preventing leakage of the cooling liquid or vapor from the immersion cooling tank, according to one embodiment.

FIG. 6 presents various different views of the configuration of the grommets 455. FIG. 6 also illustrates the use of the grommets 455 with multiple cables, representing network cable bundle 450, extending through the wall of the immersion cooling tank 400/500. An exterior and an interior view of the two interlocking sides of a single grommet 455 are shown by FIGS. 6A-6B. According to one aspect of the disclosure, and as illustrated by FIGS. 6C-6E, immersion cooling tank 400/500 is configured with one or more grommets 455 placed in both the internal and external surface of one or more of the walls 605 of the enclosure 405 (FIG. 4) to create a seal through which communication and data cables of network cable bundle 450 and power cables 470 can be introduced into the enclosure 405 from the outside. FIG. 6C shows the stacking of a plurality of grommets 455 inserted into the wall 605 of enclosure 405 and extending out of the interior wall surface 615. FIG. 6D then illustrates network cable bundle 450 extending through the grommet 455 at the exterior wall surface 610 of the enclosure 405, while FIG. 6E illustrates network cable bundle 450 extending through the grommet 455 at the interior wall surface 615 of the enclosure 405. According to the illustrated embodiment, the network cable bundle 450 represents 64 infiniband connectors. However, it is appreciated that the use of grommets 455 can be applied with other types of network and power cabling. Importantly, the configuration of the grommet 455 and the material utilized to construct the grommet 455 allows the various cables to be introduced into the enclosure 605 without causing leakage of either the cooling liquid 412 or the vapor 422 to the outside of the enclosure 605. These special rubber-based grommets 455 are utilized to enclose the point(s) of penetration into the tank from the outside to prevent (1) leakage of the dielectric fluid and/or (2) leakage of the high pressure vapor above the liquid surface of the enclosure.

Thus, grommet 455 has specific qualities that enable the cables' accesses to be sealed to prevent both liquid and/or vapor from escaping to the outside of enclosure 405. Generally, the selection of the grommet material requires consideration of (1) the qualities of the material that makes it flexible enough for use but not prone to allow for leakage of liquid or vapor, even under high pressure, (2) durability of the material under constant heat conditions, (3) the specific cooling fluid being utilized within the immersion tank, not having any negative interactive properties with the grommet material, and (4) other criteria that can be relevant to the system designer. According to one or more embodiments, butyl rubber exhibits each of the above characteristics and is thus provided as the immersion grommet 455 in example immersion cooling tanks 400/500 as well as the other immersion cooling vessels described hereinafter.

In one or more embodiments, the dielectric liquid 412 utilized as the cooling liquid is Novec fluid, which has limited reactive properties with butyl rubber. Thus, the utilization of the butyl rubber grommet 455 provides a solution that maintains flexibility while in contact with the Novec vapor. The use of the butyl rubber provides a rubber grommet 455 that fits tightly around the cables, e.g., Cat6 or fiber cable (see 600D-600E). And, the rubber grommet 455 maintains a tight seal between the vapor inside the enclosure 405 and the outside of the enclosure 405. This aspect of the disclosure thus provides a robust solution to seal the openings required to run the numerous network and other cables. Additionally, utilization of the grommet 455 enables and/or facilitates future upgrades and cable replacement throughout the working life of the enclosure 405, without having to glue or epoxy the cables into the tank.

According to one aspect of the disclosure, immersion cooling tank 400/500 includes a dielectric cooling liquid 412 that is selected based on the fluid exhibiting certain desirable characteristics with respect to its high volatility (low boiling point temperature) when exposed to surface heat dissipating from an operating server 200 and its low condensation barrier from vapor to liquid when exposed to room temperature condensation liquid, such as water. In one or more of the described embodiments, the dielectric cooling fluid is Novec 649, a product of 3M®. Novec 649 is a dielectric fluid that boils at 49 degrees Celsius. More importantly, the Novec fluid does not conduct electricity and/or does not react or interact with surrounding components when exposed to electricity or electrical components. Another benefit to the use of Novec fluid is its superior functioning during servicing of components. During servicing of a server, for example, once the server is pulled out of the fluid and left to sit for a few seconds, the high volatility of the fluid causes the Novec 649 fluid to evaporate leaving a dry surface of the server to work on.

As one aspect of the disclosure, and with the use of Novec liquid as the cooling liquid, the condensation fluid can be surface water at room temperature. As introduced above, Novec liquid is highly volatile and has a boiling point temperature of 49 degrees Celcius. Thus, from experimentation it has been shown that a single server operating minimal processes dissipates sufficient heat to raise the temperature of the Novec liquid to its boiling point temperature, resulting in vaporization of a portion of the liquid. With such a low boiling point, the threshold for cooling the vapor to its condensation point is relatively low. Thus, within one or more embodiments, water provide at room temperature can be utilized as the condensation fluid. Because the boiling point of water is not achieved until the water is heated to 100 degrees Celsius, water, when utilized as the condensation liquid, provides a vast amount of heat absorption capacity to condense the rising Novec vapor. Additionally, water has a high specific heat and relatively high thermal diffusivity when compared to other liquids, making water an ideal candidate for use as the condensation liquid. Further, there is an abundant supply of water and water is relatively inexpensive as a condensation liquid.

According to one aspect of the disclosure, the dielectric vapor rises and the condensed cooling liquid falls due to relative density and operation of gravity. Thus, the cooling of the electrical components can have system or server power usage effectiveness (SPUE) of 1.00. SPUE refers to the ratio of total amount of power used by the data center facility to the power delivered to the IT equipment.

As a next benefit, the implementation of the immersion cooling tank provides an opportunity to increase the density of IT gear in a server rack (tank). When servers 200/300 are operated within immersion cooling tank 400/500, there is no longer the need for large, space consuming heat sinks, as the dielectric fluid boils directly off the processor chip. Thus, the server and/or rack space or volume that was once used for fans or heat sinks for the server module can now be filled with useful functional components, such as other processors.

As yet another benefit, the dielectric fluid provides large thermal capability, as the thermal capability of the dielectric fluid is significant. Thus, the components in the dielectric fluid can operate well below the thermal limits. Thus, a conventional server system which would only support low wattage processors due to the limited volume available for heat sinks can now support high end processors.

Finally, with the implementation of the immersion cooling tank 400/500, there is no longer a need for expensive data center cooling equipment. The immersion tank is a sealed unit and because all dissipated heat is eventually absorbed and transmitted away from the enclosure by the condensation fluid, there is also no need to cool the room around the tank. Also, the immersion tank can operate in almost any environment and does not require an air-conditioned or heated space.

C. Vapor Cooling of HDDs within Immersion Cooling Tank

One consideration that is relevant to the described innovation includes an appreciation of the limitations of operating HDDs within a liquid environment, such as an immersion-based cooling system for datacenter servers, as presented herein. Conventional HDDs are designed with a lubricated rotating spindle which needs to be free from obstruction while spinning in order to operate effectively and enable a longer lifespan of the HDD. As determined by practical observation and testing, engineering analyses, and/or extrapolation of known theories in physics and other sciences, submerging a HDD in a liquid filled enclosure does not properly accommodate cooling needs of rotating HDDs by virtue of parasitic friction that is induced when liquid enters the HDD motor/spindle region. This entering liquid (a) dissolves lubricant used on the spindle over time and (b) increases the amount of friction on the moving parts, thus causing increased wear and tear, which results in shorter lifecycles of the HDDs. Additionally, the above effects also increase the need for frequent maintenance of the HDDs, which negatively affects the equilibrium achieved and/or desired within an operating immersion cooling system.

Notably, to address this limitation with HDDs utilized with immersion-based datacenters, a conventional solution would include utilizing remote storage racks that would be in a different physical location. These remote storage racks then require a fan-based cooling infrastructure, typically involving additional space, and use of large number of fans powered by an external power source. This solution also requires large amounts of cabling from the data center to the remote storage location, which along with the increased power consumption, significantly increases the expense of running and/or cooling the data center and storage facility. Another conventional solution involves expensive HDD encapsulation with epoxy to prevent liquid from entering the internal structure of the HDD. Among the problems and/or disadvantages with this approach are: (1) the approach is relatively expensive, as the epoxy is costly and the process requires additional amounts of man/machine hours; (2) the epoxy encapsulation is permanent, thus preventing any future maintenance on the device; (3) epoxy encapsulation voids the HDD manufacturer's warranty; and (4) the encapsulation in epoxy increases the dimensions of the resulting encapsulated HDD, which makes the encapsulated HDD difficult to fit into the standard HDD carriers (such as drive space 235 (See FIG. 2)).

One aspect of the described embodiments thus presents a method and system to effectively deploy an immersion based solution for a server that utilizes rotating HDDs, while accommodating the cooling needs of rotating HDDs, without the additional expenses and other limitations and/or problems inherent with the above conventional approaches. It is also appreciated that the implementation of this configuration of servers enables development and deployment of ultra-dense liquid cooled servers as the HDDs do not have to be accommodated on the server chassis.

Figure 4:
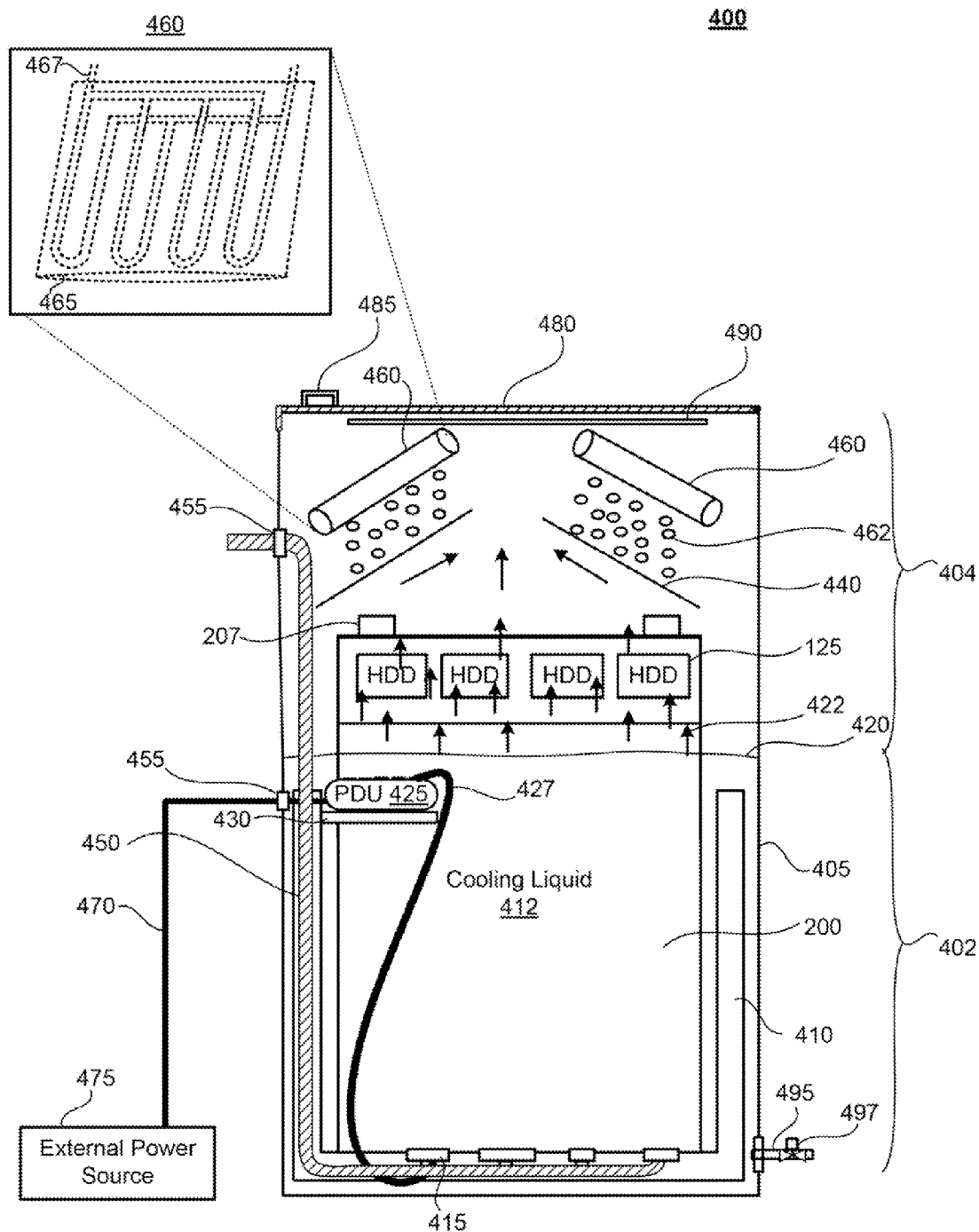
FIG. 4 is a schematic diagram illustrating a first example internal structure of a two-phase vaporization-condensation immersion cooling tank with a dielectric cooling liquid that operates to provide cooling for processing components of one or more servers partially immersed in the cooling liquid with the server's hard disk drives located above the cooling liquid in the path of rising dielectric vapor, according to one or more embodiments.

The example immersion cooling tanks 400/500 of FIGS. 4 and 5 represents two-phase heat transfer HDD cooling system that operates as a vapor-based cooling system for HDDs, according to one or more embodiments. As provided by FIG. 5, the interior of enclosure 405 also includes a HDD cooling area 525 in which at least one HDD 125 can be placed during operation of the HDDs 125. The HDD cooling area 525 is located at a first distance above the liquid surface 420 within enclosure 405 and is in a direct path of plumes of vapor 422 rising off the liquid surface 420. Thus, the above introduced immersion cooling tank 400/500 provides techniques for cooling hard disk drives (HDDs) within an immersion cooling environment without having to directly immerse the HDDs within the cooling liquid medium. This technique involves placing the HDDs in the path of a rapid flow of rising vapor generated by boiling of a highly volatile fluid in a cyclical multiphase (i.e., two-phase vaporization-condensation) heat transfer enclosure or vessel, such as an immersion cooling tank 400/500. The two phase (vaporization-condensation) tank 400/500 is configured with a liquid immersion system that boils the cooling liquid 412 within a bottom enclosure or reservoir and creates vapor plumes 422. The vapor plumes 422 are driven by density gradients through a HDD cooling area 525 located above the cooling liquid 412 within the tank 400/500. As the vapor 422 rises, the vapor 422 passes with an upward velocity over the exposed surface of the HDDs 125 located within the HDD cooling area 425/525 and the vapor 422 flows across the exposed heated surface area of the HDDs 125. The movement of the cooler vapor 422 across and away from the surface of the HDDs 125 causes the rising vapor 422 to absorb some of the heat being dissipated from the surface of the HDDs 125 as well as ambient heat generated by the HDDs 125 within the HDD cooling area 425/525. Thus, the vapor 422 cools the HDDs 125 while in transit to an upper condenser 460.

At the upper condenser 460, the vapor 422 is condensed back to liquid condensate 462 by coming into contact with the condensation surface or condensation pipes/tubes in which the condensation liquid flows. The condensation of the rising vapor 422 occurs as the cooler condensation fluid flowing within the condenser 460 absorbs the heat energy from the vapor 422, causing the vapor 422 to convert (i.e., undergo a phase change) from gas to liquid phase. The resulting cooling liquid condensate 462 is then channeled via a secondary conduit 545 back to the cooling liquid reservoir in the bottom of the enclosure 405 to avoid the liquid condensate 462 coming into contact with the HDDs 125. According to one or more embodiments, as illustrated by FIG. 5, the HDD cooling area 525 includes a rigid, mesh type structure extended across one segment of the inner perimeter of the enclosure above the liquid surface 420 to form a porous platform 542 on which the one or more HDDs 125 are placed. The platform is porous to allow the rising vapor 422 to pass through the HDD cooling area 525 up towards the upper condenser 460. In at least one embodiment, the HDDs 125 can be spaced apart from each other and can be oriented within the HDD cooling area 525 to maximize the amount of exposed surface that will come into contact with the flow of rising vapor 422. In a second embodiment with locally external HDDs, the HDD cooling area 525 includes a series of holding clips and/or sleeves designed to hold or support one or more of the HDDs 125. The HDDs 125 are then suspended (i.e., held in place) within the HDD cooling area 525 based on the location and/or configuration of the specific mechanism being utilized to hold the HDDs 125. It is appreciated that other embodiments are possible in addition to those described herein, without limitation. According to one or more of the described embodiments, the liquid that is utilized to produce the cooling via vaporization and condensation within the enclosure is a dielectric fluid. Selection of a dielectric fluid allows for the avoidance of any electrical interaction of the components being cooled with the fluid and/or rising vapor, among other benefits.

The HDD cooling system includes a heat source or heat dissipating component that dissipates heat into the lower volume 402 of the enclosure 405. Within the presented examples, the heat dissipating component is represented as a server 200/300. However, it is appreciated that many other types of heat dissipating components that can benefit from liquid cooling by immersion within the liquid as well as a generic heat source utilized solely to heat the cooling liquid to a boiling point can be utilized in place of or in addition to server 200/300 within the HDD cooling system. According to one aspect of the disclosure, regardless of the type of heat source or heat dissipating components utilized/provided, the amount of heat dissipated is sufficient to heat the cooling liquid 412 within the lower volume 402 to a boiling point temperature at which at least a portion of the cooling liquid 412 evaporates, generating a plume of rising vapor 422. The plume of rising vapor 422 flows/moves rapidly upwards through the HDD cooling area 525 and across one or more surfaces of the at least one HDD 125. The moving vapor 422 cools the at least one HDD 125 via convection as the vapor 422 comes into contact with and moves across the one or more surfaces of the at least one HDD 125.

As introduced above, the HDDs 125 can be communicatively coupled to one or more processing components that are either internal to the enclosure 405 or external to the enclosure 405. According to one aspect, the HDDs 125 can be respectively connected to externally and/or internally supported server(s) via cables of network cable bundle 450 or HDD connecting cable 305 (FIG. 3). It is appreciated that these connectors (450/305) are rated to operate at temperatures equal to or exceeding a maximum temperature from among the higher of (a) an ambient exterior temperature of the HDDs 125 within the HDD cooling area 525 and (b) the temperature of the rising vapor 422 and/or the boiling point temperature of the cooling liquid 412.

According to the described embodiments, server 200/300 represents the heat dissipating component that dissipates heat into the lower volume of the enclosure 405 while the server is operating. One aspect of the disclosure provides that the amount of heat dissipated by server 200/300 is sufficient to heat the cooling liquid 412 within the lower volume 402 to a boiling point temperature at which at least a portion of the cooling liquid 412 evaporates, generating a mass or plume of rising vapor 422. The plume of rising vapor 422, indicated by the vertical arrows, flows/moves rapidly upwards through the upper volume towards condenser 460. According to one embodiment, the upper volume includes a HDD cooling area 525 (generally including a platform or other holding structure) in which at least one HDD 125 can be placed during operation of the HDDs. The plume of rapidly rising vapor 422 moves through the HDD cooling area and across one or more surfaces of the at least one HDD 125. The rapidly moving vapor 422 cools the HDD 125 via convection as the vapor 422 comes into contact with and moves across one or more surfaces of the at least one HDD 125.

According to one embodiment, the plume of vapor 422 are driven by density gradients through the HDD cooling area located above the cooling liquid 412 within the tank 400/500. As the vapor rises, the vapor passes through the HDDs located within the enclosure with an upward velocity and flows across the exposed hot surface area of the HDDs. It is appreciated that the presence of a HDD cooling area is an optional enhancement that is not necessarily provided in different embodiments of the immersion cooling tank 400/500.

In addition to the described components which relate to the vaporization and resulting cooling aspects of the cooling system, the upper volume 404 of the enclosure 405 of cooling system also includes: a condenser 460 above both the HDD cooling area 525 and the at least one HDD 125; and a cooling liquid collection and/or return system (440/545), a portion of which is located above the HDD cooling area 525. In one or more embodiments, illustrated in greater detail in FIG. 5, the cooling liquid return system comprises condensed cooling liquid (condensate) collection system 440 located above the HDDs 125 and a condensate return conduit (or channel) 545. In one embodiment, the condensate return channel 545 is provided close to the perimeter of the upper volume 404 of the enclosure 405, although the exact placement can vary by design. The condensate collection system 545 is located above the at least one HDD 125 so as to protect the HDDs 125 from having any of the condensed cooling liquid condensate 462 fall on the operating HDDs 125. The condensate collection system 440 collects the condensed liquid as the liquid drops from the condensation surface 565, due to gravity, following condensation of the rising vapor 422. The condensate return channel 545 provides a conduit which extends from the condensate collection system 440 to below the HDD cooling area 525 into the lower volume 402 of the enclosure 405, returning the condensate 462 to the lower volume of the enclosure 505, while avoiding contact between the condensate 462 and the at least one HDD 125.

According to the illustrated embodiment, the condensation surface of the condenser 460 is angled to at least one side relative to a horizontal plane to cause the condensate 462 that is generated from the condensation of the rising vapor 422 to run off towards the perimeter of the enclosure 405 away from the HDDs 125 and towards condensate collection system 440. The condensate collection system 440 is also angled to allow the collected condensate to run off towards condensate return conduit 545 that directs the collected condensate 462 towards the lower volume of cooling liquid 412, without allowing the condensate 462 to come into contact with the at least one HDDs 125.

While the above described embodiment provides for the condensate return system preventing the condensate from coming into contact with the HDDs, at least one alternate embodiment is provided in which the HDDs 125 can be "drip" tolerant. Thus, for example, the HDDs may have an exterior casing that allows the HDDs to deflect dripping condensate without negatively affecting the operation of the HDDs. Thus, with these alternate embodiments, the HDD cooling system can be configured without a bypass system for the condensate, and which allows some dripping of the condensate on the HDDs. Additionally, in one more embodiments, the HDDs can be hermetically sealed, which would allow the HDDs to be fully or partially immersed while operating. It is appreciated, that even with such HDDs, the aspects of the disclosure allowing for the cooling of these immersible HDDs by rising vapor can still be valuable given the very high cost of the cooling fluid (i.e., Novec fluid). Vapor cooling of the HDDs enables savings on the total cooling liquid volume required at installation. With these types of HDDs, as well, one implementation can provide that the HDDs are only partially immersed so that the HDDs are cooled by a combination of liquid cooling and vapor momentum cooling.

Figure 7:
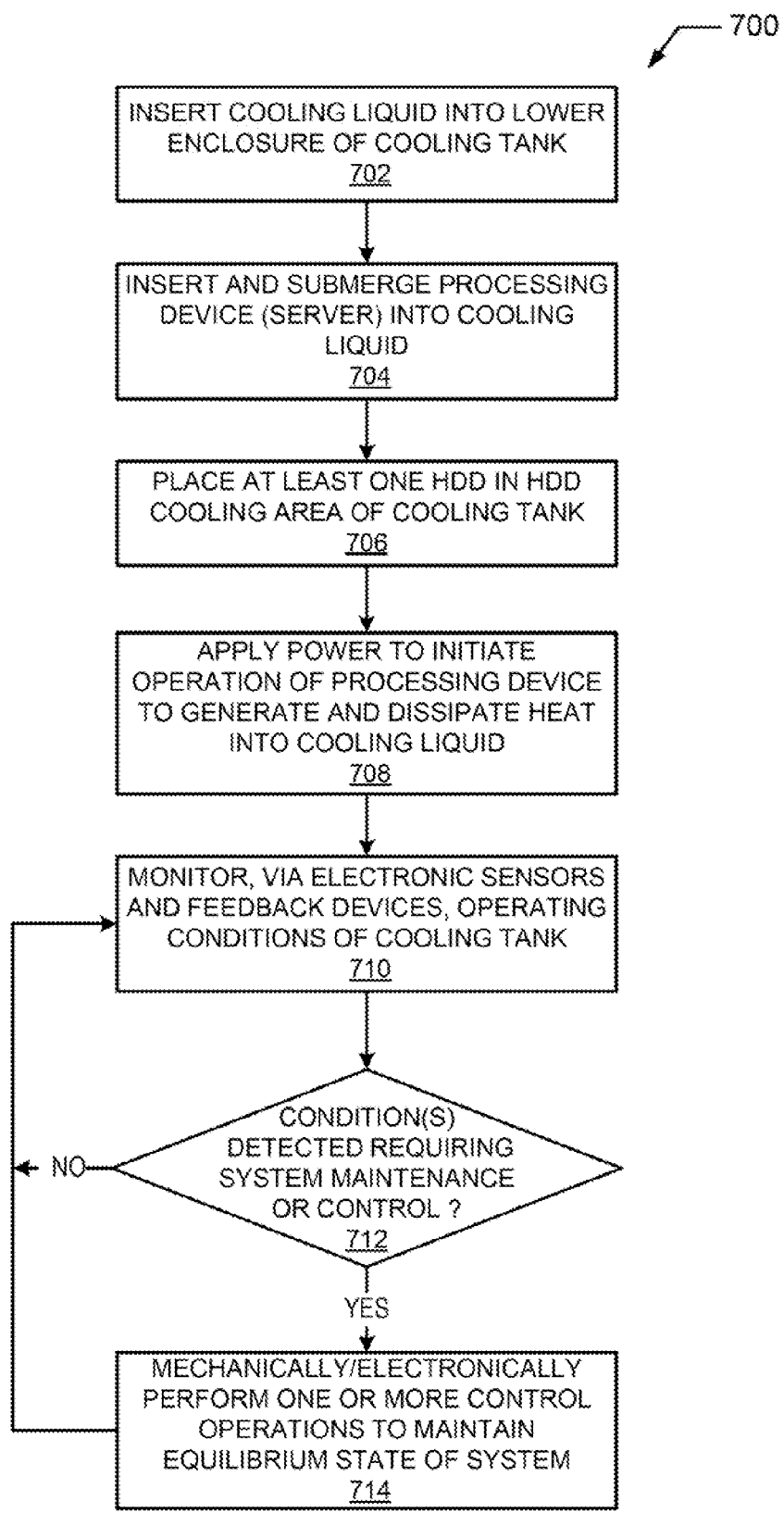
FIG. 7 is a flow chart illustrating one example of a general method for cooling HDDs within an immersion cooling vessel and controlling operating conditions within the immersion cooling tank via feedback control, according to one or more embodiments.

FIG. 7 is a flow chart illustrating one example of a method by which an immersion tank system can be implemented and utilized to provide cooling for HDDs by producing a high velocity vapor flow across a HDD cooling area within a heat-dissipating system, such as an immersion cooling tank 400/500, in accordance with one embodiment. Aspects of the flow chart can be implemented with reference to one or more components described within any one of the different embodiments of a vapor cooling system for HDDs as presented in FIGS. 4-5. Method 700 also includes one or more feedback control operations that can be performed during the cooling of the HDDs 125. The method 700 begins at block 702 at which the cooling liquid is inserted into the lower volume 402 of the immersion cooling tank 400/500. The method 700 then includes submerging the processing devices (e.g., server processor and memory modules) into the cooling liquid (block 704). At block 706, method 700 provides placing the at least one HDD within a HDD cooling area 525 of the immersion cooling tank 500. As stated above, the immersion cooling tank is configured with a lower volume having a cooling liquid and a processing device submerged within the cooling liquid and which device dissipates heat sufficient to raise the temperature of the cooling liquid to a boiling point temperature and cause vaporization of a portion of the cooling liquid to generate a plume of rising vapor 422. The immersion cooling tank 400 is further configured with an upper volume 404 in which the HDD cooling area 525, at least one condenser 460, and a liquid collection and/or return system 440/545 are located. The HDD cooling area 525 is located at a first distance above a surface layer of the cooling liquid 412 within the lower volume and in a direct path of the rising vapor 422. The HDD cooling area 525 provides an area at which the at least one HDD 125 can be cooled during functional operation of the at least one HDD 125. The at least one condenser 460 is located at a second distance that is above both the HDD cooling area 525 and the at least one HDD 125. The condenser 460 includes a condensation fluid that flows proximate to the surface of the condenser surface and which maintains the condenser 460 at a lower temperature than a condensation point of the rising vapor 422. A substantial portion of the rising vapor 422 that passes through the HDD cooling area 525 and cools the at least one HDD 125 is condensed back into liquid phase on contact with or exposure to the condenser 460.

The method 700 further comprises applying power to and/or activating/initiating the operation of the submerged processing device to cause the processing device to execute one or more program instructions (block 708). The processing device's execution of program instructions causes the processing device to generate heat sufficient to cause the cooling liquid to boil and vaporization of the cooling liquid to occur. The vaporization of the cooling liquid results in generation of a rising vapor, sufficient to cool the HDDs.

Figure 18:
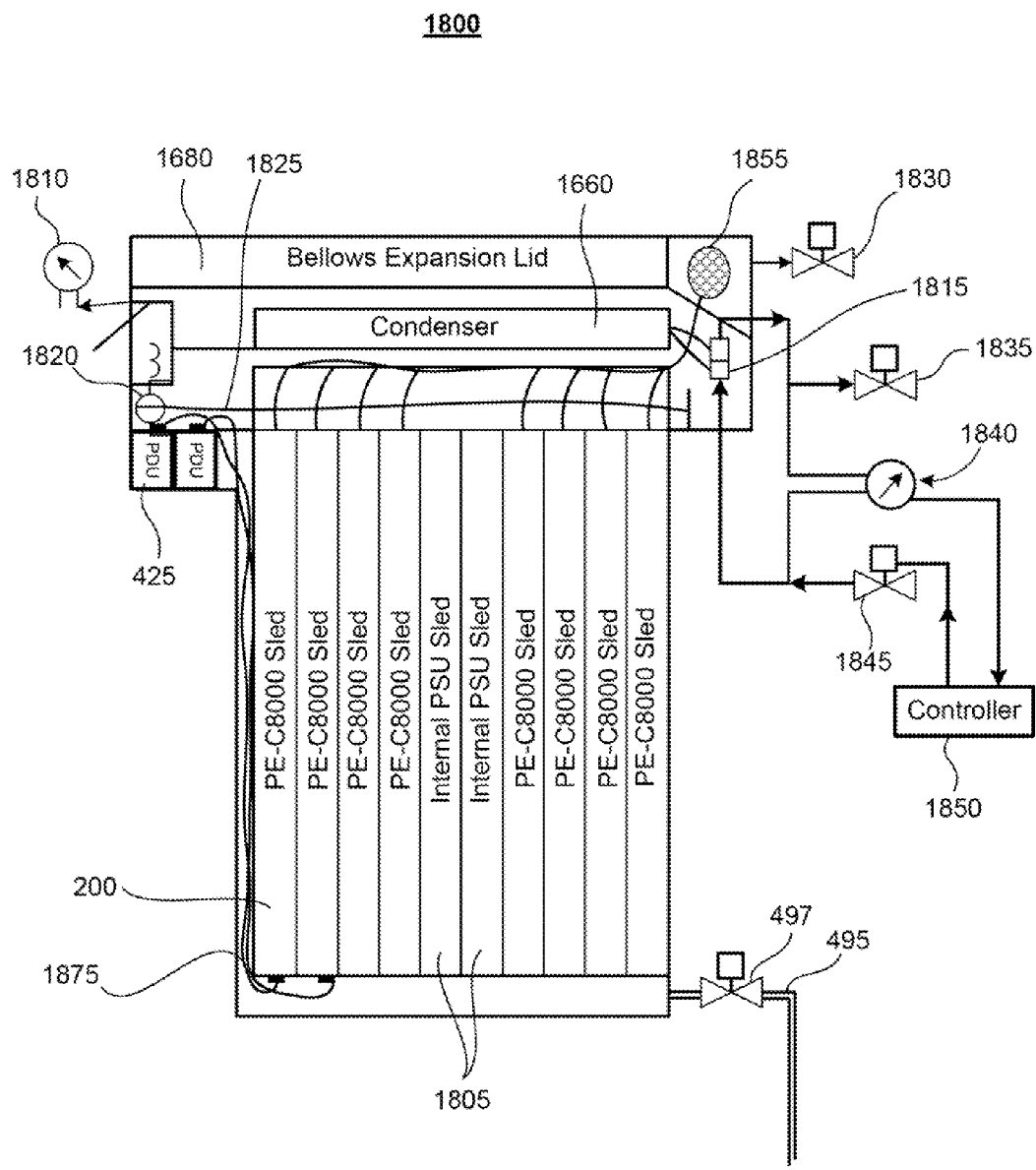
FIG. 18 illustrates example detection and feedback control mechanisms deployed within an immersion cooling tank and which enable control of various operational conditions internal to the immersion cooling tank, including vapor pressure reduction, during operation of the tank as a cooling vessel, in accordance with one or more embodiments.

Method 700 then includes monitoring, via one or more electronic sensors and/or feedback devices, the operating conditions of the immersion cooling tank 400/500 (block 710). Without limitation on the disclosure and according to one or more embodiments, among the feedback and/or control devices and systems that can be provided within example immersion cooling tanks 400, 500 are: pressure sensors 540 and associated feedback control system, a fluid level sensor 535 and associated feedback control system, and a condensation fluid leakage detection system, which includes conductivity strip 530 (FIG. 5). FIG. 18 (which is further described in later sections) generally shows a second embodiment of a rack-based immersion cooling tank 1800 configured with a plurality of additional sensors and feedback and/or control devices. With the exception of the pressure regulating system described within Section H, the mechanisms and methodologies utilized to provide the various system controls are only generally provided for herein. However, it is appreciated that these aspects of the disclosure involve techniques related to general autonomic real-time control mechanisms and/or methodologies that provide for the proper operation and maintenance of the entire immersion cooling system. These control mechanisms/methodologies include several detection mechanisms/devices and functional control loops to enable features such as, but not limited to, controlling the immersion fluid level, detecting leaks in the condenser, detecting and controlling to differential pressure and other pressure conditions, detecting or responding to other conditions within the tank, and providing automatic power shutoff and/or transmitting notification to administrator or IT personnel, in response to certain detected conditions. One or more of the responses to a detected condition can be implemented by processor execution of code associated with one or more feedback control module(s) 170 (FIG. 1).

Returning to the flow chart, at decision block 712, method 700 determines whether there are any conditions detected that require system maintenance or a control response. When no such condition exists, method 700 loops back to block 710 where the sensors continue to monitor for the occurrence of one or more conditions. However, in response to there being a condition detected requiring system maintenance or a control response, method 700 includes mechanically, programmatically, or electronically performing one or more corresponding control operations to maintain an equilibrium or proper operating state of the immersion cooling tank 400/500 (block 714). With respect to the vapor cooling of the HDDs 125, operating conditions of interest include, but are not limited to: (1) the amount of cooling being provided by the rising vapor, which can be controlled by throttling or increasing the amount of processing being performed by the processing devices, which correlates to the amount of rising vapor generated; (2) the amount of heat being dissipated by the HDDs relative to the cooling being provided by the rising vapor, where a rate of data access to the HDD can be controlled (e.g., throttled) if the HDDs are not being sufficiently cooled by the rising vapor; and (3) the highest level of the cooling liquid within the lower volume relative to the HDD cooling area, where the cooling liquid is required to remain below the HDD cooling area to avoid contact with the HDDs.

It is appreciated that operation of at least one processing device or server results in heat dissipation into the surrounding cooling liquid, which absorbs sufficient heat to cause the cooling liquid to reach the boiling point and result in vaporization of some of the cooling liquid to create rising vapor. According to one embodiment, method 700 further includes monitoring via a set of electronic and mechanical sensors and feedback devices one or more operating conditions (e.g., as pressure, temperature, liquid level, etc.) within the immersion tank (block 710).

D. Method to Protect PDUs from Water Infiltration and Enhance PDU Efficiency by Immersion in a Dielectric Liquid With the above described immersion cooling tank 400/500 operating as a cyclical heat exchange ecosystem, which is sealed to prevent loss of cooling fluid to the outside, one important consideration is the need to provide power to the plurality of servers 200/300 and other electronic devices (e.g., HDDs 125) operating within the immersion cooling tank 400/500.

According to one or more of the described embodiments, the cooling liquid that is utilized to produce the cooling via vaporization and later condensation within the enclosure is a dielectric fluid. Selection of a dielectric fluid allows for the avoidance of any electrical interaction of the components being cooled with the fluid and/or rising vapor, among other benefits. For cost and other considerations, water can be utilized as the condensation fluid. Given this use of a non-dielectric condensation fluid, such as water, additional considerations also have to be given to the fact that water is conductive and that there is a risk of leaks of the condensation fluid within the tank. Such a leak could cause water to come into contact with an exposed power distribution unit (PDU), which can cause electrical arcing and other potentially damaging and/or dangerous conditions within the tank. Because water is conductive, the proximity of the water to high voltage equipment creates UL (electrical standards board) safety concerns. Also, with water being utilized as the condensation liquid, the submerged PDU is protected from the water spillage in the event of a leak in one of the overhead condenser units. This is because the water, which is less dense than the dielectric cooling fluid, will simply float on top of the dielectric cooling fluid, without coming into contact with the PDU.

Thus, according to one aspect of the disclosure, rather than de-localizing either the condensation process or the power distribution units from being local to the immersion cooling tank 400/500 or to each other, or require that the condensation liquid be a non-conductive fluid, which is significantly more expensive than the use of water and provides less heat absorption capacity, aspects of the present disclosure provides a solution that yields additional benefits to the implementation of example immersion cooling tank 400/500. To further describe this implementation, reference is made to FIGS. 4 and 5 and later to FIG. 8. This aspect of the disclosure provides techniques to prevent electrical arcing and/or other problems otherwise inherent if a non-dielectric condensation fluid falls on the power distribution units within the immersion tank. Additionally, this aspect yields several benefits associated with power efficiency, as detailed herein.

Referring to FIGS. 4 and 5, in order to provide the required electrical power, the immersion cooling tank 400/500 also includes power distribution units (PDUs) 425. As shown by FIGS. 4 and 5, PDUs 425 are submerged below the surface 420 of the cooling liquid 412. Providing power to the submerged PDUs 425 are power cables 470, which extend through the walls of immersion cooling tank 400/500 for connection to example external power source 475. PDUs 425 can provide electrical power to the various electronic devices and/or components within immersion cooling tank 400/500 via power connectors (e.g., 427). As described herein, servers 200/300 represent electronic devices and/or components that are submerged below the surface 420 of the dielectric cooling liquid 412, and HDDs 125 represent electronic components and/or devices that are located within the tank volume, above the surface 420 of the dielectric cooling liquid 412.

Immersion tank 400/500 also comprises at least one condenser 460 (and potentially multiple condenser sub-units, as illustrated and described below with respect to FIG. 8) located above the surface 420 of the dielectric cooling liquid 412. Condensation fluid (not shown) flows in liquid form through the condenser 460 during normal operation of the immersion cooling tank 400/500. Within the various described embodiments, the condensation fluid (or liquid) is less dense (i.e., has a lower density) than the selected dielectric cooling fluid. Leakage of the condensation fluid into the lower tank volume 402 results in the lighter condensation fluid floating atop the surface 420 of the heavier dielectric cooling liquid 412. The leaked condensation fluid would thus not come into contact with the PDUs 425, as the PDUs 425 are submerged below the surface 420 of the cooling liquid 412. Thus, the potential for leaks that may occur within the upper condenser 460 leading to short circuits or other electrical problems within the immersion cooling tank 400/500 is minimized and/or substantially eliminated.

According to the described embodiments, the PDUs 425 can provide either AC or DC power, depending on the requirements of the electronic devices and/or components being powered. In one or more embodiments, the PDUs 425 can also be blind-mated for additional service benefits. Also in one embodiment, the immersion cooling tank 400/500 can be configured to include a power distribution system or Bus Bar type infrastructure that is embedded into the server rack in order to enable hot pluggable power to a server chassis that is subsequently inserted into the server rack. The power distribution system is generally presented by power connector 415 with power cable 427 extending from PDUs 425; however, alternate methodologies are possible for coupling power to the submerged electronic devices requiring electrical power, including the utilization of at least one of a PDU, transformer, inverter, and a power delivery appliance, which can be either internal or external to the immersion cooling tank 400/500.

According to one aspect, submerging the PDUs 425 in the dielectric liquid provides an enhanced heat transfer coefficient to the power conductors of the PDUs 425 due to the contact with the cooling liquid. This cooling, which minimizes temperature-induced resistances within the (power transporting) metal conductors of the PDUs, increases a current-carrying capacity of the power transport conductors and the PDUs and further results in a reduction in the internal power losses of the PDUs 425, greater power transfer efficiencies, and greater PDU capacity.

Each of the presented figures of immersion cooling tanks (e.g., previously presented FIGS. 4 and 5 and later presented figures) illustrates the placement of PDUs 425 within example immersion cooling tank 400/500. In the illustration of FIGS. 4 and 5, PDUs 425 are placed in a side location of the immersion cooling tank 400/500 away from the actual rack space, and the PDUs 425 are then connected via power cables 427 to the power connectors (generally shown) at the base of the server(s) 200/300. Importantly, PDUs 425 are located below liquid surface 420, and the determination of liquid surface level 420 and response mechanisms in place to monitor and/or control the liquid level would take the location of the PDUs into account to ensure the PDUs 425 remain below the liquid surface level 420.

As illustrated by FIG. 18, power cables 1875 extend beneath the cooling liquid surface from the PDUs 425 to the powered devices, of which first two servers 200 are shown connected. As further illustrated by FIG. 18, the feedback and/or control mechanisms within immersion cooling tank 1800 can also include vertical thermistor array 1815, float or fluid level sensor 1820, which detects a current fluid level 1625 of cooling liquid within the immersion cooling tank 1800, conductivity strip 1825, and flow control valve 497 and external pipe connector 495 which connects the immersion cooling tank 1800 to a multi-rack immersion liquid distribution system, in one embodiment. One or more of these components and/or the collection of these components can be utilized to ensure that the liquid level within the tank 400/500 remains within the acceptable range of cooling liquid volume required.

E. Partitioned, Rotating Condenser Units to Enable Servicing of Submerged IT Equipment Positioned Beneath a Vapor Condenser As presented by the above descriptions, one aspect of the disclosure involves the recognition that a passive 2-phase immersion cooling system requires a condensing unit to be placed gravitationally above the heat dissipating servers. Another aspect of the disclosure provides a design of the immersion cooling tank that includes a lid structure comprised of multiple rotating condensers. With these designs, the condensers of the immersion tank are configured as separate adjacent condenser based covers over separate vertical spaces. The separate condensers are referenced herein as condenser sub-units, to indicate that each represents a sub-part of a larger condenser or condenser system. Each condenser sub-unit is rotatable to an open position to expose and/or provide access to a server blade or other electronic device located below that partition. The individual partitions allow for servicing/maintenance to be performed on an exposed server blade, while allowing the system to continue operating and cooling the remaining immersed server blades (including those directly adjacent to the exposed blade) using the remaining condensers that remain in place over the rising vapor.

One existing solution to cooling server racks utilizes a condenser that coils around the outer rim of an IT rack for immersion cooled IT servers. This solution has inherent limitations with respect to the solution's cooling capacity and the solution's ergonomic flexibility, as the height of the cooling structure (rack or tank) must be grown to accommodate the condenser coils. Also, existing solutions to the challenge of accessing individual server nodes operating in an immersion environment are limited to routing the condenser tubes around the outer rim of the IT rack. With this design, access to the server nodes allows for a significant amount of vapor escape during service events and necessitates that the rack footprint grow outwards—increasing overall cost and service time. Accordingly, another aspect of the disclosure is the recognition that the conventional methodology parasitically limits the available condenser surface area for vapor to liquid phase change during even a minimal service, and thus limits the total cooling capacity of the system. Once the cover to the tank is opened, the entire volume of rising vapor escapes the system, resulting in loss of vapor/liquid mass, which unnecessarily leads to significant cooling fluid replacement costs. The disclosure presents a more desirable and functional design that allows one to gain access to individual server nodes in a blade or multiple chassis rack without disrupting the condensation process and/or while allowing only a minimal amount of vapor to escapes during the service event.

Figure 8:
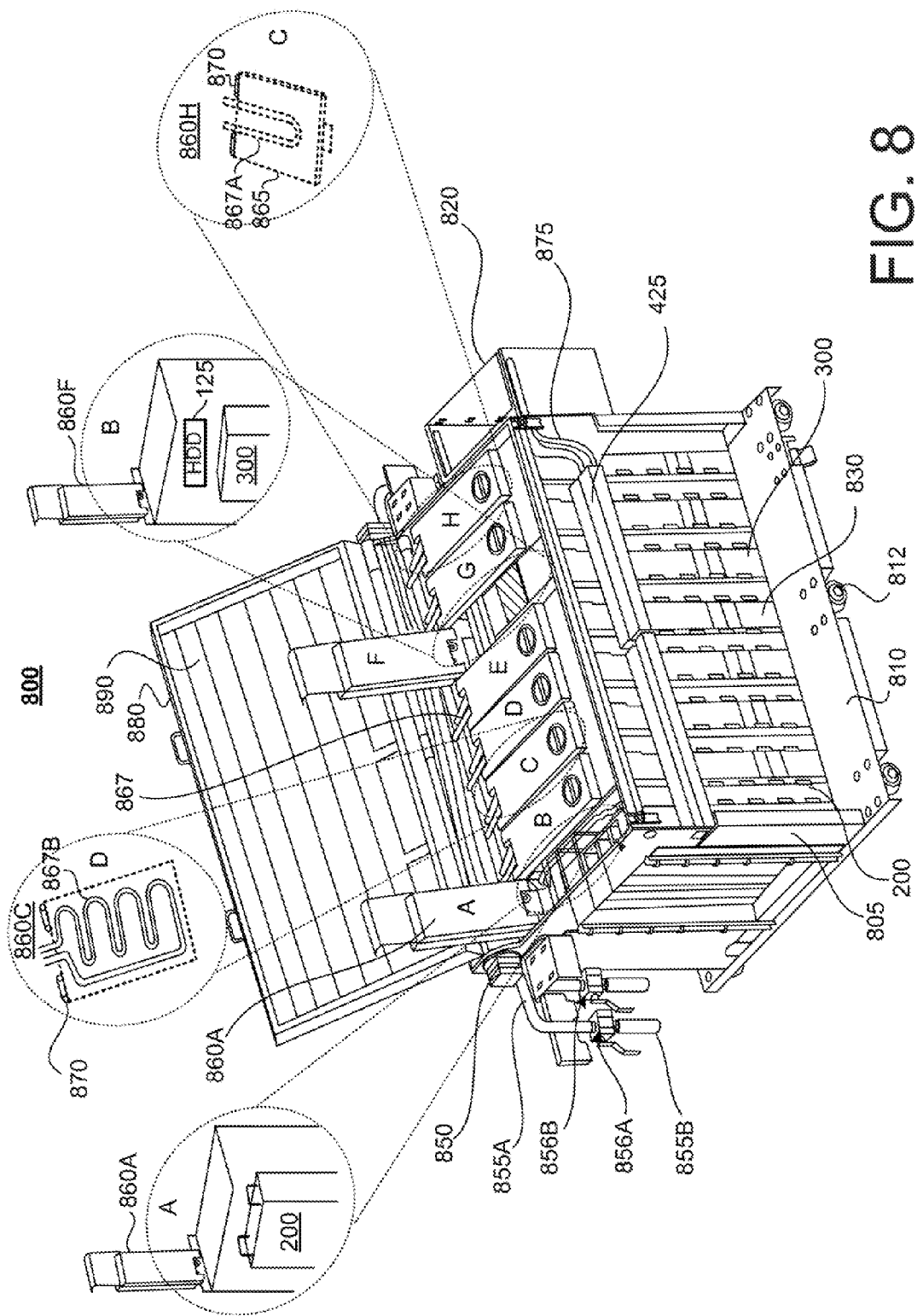
FIG. 8 illustrates a three dimensional view of an example immersion cooling tank such as presented by FIGS. 4 and 5, configured with multiple condenser sub-units to provide cooling of multiple partially immersed servers placed within a server rack, in accordance with one or more embodiments.

FIG. 8 shows an example three dimensional rack-configured immersion cooling tank 800 designed to support multiple side-by-side electronic devices, such as servers 200/300, within a server rack (not specifically identified), where at least a portion of the electronic devices are submerged in cooling liquid for cooling of the electronic components located below the surface of the cooling liquid. Immersion cooling tank 800 is a three dimensional view of a practical example of the schematics of immersion cooling tank 400/500 and includes a tank volume (see FIGS. 4-5) containing a dielectric fluid (not shown). For continuity, immersion cooling tank 800 shall be described with reference to features presented in FIGS. 4 and 5, where applicable. In FIG. 8, immersion cooling tank 800 is shown without its front panel, which is made transparent (i.e., not visible) in order to provide a clear view of the rack space, servers, and other components and features inside the tank volume.

Immersion cooling tank 800 includes exterior casing 805 and a base panel 810. The specific design of the casing 805 can vary from one embodiment to the next, and is thus not limiting on the disclosure. Included in base panel 810 are one or more wheels 812 to enable the immersion cooling tank 800 to be moved along the ground surface on which the immersion cooling tank 800 is located.

Additionally, immersion tank 800 includes a dry tank 820 coupled to an exterior side panel. Dry tank 820 can be utilized to allow other air-cooled IT equipment to be physically coupled or co-located with an immersion-cooled IT rack. Dry tank 820 accommodates those other IT components that are typically paired with volume servers within the resulting datacenter, but which components cannot be easily immersed in liquid. Examples of these liquid-incompatible devices or components include, but are not necessarily limited to, rotating HDDs and network switches. Another aspect of the design can include an overhead storage compartment for HDDs, power, switches, etc. Thus, in one embodiment, rather than rule out immersion cooling for IT servers that require or include these types of components that are required to be locally coupled, one aspect of the design of the immersion cooling tank involves providing a detachable, containment structure for "top of rack switches" to be paired with the immersion tank. These compartments can be placed on either side of the immersion rack, designed with attachments on either or both sides, or overhead to save floor space. Also, these compartments can provide additional storage for large JBOD (just a bunch of disks/drives) or HDD clusters that cannot be immersed in liquid.

It is appreciated that one rack implementation that does not involve use of liquid-incompatible devices or components is a rack design for and/or requirement that servers use SSD drives, "diskless" configurations, or external, remote storage solutions. The present design appreciates and resolves the problem of latency deficiencies inherent with use of remote storage by ensuring the storage components are attached to the tank in a locally external configuration of the server. Also, the present design also appreciates and resolves the problem of latency and increased cabling costs when switches are mounted in centralized network switch trees.

Immersion cooling tank 800 includes a plurality of electronic devices and/or components, including servers 200/300 and other devices 830, some of which are rack mountable. As illustrated, a plurality of electronic devices, including servers, can be aligned and/or inserted in a side-by-side configuration within the rack (not shown). FIGS. 4 and 5 illustrate the example vertical orientation of these servers 200/300 relative to the tank volume. With the exception of HDDs, where provided, these electronic devices can be submerged or partially submerged in the dielectric fluid.

In one embodiment, the collection of servers 200/300 represents a data center. Further, in this embodiment of immersion cooling tank 800, the cooling liquid (e.g., 412, FIG. 4) is a dielectric that has high volatility (i.e., low boiling point) relative to the temperature increase of the cooling liquid caused by the heat dissipation from the operating servers 200/300. Accordingly, during normal server operations, the operating servers 200/300 dissipate heat sufficient to raise the temperature of the dielectric liquid 412 to the boiling point temperature of the dielectric liquid 412, and this rise in the cooling liquid temperature caused by the heat dissipation from the servers causes the vaporization of the dielectric liquid (412) generating dielectric vapor (422) as described with reference to FIGS. 4 and 5.

As further illustrated, immersion cooling tank 800 includes one or more PDUs 425, which provide the electrical power required by the electronic devices to operate. As shown, PDU(s) 425 are located below the surface layer 420 (FIG. 4) of dielectric fluid. The PDU(s) 425 are connected to the electronic devices and to an external power source via power cable(s) 875.

Immersion cooling tank 800 includes a tank cover 880 that is connected to the tank via a hinge mechanism and which allows the interior volume of the tank to be sealed. When the cover is placed over the tank, the tank is sealed to be air-tight, such that no vapor can escape through the seal created. Creation of this air-tight seal can involve the use of a rubber or other impervious material along the perimeter edges of the tank cover 880 and/or the top of the lower tank volume at which the tank cover interlocks. Located within the tank cover 880 is a bellows 890. As described in greater details in Section I, bellows 890 serves as a vapor pressure regulator during operation of immersion cooling tank as a two-phase heat exchange cooling vessel.

As indicated by FIGS. 4 and 5, the various embodiments of the disclosure present a condenser 460 that is used to extract heat from the rising vapor from a liquid to vapor phase change system. As with these illustrations, during operation of the immersion cooling tank 800, a portion of the dielectric cooling liquid within the lower volume of the tank evaporates to create a plume of rising vapor (422). According to one embodiment, the tank is configured such that a condenser (generally represented as condenser 860 herein) is placed gravitationally above the heat dissipating servers, in the direct path of the rising vapor (422). The use of the cover assembly including the condenser provides a substantially impervious seal for the tank volume to ensure that the rising vapor within the tank volume cannot escape the tank volume while the condenser 860 is fixably rotated to a closed position over the specific vertical space of the lower tank volume that is below the condenser 860.

As further provided by the example embodiment of FIG. 8, the condenser 860 is designed as multiple condenser sub-units 860A-H within the upper volume 404 and located below the tank cover 880. Each condenser sub-unit 860A-H represents a partition of the overall condenser 860 and is connected to the tank casing via a rotatable hinge 880. The rotatable hinge 880 enables each condenser sub-unit 860A-H to be rotated a number of degrees (e.g., 90-180 degrees) away from a fully closed position. In one or more embodiments, the individual condenser sub-units 860A-H are rotatable from a closed position of 0 degrees to an open position ranging from greater than 0 degrees to a maximum number of degrees, where the maximum number of degrees is sufficiently large to allow access to the vertical space below the condenser sub-unit within the tank volume to access and/or remove a server or other device that is placed within that vertical space of the tank volume.

According to one aspect, each individual condenser sub-unit 860A-H includes a separate condensation surface 865 from each other individual condenser sub-unit and a separate local conduit 867 for providing condensation fluid to cool the separate condensation surface. During an opening of a first condenser sub-unit (e.g., 860F), each other individual condenser sub-unit that remains in a closed position continues to provide condensation of the rising vapor from the lower tank volume, while the first condenser sub-unit (860F) is open. Thus, an opening of the first condenser sub-unit (860F) does not hinder or prevent ongoing condensation from occurring at each adjacent second condenser sub-unit (860E, 860G) and the other non-adjacent condenser sub-units (860B-860D, 860H) that remains in the closed position.

Thus, according to the above introduced aspect of the disclosure, the immersion cooling tank 800 includes: a tank volume comprised of side walls and a base that allows a cooling fluid (412) to be maintained and heated therein; a rack structure within the tank volume having server rails that supports removable insertion of a server-based information handling system (e.g., server 200/300); and a cover 880 that encloses the tank volume and which is designed with a condenser 860 configured as a plurality of condenser sub-units 860A-H. Each of the plurality of condenser sub-units 860A-H is rotatably connected via a hinge mechanism 870 to the tank wall or several rails (or other fixed component) and can be individually rotated from (1) a closed position in which a vertical space below the condenser sub-unit 860A-H within the tank 800 is sealed to allow condensation to (2) an open position in which exposure and/or access to the inside of the vertical space is provided. The hinged mechanism 870 enables each individual condenser sub-unit (e.g., 860F) to be opened independent of the other sub-units (e.g., 860G), and each other condenser sub-unit can remain in a closed position while any one of the condenser sub-units is opened.

This partitioning of the condenser 860 into condenser sub-units 860A-H enables access to one or more of (1) a particular HDD 125 physically located below the particular rotatable condenser sub-unit 860A-H; or (2) a particular server 200/300 that is inserted into the server rack at a vertical plane or location relative to the directional run of the servers within the immersed server rack. FIG. 8 illustrates the horizontal run of side-by-side servers, each extending upwards into respective vertical spaces. A separate condenser sub-unit 860A-H is located above each separate vertical, such that the corresponding condenser sub-unit 860A-H is located above a particular server 200 (inclusive of HDDs) and/or server 300 and locally extern HDDs 125.

Illustrated at the back of immersion cooling tank 800 are a plurality of network cables 850, representing network cable bundle 450 of FIGS. 4 and 5. As described above, one or more of network cables 850 are coupled to the communication and data connectors of one or more servers 200/300 or other electronic devices 505 (and/or HDD 125, if provided). Also, illustrated at the back left section of immersion cooling tank 800 are intake and outflow valves 856A and 856B respectively connected to intake pipes 855A and outflow pipes 855B through which condensation liquid flows.

Additionally, four insets, labeled A-D, are presented in FIG. 8. Insets A and B illustrate and/or provide additional details about possible internal configuration within vertical spaces below condenser sub-units, while insets B and C illustrate example make up of the condenser sub-units themselves. Specifically, inset A illustrates example server 200 placed within the server rack space extending vertically below condenser sub-unit 860A, while inset B illustrates example server 300 with externally local HDDs 125 placed within the server rack space extending vertically below condenser sub-unit 860F of immersion cooling tank 800. As shown by the insets C and D of FIG. 8, described hereafter, each condenser sub-unit 860A-H includes a condensation surface 865 and a condensation fluid (not shown) that flows proximate to the condensation surface 865 through pipes 867. The configuration of the pipes 867 within condenser subunits 860A-H can be a simple loop as illustrated by pipes 867A of inset C or can be much more intricate as provided by pipes 867B of inset D. The latter configuration of pipes 867B with inset D provides a greater surface area that is exposed to the rising vapor (422) for condensation thereof. The external surface of the tubular piping can, in one embodiment, provide the condensation surface for the condenser 860 or condenser sub-units 860A-H.

Figure 12:
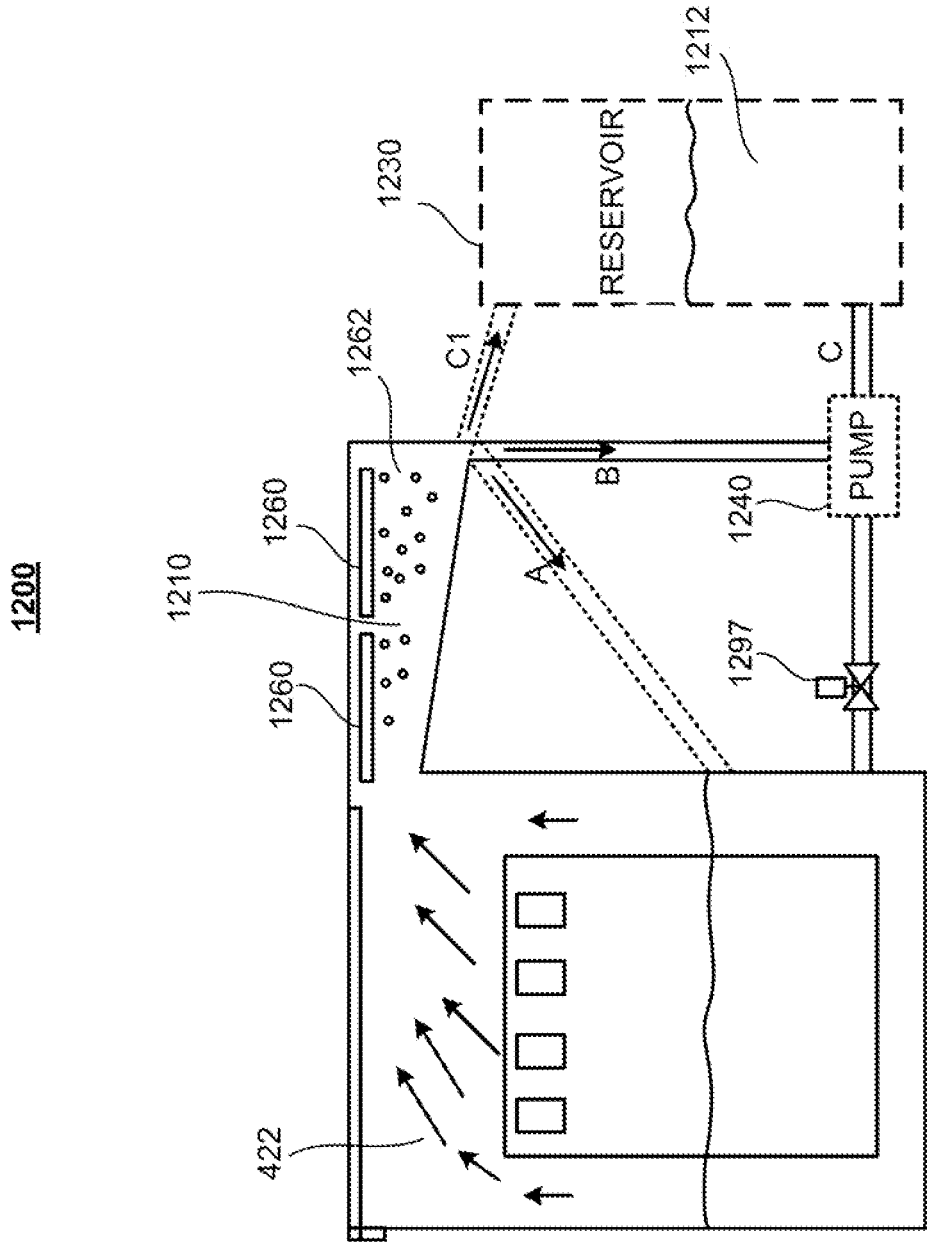
FIG. 12 is an example immersion tank for cooling one or more partially immersed servers utilizing one of a plurality of circulating channels for condensation of the rising dielectric vapor and return of the condensate to the lower volume of the tank, according to one embodiment.

In one embodiment, the condensation fluid flows through the interior bore of the tubular pipe from an external fluid source/reservoir. In another embodiment, the heat exchange with the condensation fluid occurs locally via a radiator type structure attached to the exterior of the immersion cooling tank 800 such that no external piping is required. In yet another embodiment, as illustrated by FIG. 12, a stand alone immersion cooling tank can be configured with the exterior atmospheric air operating as the condensation fluid that cools the rising vapor (422). These two latter implementations enable aspects of the stand alone immersion cooling tank described in the following section.

According to the above described aspects of the disclosure, the singular rack condensing unit position at the top of the immersion cooling tank is designed as and/or partitioned into a plurality of sub-condensers that can be individually serviced or rotated to enable access to each individual server chassis (first node) without interrupting the condensation process of the adjacent nodes. While described as a singular assignment of partitions to server nodes, or vice versa, the granularity of the partitions is a design choice. As such, in other embodiments, two or more server nodes can be located beneath a single condenser partition so long as the system has at least one additional partition and one addition server node located beneath that one additional partition. As designed, the individual partitions of the condenser are each capable of being rotated at least a minimum number of degrees (e.g., 90 degrees) from a closed position to enable servicing of IT equipment during runtime, without interrupting the flow of liquid through the condenser surface and/or requiring any other uptime interruption of the data server. As demonstrated by FIG. 8, with the immersion cooling tank 800, while one server is exposed by opening the condenser sub-unit (e.g., 860A or 860F) vertically above the server, the other servers remain submerged in a cooling fluid. The cooling fluid continues to boil and generate rising vapor, which then condenses on the closed condenser sub-units 860B-860E, 860G 860H) to perpetuate the heat transfer cycle, while the exposed server(s) (e.g., below condenser sub-units 860A, 860F) can be serviced.

In one or more embodiments, the number of individual condenser sub-units is numerically correlated to a fixed number of servers that can be accessible via the opening of the individual condenser sub-unit. Thus, a single server or a plurality of servers can be located within the vertical space below the condenser sub-unit. Also, a power switching unit (PSU), of HDD, or other electronic device being cooled via vaporization-condensation fluid cycles can also be located within the vertical space.

F. Condensation Liquid Distribution System and Thermodynamic Stepping of Multiple Working Fluids to Provide Cooling of Target Space According to one or more embodiments, condenser sub-unit 860A-H (FIG. 8) and in particular the condensation surface 865 comprises at least one extended length of tubular piping extending from an external pipe running to the inside of the enclosure via an intake path and then back to the outside of the enclosure via an out flow path. According to one embodiment, the external ends of the tubular piping 855A-B (FIG. 8) of immersion cooling tank 800 can be connected with an external condensation fluid source, which can be working fluid reservoir 920 (FIG. 9, described hereafter) to create a condensation loop, with the condensation fluid being a first working fluid. In one or more embodiment, immersion cooling tank 800 also includes a condensation liquid distribution system connected to and/or including the condenser sub-units 860A-H. Condensation liquid distribution system includes a network of pipes 855 that run into and out of each condenser and/or condenser sub-unit 860 and connect to a main piping system, which can include connecting end valves, for facility water connection. Two end valves are illustrated, consisting first of intake valve 856A, at which condensation fluid is received from the external reservoir and passed to the condenser sub-units 860A-H. The second valve is the outflow valve 856B at which the heated or evaporated condensation fluid passes back towards the condensation fluid reservoir on the outside. Notably, as illustrated by the inset figure showing an internal makeup of condenser sub-unit, each sub-unit can consist of a single loop of piping 867 proximate to a "separate" condensation surface 865. The actual number of such loops of piping 867 can vary depending on the actual size of each condenser sub-unit, and the inset C and D are provided solely for example to contrast with the larger condensers illustrated within FIGS. 4 and 5.

According to at least one embodiment, the internal tubes or pipes of the previously introduced condensers 460 (FIGS. 4-5) and condenser 860 (FIG. 8) and/or condenser sub-units 860A-H are coupled to the condensation fluid distribution system. The condensation fluid distribution system can in turn be connected to an external reservoir from which the condensation fluid flowing into the condenser is provided. The condensation fluid is piped into the condenser 860 at a temperature that is less than the cooling point or condensation temperature of the rising vapor 422. Within the condenser 860, the condensation fluid maintains the condensation surface 865 at a lower temperature than a condensation point/temperature of the rising vapor (422).

According to one or more embodiments, the condensing fluid utilized within the condensers 460/860 can be water. With the known thermal properties (i.e., vaporization point and condensation point) of the specific dielectric fluid utilized (e.g., Novec fluid), regular water can be utilized. Importantly as well, the water does not need to be chilled or cooled to provide the condensation of the rising vapor and as such can be pulled from a facility water source reservoir. Thus, ambient water is received from a facility water source (or reservoir) as condensation liquid that condenses the rising vapor (422) from the dielectric fluid. The latent heat transfers from the vapor (422) to the water, and the water is eventually returned back to the facility reservoir. Notably, in one embodiment, this heated water can then be utilized for other uses, such as to heat the facility or other structure, etc., within an example environmental application.

Figure 9:
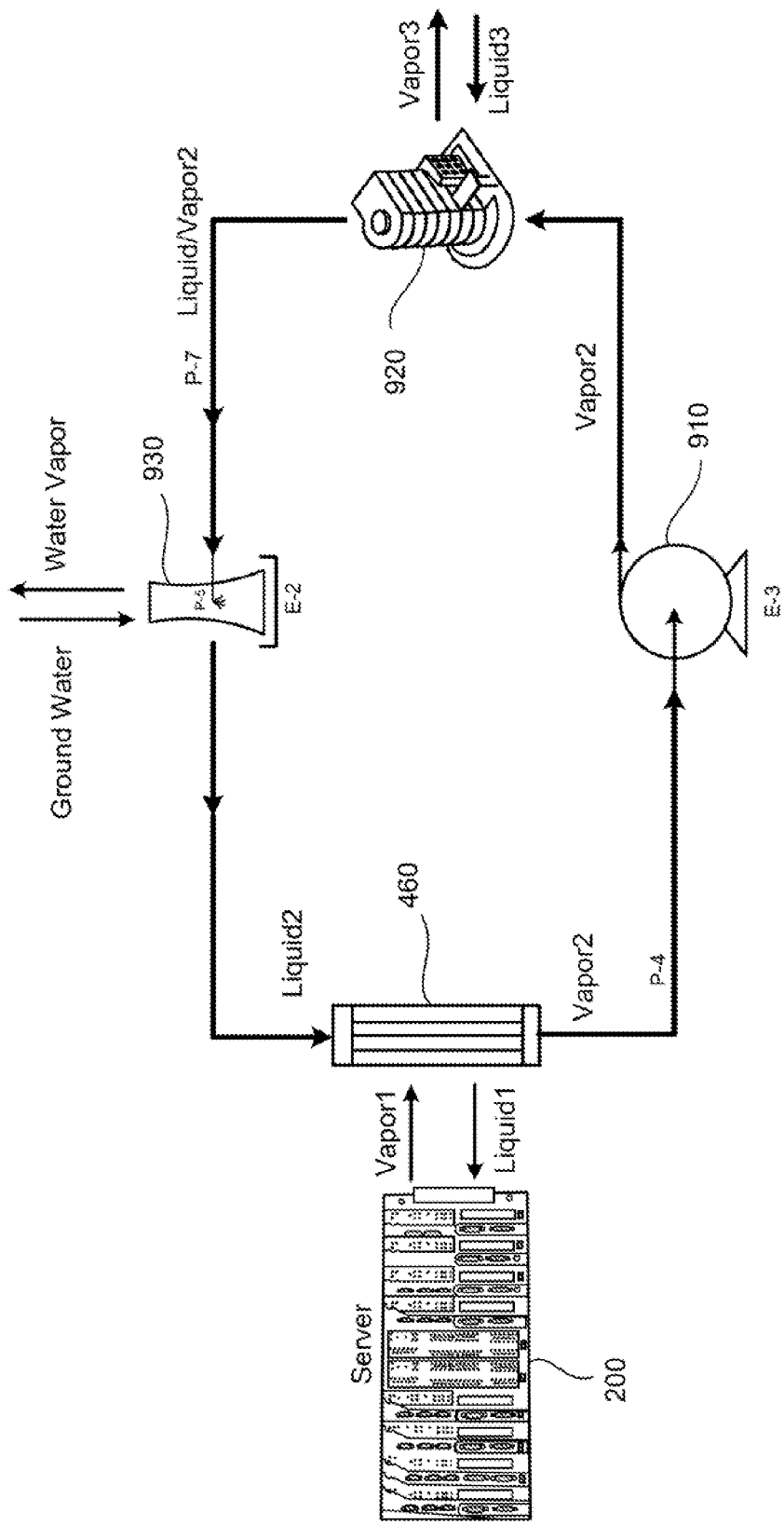
FIG. 9 is a facility exchange diagram showing the application of the vaporization-condensation cooling system to a larger heat exchange environment, according to one embodiment.

FIG. 9 shows an example of one possible implementation of an environmental application that provides secondary heating based on the heat absorbed by the condensation fluid flowing through condensers 460/860. Server 200 represents a heat source that is submerged in an immersion cooling tank (not shown) and operated while submerged below a cooling liquid to cause vaporization of the cooling liquid. Example condenser 460 is a two phase condenser which receives condensation liquid at the intake pipes. Condenser 460 absorbs the heat from the rising vapor (V1) and condenses the vapor back to liquid (L1), which returns to the immersion cooling tank. According to the illustrated embodiment, the amount of heat absorbed from the rising vapor (V2), i.e., the latent heat dissipation required for heat change from vapor to liquid condensate, can be sufficient to evaporate the condensation liquid (L2) into a condensation vapor (V2) as the heat is absorbed by the condensation liquid flowing within the condenser. This condensation vapor can then be forwarded to a facility pump 910, which pushes the condensation vapor (V2) towards a heat recovery system 920 for a building or other location requiring heat. Heat recovery system 920 of the building can include a third condensation liquid (L3) which can absorb the heat from the condensation vapor (V2) and in turn vaporize to generate a third condensation vapor (V3). With the latent heat removed, at least a portion of the condensation vapor can condense back to a condensation liquid (L2). This condensation liquid is then sent to an evaporative cooling tower 930, where any additional latent heat is removed from the received fluid such that the remaining vapor condenses back to condensation liquid. The cooling tower 930 operates as the facility water source reservoir in this example.

Figure 10:
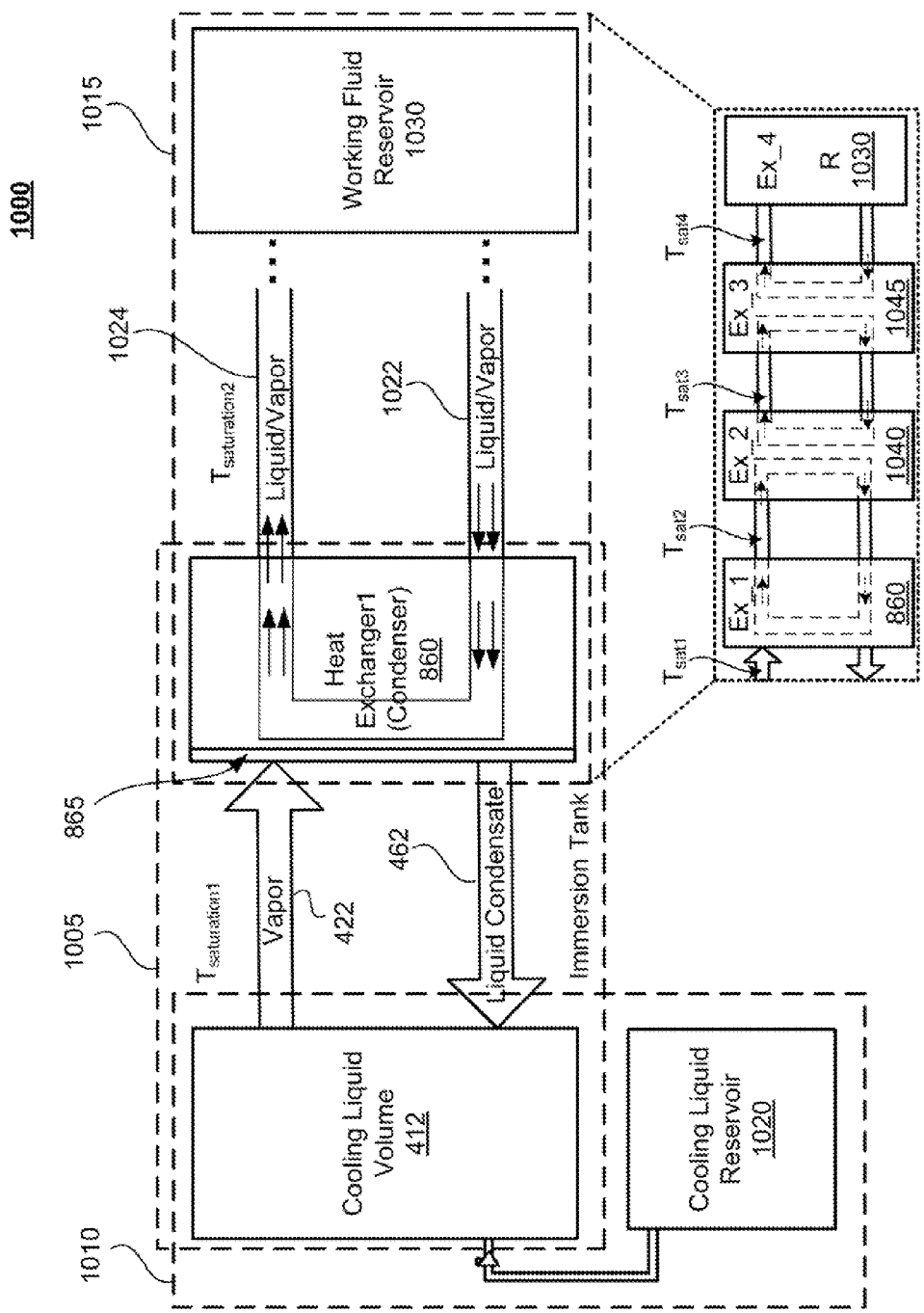
FIG. 10 illustrates a plurality of sequentially linked heat exchange loops utilized for cooling a target space with cycling of working fluids utilizing multiple heat exchanges and associated working fluids in tandem with a working fluid reservoir, according to one or more embodiments.

Turning now to FIG. 10, there is illustrated an example fluid-based heat exchange system that can be utilized with an immersion cooling tank 400/500/800 to allow for stepped heat exchange via a plurality of different working fluids. FIG. 10 generally illustrates a method and system for providing cooling of a target space, i.e., the immersion cooling tank 1000, in which heat is being dissipated. Specifically, the figure illustrates a method and system for cooling components disposed within an immersion tank that supports two-phase cooling of an immersion server via an vaporization-condensation cycle utilizing a volatile (i.e., low boiling point) immersion liquid. In FIG. 10, a first dashed box (first fluid transformation 1005) represents an example heat exchange components of an immersion cooling tank 700, where a cooling liquid 412 is evaporated into vapor 422, which vapor is then condensed into a condensate 462 that returns to the cooling liquid volume. A second dashed box (cooling liquid distribution system 1010) represents the fluid exchange or replenishment between a cooling liquid reservoir 1020 and the volume of cooling liquid 412 within the immersion cooling tank 1000. The methodology for supplying cooling liquid 412 to the immersion cooling tank 1000 can vary, and one example is provided within Section H, described hereafter. A third dashed box (condensation liquid distribution system 1015) then represents the heat exchange system, which includes a first heat exchanger or condenser 860 and can include a working fluid reservoir 1030.

The heat exchange system diagram of FIG. 10 illustrates both sides of a two-phase vaporization-condensation cooling system 1000, which includes a cooling liquid distribution system 1010 and a condensation liquid distribution system 1015. Two-phase vaporization-condensation cooling system 1000 provides a first tandem of vaporization-condensation fluid transformations 1005 within an example immersion tank, which is assumed to be immersion tank 800 (FIG. 8) in this example. With this first fluid transformation 1005, a volume of cooling liquid 412 is evaporated into vapor 422 and the vapor is then condensed back into cooling liquid condensate 462 by a condenser 860, which represents a first heat exchanger (Ex_1). Condenser 860 has a surface 865 at which the two working fluids are able to come into proximity with each other in order to allow for the heat exchange from vapor 422 to condensation liquid 1022 to generate condensation vapor 1024. The volume of cooling liquid 412 can be obtained from a cooling liquid reservoir 1020, which serves to replenish the level of cooling liquid 412 within the immersion tank 800 in the event of a leak and/or loss of fluid from immersion tank 800. According to one embodiment, a sensor and/or feedback mechanism that includes an intake flow control valve (e.g., 497 (FIG. 4)) attached to the piping from cooling liquid reservoir 1020 can be provided with the immersion tank 800 to automatically maintain the fluid levels in the immersion tank 800 at a desired level.

In FIG. 8, a first heat exchanger is represented by condenser 860. The condensation which occurs within first heat exchanger involves a flow of condensation liquid, which occurs within condensation liquid distribution system 1015. As shown by FIG. 10, condensation liquid distribution system 1015 includes a condensation liquid reservoir 1020 connected via a system of pipes, which are generally indicated as inflow pipes 1022 and outflow or return pipes 1024. It is appreciated that the system of pipes necessarily includes intake and return pipes 855A-B of condenser 860 (FIG. 8). Condensation fluid flows from condensation fluid reservoir 1030 and enters condenser 860 as a liquid having a lower temperature relative to the vapor temperature and/or the ambient temperature within upper volume of the immersion cooling tank 800. In one embodiment, the condensation liquid absorbs heat form the vapor 422 causing the vapor 422 to condense back into cooling liquid condensate 462. The heat absorbed by the condensation fluid increases the temperature of the condensation fluid and generates heated condensation fluid, which is returned to the condensation liquid reservoir 1020 for cooling, in one embodiment. In another embodiment, the condensation fluid enters the condenser in liquid form and the amount of heat absorbed by the condensation liquid is sufficient to boil the condensation liquid. This boiling results in a phase change from condensation liquid to condensation vapor, which can be returned to the condensation liquid reservoir 1020 for cooling, in one embodiment.

According to one embodiment, condenser 860 can be referred to as heat exchanger1, to indicate alternate implementations in which multiple vaporization-condensation cycles are chained together between the immersion cooling tank 800 and the "final" reservoir 1030 or final heat exchange medium. Thus in FIG. 10, the dots that extend left of the reservoir 1030 indicate that additional heat exchangers and associated working fluids can be included within the chain, prior to final cooling at the reservoir 1030 or other form of final heat exchange medium, such as the atmosphere. Each subsequent heat exchanger would then utilize the heated condensation liquid of the previous heat exchanger as the heat source that ultimately provides the required heat energy at that heat exchanger which the heat exchanger extracts and provides to heat the intake of condensation fluid by the heat exchanger. Implementation of this more complex heat exchange methodology can require use of different condensation fluids as the working fluid at each heat exchanger, where the different boiling and condensation temperatures allow for a phased heating and cooling cycle until the final heat exchanger or reservoir 1030. It is appreciated that the final heat exchanger can be the atmosphere, where the heated working fluid is cooled by contact with regular air.

Figure 11:
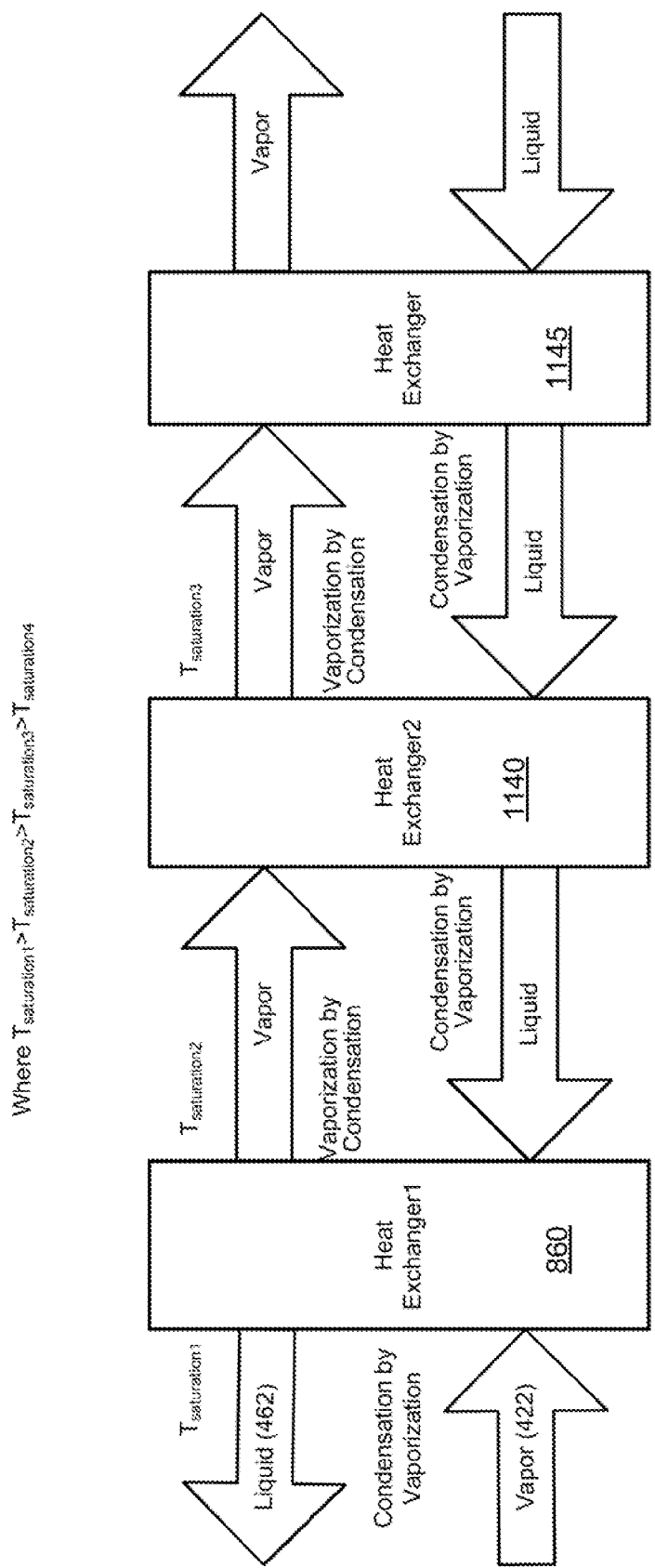
FIG. 11 illustrates an example of a system providing multiple condensation-vaporization and vaporization-condensation cycles of working fluid loops to effect a heat transfer and/or cooling of a target space, according to one embodiment.

According to another aspect, and as shown in greater detail by the inset drawing of FIG. 10, which is further exemplified in FIG. 11, a plurality of heat exchanges are arranged in tandem with each other. Each heat exchanger can have a different working fluid. Alternatively, two or more of the heat exchanges can share a working fluid, but with the working fluid maintained at different pressures. In the inset drawing a four-condenser chain of interconnected heat exchangers is provided, namely first heat exchanger (Ex_1) 860, which is also condenser 860, second heat exchanger (Ex_2) 1040, third heat exchanger (Ex_3) 1045, and fourth heat exchanger (Ex_4), which is also reservoir 1030, in one embodiment. Each heat exchanger operates with a working fluid that has a different relative saturation temperature Tsat from the adjacent upstream and/or downstream heat exchanger(s). According to one aspect, the saturation temperature, $T_{saturation}$, of each working fluid is has a stepped relationship relative to each adjacent working fluid, such that:

$$T_{saturation1} > T_{saturation2} > T_{saturation3} \ldots,$$

where $T_{saturation1}$ is the saturation temperature of the cooling fluid, $T_{saturation2}$ is the saturation temperature of the first working fluid, and so on. According to one embodiment, the difference in saturation temperatures can be controlled by utilizing dissimilar working fluids. In another embodiment in which the same working fluid is utilize within multiple heat exchangers, the saturation temperatures can be controlled by holding the working fluid at dissimilar pressures, where greater pressure reduces the saturation temperature of the working fluid.

Referencing the illustration of FIG. 11 along with aspects of FIG. 8, an embodiment of the disclosure provides a system that includes: an immersion cooling tank having one or more operating components that dissipate heat and which are submerged in a first cooling liquid (412) that absorbs the dissipated heat, such that a portion of the first cooling liquid (412) evaporates and generates a rising plume of vapor (422) within the immersion cooling tank. The system further includes a first heat exchanger (860) associated with the immersion cooling tank and which includes a first working fluid flowing through a first conduit connected to a first condenser unit having at least one surface 865 that is exposed to the rising vapor 422. The first working fluid absorbs heat from the rising vapor (422) to cause the rising vapor 422 to undergo a phase change into a corresponding portion of first cooling liquid condensate 462. The system further includes at least one second heat exchanger 1140 that is physically coupled to the first conduit through which the first working fluid passes after absorbing the heat from the rising vapor. The second heat exchanger 1140 includes a second working fluid flowing through the second heat exchanger outside of the first conduit. The second working fluid absorbs heat from the first working fluid as the first and the second working fluids come into proximity with each other within the second heat exchanger (see inset of FIG. 10). In one embodiment, the second working fluid flows through a second conduit co-located proximate to the first conduit.

In one embodiment, the system further includes: at least one third heat exchanger 1145 that is physically coupled to the second conduit through which the second working fluid passes after the second working fluid has absorbed the heat from the first working fluid. The third heat exchanger 1145 includes a third working fluid flowing through the third heat exchanger 1145 outside of the second conduit. The third working fluid absorbs heat from the second working fluid as the second and the third working fluids come into proximity with each other within the third heat exchanger. In one embodiment, the third working fluid flows through a third conduit co-located proximate to the second conduit.

According to one embodiment, the first working fluid enters the first heat exchanger (860) as a liquid and at least a portion of the liquid evaporates into vapor form due to the absorption of the heat being dissipated within the target space (e.g., the interior volume of the immersion cooling tank 800). The vaporized first working fluid is then condensed back to a liquid form of working fluid at the second heat exchanger 1140.

According to one or more embodiments, the target space is the inside of one of (a) an immersion server drawer and (b) an immersion server tank, and the heat being dissipated within the target space is heat generated during operation of one or more functional components of an operating server located within the target space. Within this embodiment, the processing components of the servers are immersed within a dielectric fluid, which evaporates to generate dielectric vapor that is then condensed back to dielectric liquid by the first heat exchanger 860. According to one embodiment, the first heat exchanger 860 and the second heat exchanger 1140 are condensers.

One additional aspect of the disclosure provides a method that includes: providing a first heat exchanger within the target space to absorb heat from within the target space using a first working fluid that is flowing through the first heat exchange; and circulating the first working fluid egressing via a first conduit from the first heat exchanger to be re-utilized within the first heat exchanger by passing the egressing first working fluid through a second heat exchanger that has a second working fluid flowing through a separate, second conduit. The method further includes: enabling the second working fluid egressing from the second heat exchanger to be cooled via one of a third heat exchanger, a reservoir, and the atmosphere before circulating the second working fluid back to the second heat exchanger. The first working fluid has a heat absorption coefficient that is greater than the heat being dissipated within the target space. The second working fluid has a heat absorption coefficient that is greater than the heat being dissipated by the first working fluid as the first working fluid passes through the second heat exchanger.

Thus, according to one or more embodiments, the heat exchanger portion of the immersion tank implementation employs fluids of dissimilar saturation temperatures to achieve the two-phase heat transfer on both the exterior of the condenser and the interior of the condenser in a combined Condenser/Evaporator configuration. This aspect of the disclosure recognizes that while single-phase fluids can provide excellent cooling capacity in forced convection environments, the single-phase cooling methods are burdened with the hydraulic power cost for pushing mass at high velocities across a heat transfer surface. This penalty, which can be in the form of an increase in fan power or pumping power costs, represents a source of inefficiency for the cooling of heat dissipating devices.

Accordingly the disclosure provides a two-phase or mixed phase flow, which can provide equal or greater cooling capacity as single-phase fluid flow at a fraction of the total mass flow rate by utilizing combined latent and sensible heat transfer. As utilized herein, the condenser represents a form of heat exchanger in which a saturated vapor on one side of the exchange medium transfers latent energy to a sub-cooled fluid on the other side of the exchange medium in order to transition state from vapor to liquid. Additionally, an evaporator is a form of heat exchanger in which a saturated liquid on one side of the exchange medium receives latent energy from a heated fluid on the other side of the exchange medium in order to transition state from a liquid to vapor.

According to one or more embodiments, a solution is presented that couples fluids of dissimilar saturation temperatures such that the condensing process of cooling fluid A (e.g., condensation liquid/vapor flowing from first heat exchanger 860) induces vaporization of working fluid B (e.g., condensation liquid/vapor flowing from second heat exchanger 1140), where working fluid B has a lower saturation temperature than cooling fluid A. This aspect of the disclosure effectively provides "condensation by vaporization" and/or "vaporization by condensation". In performing this form of dual-sided heat exchange, both sides of the heat exchanger will gain performance from a two-phase heat transfer coefficient, as illustrated by the below equation:

Single-phase heat transfer: $Q = \dot{m} * Cp * dT$

Two-Phase heat transfer: $Q = \dot{m} * (Cp * dT + Hlv)$

Additionally, the process requires lower mass flow rate to transport the same quantity of heat. As an additional enhancement to this process, one aspect of the disclosure also provides "Thermodynamic Stepping", which is a cooling loop using a plurality of fluids with dissimilar saturation temperatures to create multi-phase cooling from heat dissipating component to a final exterior heat sink. According to one or more embodiments, a heat transport loop is provided that employs a plurality of the "combined evaporator and condenser" heat exchangers. Within the loop, fluids of dissimilar saturation temperatures can be nested to create cascading phase change heat transfer. The difference in saturation temperature can be a result of dissimilar fluid composition or pressure modulation. The features presented are thus able to accommodate the cooling or heating needs of very complex environments. For example, these aspects of the disclosure are applicable to complex industrial fabrication facilities that require differentiated cooling of different species. Within this environment, the thermodynamic stepping can be applied to minimize the number of cooling loops within their control systems and increase operational efficiency.

The above described illustrations of FIGS. 10 and 11 provide one example of the application of this cascading cooling loop in an advanced data center that utilizes immersion-based cooling of IT servers. Heat generated at the electronic component level initiates boiling of a saturated cooling liquid. The vapor from that boiling process can then be condensed as the vapor passes across the coils of heat exchanger. The condensation heat transfer would cause the facility coolant to boil and pass into a vapor state. The mixed-phase facility coolant could then be routed to an exterior cooling tower that deploys ground-water on the surface of the heat exchanger to provide evaporative cooling on the surface of the cooling tower. This vaporization would then reject the heat sufficiently enough to condense the facility mixed-phase coolant.

Generally, the above illustrations provide a system for heat exchange that includes: a first condenser that places a first working fluid vapor in proximity to a second working fluid liquid, where the two working fluids have respective saturation temperatures that causes the liquid form of the second working fluid to absorb sufficient amounts of heat from the first working fluid vapor to vaporize, while the first working fluid vapor condenses back into a liquid form. The second working fluid vapor exits the first condenser via a first conduit and enters a first heat exchanger which places the second working fluid vapor in proximity to a third working fluid liquid. The relative saturation temperatures of the second and third working fluids is such that the proximity of the second working fluid vapor with the third working fluid liquid causes the transfer of sufficient amounts of heat from the second working fluid vapor to cause the second working fluid vapor to condense back into its liquid form while at least a portion of the third working fluid liquid evaporates into third working fluid vapor. The sequence of vaporization-condensation across paired working fluids can continue until a desired cooling is achieved via the final working fluid.

According to a more expansive description, the system for heat exchange includes: a first condenser having a first conduit with a surface at which a first working fluid vapor impacts and through which flows a second working fluid in liquid form. A proximity of the two working fluids enables the liquid form of the second working fluid to absorb sufficient amounts of heat from the first working fluid vapor to cause the first working fluid vapor to condense back into a liquid while at least a portion of the liquid form of the second working fluid evaporates and generates second working fluid vapor that exits the first condenser via the first conduit. The system further includes at least one heat exchanger connected to the first conduit by which the second working fluid vapor is received and which has a second conduit through which flows a third working fluid in liquid form. A proximity of the second working fluid vapor and the third working fluids enables the liquid form of the third working fluid to absorb sufficient amounts of heat from the second working fluid vapor to cause the second working fluid vapor to condense back into its liquid form while at least a portion of the liquid form of the third working fluid evaporates and generates a third working fluid vapor.

According to one embodiment, a respective thermodynamic property of the first, second and third working fluids provides a saturation temperature that causes paired coupling of one or more of (a) the first working fluid vapor with a liquid form of the second working fluids, the first working fluid vapor with a liquid form of the third working fluids, and the second working fluid vapor with a liquid form of the third working fluids to result in condensation of the specific working fluid vapor and vaporization of at least a portion of the liquid form of the working fluid paired with the specific working fluid vapor within the corresponding heat exchanger. Further, the flow of the second working fluid within the condenser causes the first working fluid vapor to reject heat which causes the first working fluid vapor to condense and the heat that is rejected by the first working fluid vapor is at least partially absorbed by the second working fluid causing the liquid form of the second working fluid to vaporize at least partially.

In one or more of the illustrative embodiments, the first condenser is located within an immersion cooling tank and the first working fluid is an immersion cooling liquid that evaporates within the tank to generate immersion cooling vapor that rejects heat to the condensation liquid flowing through the first condenser and returns to a lower volume of the tank as liquid condensate.

G. Scalable, Multi-Tank Distribution System for Liquid Level Control of Immersion Cooling Tanks Liquid cooling technologies (such as contact plate, immersion, spray, etc.) for server heat dissipation in computer rooms and datacenters are subject to liquid coolant volume expansion and contraction as a consequence of temperature fluctuation, air infiltration, vaporization, maintenance or servicing operations, and ambient pressure changes. Any combination of these variables or causes can significantly impact the performance of liquid cooled IT equipment up to and including catastrophic failure without service intervention. With existing liquid cooling technology, the problem of fluid mass/volume fluctuation within rack liquid cooling solutions are accounted for using one of two methods: use of a sealed system with an expiration date; and use of service/maintenance personnel manually adding liquid to maintain control levels. With the first method, the amount of fluid volume is sized to accommodate a fixed period (e.g., 3-5 years) of container permutation, and then the container is either replaced or refilled at the end of that period.

According to the one aspect of the disclosure, maintenance of the ideal amount of liquid within the tanks is handled on a multi-tank basis to provide across-the-board support for multiple tanks within a tank-based system or server farm so no one tank requires longer periodicity of maintenance than the others. One aspect of the disclosure involves the understanding that the tanks, while calibrated to operate as efficiently as possible, will not always provide the exact same operating responses or conditions. One reasons for this is that the servers do not all run the same way and generate the same amount of heat, etc. Other reasons include the actual tanks themselves, the condenser unit, the seal, etc. Thus, the disclosure allows for a system level control for maintaining liquid levels across multiple tanks by providing a Multi-Rack Distribution System For It Rack Liquid Level Control that is used for automatic control of liquid coolant volumes in one or more IT racks that incorporate liquid cooling at the server-level. The disclosure involves coupling one or more liquid filled IT racks to a remote expansion/contraction reservoir that can autonomously regulate liquid levels within the rack. According to one embodiment, this fluid level control system can be a passive system that seeks to maintain liquid levels through gravitational equilibrium with a coplanar reservoir and a gravitationally low expansion tank. However, in alternate embodiments, the liquid level is maintained via an active control cycle, having electronic feedback mechanisms within each tank that are electronically linked to a main controller which can open and close valves as required to regulate fluid levels. A hybrid scheme involving some active control loop with a passive gravitational control can also be implemented. According to one or more embodiments, valves may be used to control inlet/outlet fluid flow between rack and expansion/contraction reservoirs. Active and/or passive means can be utilized to recycle expansion fluid back into a contraction regulation reservoir.

Accordingly, the scalable system can be sized for one or more racks to simultaneously modulate liquid coolant volumes that fluctuate due to dynamic expansion and contraction and evaporative mass loss. Aspects of this disclosure can specifically target the coolant within the rack, and not the datacenter facility coolant loop or mechanical service.

FIG. 12 generally introduces the concept of a cooling liquid reservoir that is coupled to the cooling liquid volume within the immersion cooling tank. This reservoir 1230 provides cooling liquid to the immersion tank as the amount of cooling liquid within the immersion cooling tank falls below a threshold level. The amount of cooling liquid in the tank can change based on vaporization of the cooling liquid and/or loss of cooling liquid and/or cooling liquid vapor through the walls or seams of the tank. Also, with the use of upper condensers and a tank cover, cooling liquid vapor also escapes through the top opening of the tank whenever the tank cover is removed and/or one or more condenser sub-units (860A-H) are opened.

Figure 13:
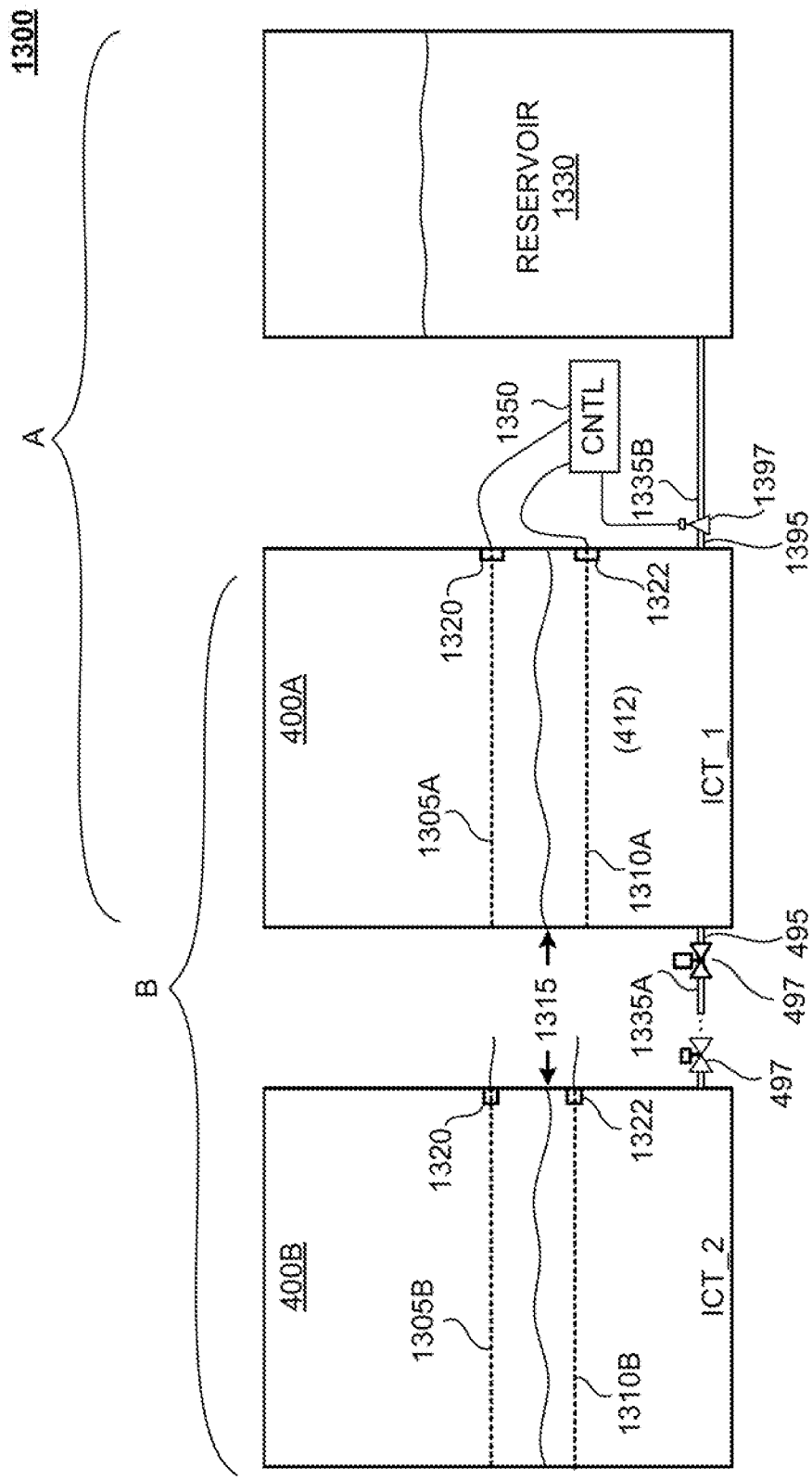
FIG. 13 illustrates examples of methods for gravitationally controlling a level of cooling liquid in a first immersion cooling tank utilizing a pipe connection to a secondary volume of cooling liquid, in accordance with one or more embodiments.

According to one aspect of the disclosure, a cooling fluid level of one or more of the immersion cooling tanks can be maintained via a self-leveling configuration of multiple tanks and/or a tank and a cooling fluid reservoir. This aspect of the disclosure provides a fluid level control system for maintaining a level of cooling fluid within at least one immersion cooling tank. FIGS. 12 and 13 illustrate two different embodiments of a system configured to use a cooling fluid reservoir. In the embodiment of FIG. 12, immersion cooling tank 1200 includes a separate condensation channel 1210 extending from the upper volume of the tank 1200. Condensation channel 1210 includes upper condensers 1260, which condense vapor received within the channel to generate cooling liquid condensate 1262. As the cooling liquid boils in the lower volume of immersion cooling tank 1200, the rising vapor 422 flows upwards and into this condensation channel 1210, where the vapor condenses. It is appreciated that the use of different condensation techniques, such as wrapping condensation pipes around the channel to trigger or cause the condensation of the rising vapor, can be implemented in lieu of providing condensers within the interior volume of the condensation channel 1210.

As further shown by FIG. 12, the cooling liquid condensate 1262 can be returned to the tank volume via one or three alternate paths, with each path being a design choice. Path A is a direct return path to the cooling fluid volume within immersion cooling tank 1200, which utilizes gravity, whereby the condensate 1262 runs back into the cooling liquid volume. Path B also involves the use of gravity but can optionally involve the use of a pump 1240 to move the collected condensate 1262 through the intake valve 1297 of the immersion cooling tank 1200 back into the volume of cooling liquid. Of specific interest to the present disclosure is path C, which involves use of reservoir 1230. Path C includes first piping, C1, which provides the cooling liquid condensate 1262 to the reservoir 1230, and second piping, C2, which provides additional supply of cooling liquid 1212 to immersion cooling tank 1200 via a pipe system that can include intake valve 1297. Second piping can also involve a pump 1240 in one embodiment. However, the embodiments described herein rely on gravitational forces to cause the flow of fluid from one liquid volume to the next.

With specific reference now to FIG. 13, and utilizing the example immersion cooling tank 400/500 introduced by FIGS. 4 and 5, the cooling liquid level control system 1300 includes at least a first immersion cooling tank (ICT_1) 400A configured to hold a first volume of immersion cooling liquid (412) that can be utilized to cool one or more servers (not shown) that are submerged in the cooling liquid 412 within the first immersion cooling tank 400A. The first immersion cooling tank 400A includes at least one external pipe connector 495/1395 utilized to enable a flow of cooling liquid 412 into and out of the first immersion cooling tank 400A. The system 1300 also includes at least one secondary volume of cooling liquid (i.e., tank 400A and/or reservoir 1330) that is physically connected to the first immersion cooling tank 400A via a pipe distribution system 1335. The pipe distribution system 1335 provides a connection between the external pipe connector 1395 of the first immersion cooling tank 400A and the secondary volume of cooling liquid (400B and/or 1330).

In one embodiment, illustrated by the pairing of tanks labeled A, the second volume is a cooling liquid reservoir 1330, which contains reserve amounts of cooling liquid for use by one or more immersion cooling tanks (400). In another embodiment, illustrated by the pairing of tanks labeled B, the second volume is a second immersion cooling tank 400B. In yet another embodiment, the pipe distribution system connects both a cooling liquid reservoir 1330 and a second immersion cooling tank (ICT_2) 400B to the first immersion cooling tank 400A and to each other. Finally, in another embodiment, as partly illustrated by FIG. 13, the pipe distribution system 1335 is connected to a plurality of second immersion cooling tanks in a tandem or daisy chain configuration.

In a first implementation, the second volume of cooling liquid is located co-planar to the first immersion cooling tank, on a same horizontal plane, which results in a measured flow of cooling liquid between the first immersion cooling tank 400A and the second volume to maintain both volumes at a liquid equilibrium level. This measured flow occurs in response to the first volume of cooling liquid 412 increasing or decreasing its liquid level within the first immersion cooling tank 400A. First immersion cooling tank 400A includes a high liquid level threshold 1305A and a low liquid level threshold 1310A, which can be monitored by respective, internal liquid level sensors 1320A and 1322A, in one embodiment. Similarly, second immersion cooling tank 400B includes a high liquid level threshold 1305B and a low liquid level threshold 1310B, which can be monitored by respective, internal liquid level sensors 1320B and 1322B, in one embodiment. In a second implementation, the second volume of cooling liquid provides the measured, single direction flow of new cooling liquid into the first immersion cooling tank in response to the first volume of immersion cooling liquid falling below a low liquid threshold (at liquid sensor 1322) of cooling liquid in the first immersion cooling tank 400A.

In one embodiment, the system provides that cooling liquid from the second volume automatically flows through the pipe system into the first immersion cooling tank in response to a reduction in the first volume of cooling liquid. The reduction in the first volume can be a result of loss of one or more of cooling liquid and cooling liquid vapor from the first immersion cooling tank by one or more of a physical leak in the first immersion tank, a pressure induced vapor leak through a seam of the first immersion tank, and a leak of cooling liquid vapor during opening of a tank cover or a condenser sub-unit of the immersion cooling tank.

One embodiment provides that the fluid level control system includes: liquid level sensors 1320/1322 within the immersion cooling tank, which detect changes in the liquid level not attributable to vaporization of the cooling liquid; a valve assembly 497/1397 connected within the external pipe connector 1395; and a controller 1350. In response to a detected change reducing the liquid level of the first volume to below a pre-set level within the first immersion cooling tank, the controller 1350 autonomously triggers an opening of the valve assembly 497/1397 to allow new cooling liquid to flow into the first immersion cooling tank 400A.

In one embodiment, the valve assembly 497/1397 is selectively controllable to allow a flow of cooling liquid into the first immersion cooling tank and allow the flow of cooling liquid out of the first immersion cooling tank. With this embodiment, when two or more immersion cooling tanks are connected together via the pipe distribution system 1335, the controller 1350, triggers the valve assembly 497/1397 to open to allow immersion cooling liquid to flow out of the first volume towards the second volume, in response to a second volume of cooling liquid of the second immersion cooling tank 400B falling below the low liquid threshold for the second immersion cooling tank 400B. In at least one implementation, the valve mechanism opens the valve based on a gravitational imbalance occurring between the pressure exerted by the volume of immersion liquid within the first immersion tank versus the pressure exerted by the second volume of immersion liquid outside the valve.

With the embodiments that provide a cooling liquid reservoir 1330, the cooling liquid reservoir 1330 can be located at a higher vertical plane than the first immersion cooling tank 400A. When placed on a vertically higher plane, the cooling liquid reservoir 1330 provides the new immersion cooling liquid to the first immersion cooling tank (400A) via gravitational flow, in response to a current volume level of the cooling liquid within the first immersion cooling tank 400A falling below a refill threshold level (e.g., threshold level 1322). Accordingly, the supply of new immersion cooling liquid enables the first immersion cooling tank 400A to maintain a working volume of immersion cooling liquid 412 within a range of acceptable levels for effective operation as a liquid coolant for the one or more servers operating within the first immersion cooling tank 400A.

According to one embodiment, the interconnection of the second volume with the first immersion cooling tank 400A also enables gravitational flow of cooling liquid between the first immersion cooling tank 400A and the second volume, in response to a change in relative volumes due to loss of fluid within one of the first immersion tank 400A and the second volume. The gravitation flow of the cooling liquid passively increases and decreases the level of immersion cooling liquid 412 within each of the first immersion cooling tank 400A and the second volume, based on which volume of cooling liquid has decreased, in order to maintain an equilibrium level between the two liquid volumes.

According to one embodiment, in response to the overall volume of cooling liquid within the plurality of immersion tanks falling below a system threshold volume, the controller 1350 generates a signal to open an output valve of the cooling liquid reservoir 1330. As one additional aspect, one or more embodiments provide that the cooling liquid reservoir 1330 includes a pump 1340 connected to the pipe distribution system 1335 and an electronic controller 1350. In response to receiving a signal indicating that a current volume of cooling liquid within the plurality of immersion cooling tanks is below the system threshold volume, the controller 1350 activates the pump (not shown) to begin pumping an amount of new cooling liquid from the reservoir 1330 through the pipe distribution system 1335 to increase the system volume of cooling liquid within the plurality of immersion cooling tanks 400 to above the system threshold volume. Accordingly, the use of the feedback controller enables each of the interconnected immersion tanks to maintain a volume above the low liquid level threshold and the collective volume of the plurality of immersion tanks to remain above the system threshold volume.

In the embodiments in which each immersion cooling tank comprises a valve mechanism that controls the inflow and outflow of immersion cooling liquid into the respective immersion tank, the detection of the volume of immersion fluid within any one immersion tank falling below the pre-set low liquid threshold causes the controller 1350 to open the valve 497 of at least one other immersion tank to allow a portion of the immersion liquid within that at least one other immersion tank to flow out towards the one immersion tank whose volume of cooling liquid is below the pre-set threshold.

In one embodiment, the low cooling liquid threshold is an amount of immersion cooling liquid that enables effective cooling of the electronic component immersed or submerged in the cooling liquid, and the threshold value takes into consideration that a portion of the immersion cooling liquid will be evaporated within the immersion cooling tank and that an amount of the cooling liquid will be in a vapor state during operation of the system.

Figure 14:
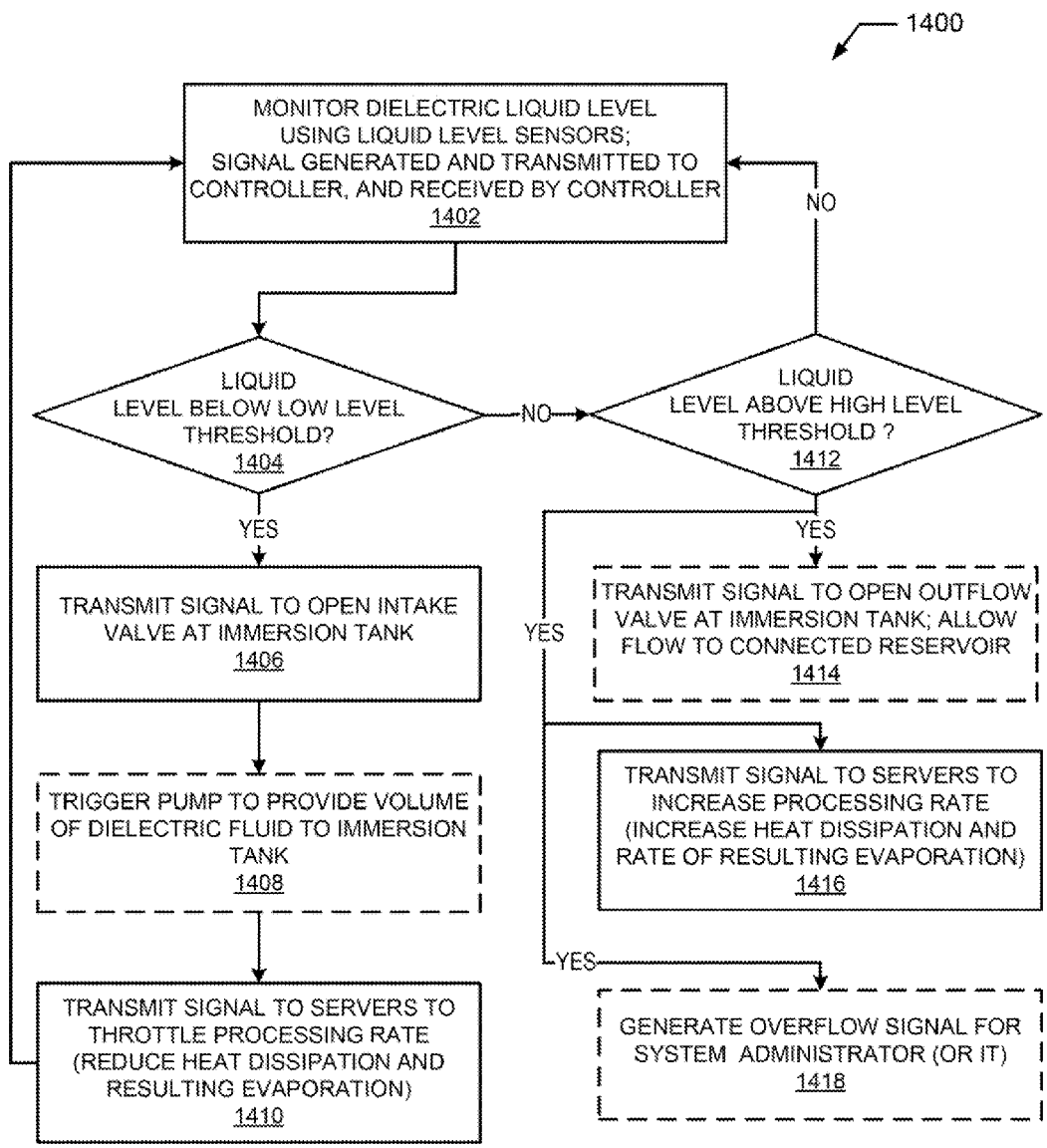
FIG. 14 is a flow chart illustrating a method of controlling the dielectric liquid level within an immersion cooling tank, in accordance with one or more embodiments.

FIG. 14 is a flow chart illustrating one embodiment of a method for providing cooling liquid level control within an immersion cooling tank. Method 1400 begins at block 1402 at which liquid level sensors 1320/1322 monitors the liquid level of the dielectric cooling liquid within the immersion cooling tank 400A and generates a signal that is transmitted to and received by the controller 1350. At decision block 1404, method 1400 includes a determination whether the liquid level is below a low level threshold. In response to the liquid level being below the low level threshold, method 1400 includes the controller 1350 transmitting a signal to trigger opening of the intake valve (497/1397) of the immersion cooling tank 400A (block 1406). In one embodiment, the signal stops being transmitted once the low level signal is no longer being received by the controller 1350. One optional embodiment is illustrated by block 1408 in which a pump is provided within the liquid level control mechanism. With this embodiment, the controller 1350 can also trigger the pump (not shown) to provide a specific volume of new dielectric liquid to the immersion cooling tank 460. Then, at block 1410, method includes controller 1350 transmitting a signal to the servers or other devices operating within the immersion cooling tank 460 to throttle the rate of processing in order to reduce the amount of heat dissipation and consequently reduce the amount of vaporization of liquid and generation of vapor within the immersion cooling tank 460.

Returning to decision block 1404, in response to the liquid level not being below the low level threshold, method 1400 further includes a determination at decision block 1412 of whether the liquid level is above a high level threshold. This second determination is important when HDDs are being vapor cooled above the surface of the cooling liquid, and allows the HDDs to be kept from being immersed due to a rising liquid level. In response to the liquid level being above the high liquid level threshold, method 1400 provides one or more of three possible responses. In a first response provided within block 1414, method 1400 includes controller 1350 transmitting a first signal to open the outflow valve 1397 of the immersion cooling tank to allow a flow of excess immersion cooling liquid towards the connected reservoir 1330. In a second response provided within block 1416, method 1400 includes controller 1350 transmitting a second signal to the servers to increase the processing rates in order to increase the amount of heat dissipation within the cooling liquid and the resulting vaporization of the cooling liquid into rising vapor. In a third response provided within block 1418, method 1400 includes controller 1350 generating and transmitting an overflow signal to the connected device of a system administrator or IT personnel. The dashed lines around blocks 1408, 1414 and 1418 indicate that the contained content is optional and/or alternative in nature.

Figure 15:
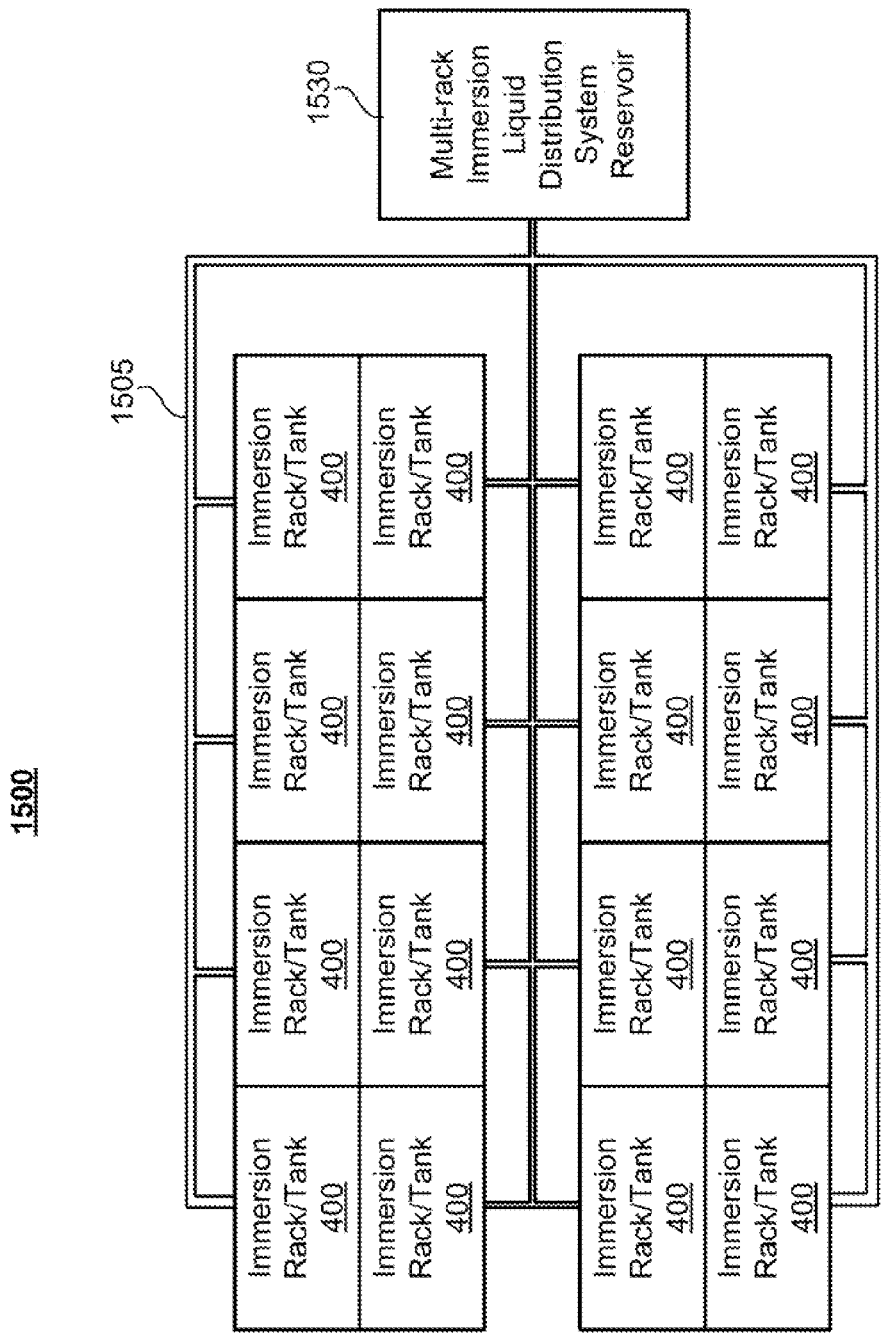
FIG. 15 is a block diagram illustrating an aerial view of example daisy chaining of multiple immersion cooling tanks to maintain cooling fluid equilibrium across the multiple tanks within a data center, in accordance with one or more embodiments.

FIG. 15 shows an aerial view of an immersion cooling tank data center 1500. As illustrated by FIG. 15, according to at least one embodiment, the multi-rack immersion liquid distribution system 1500 includes a plurality of immersion cooling tanks 400 that are daisy chained to each other by an interconnection of the pipe distribution system 1505 to respective external pipe connectors (extending from each tank 400). Each immersion tank 400 can be similarly dimensioned (i.e., hold a similar volume of cooling liquid in a similarly shaped and sized tank enclosure) and located coplanar to (i.e., on a same horizontal level as) the other immersion tanks. Then, in response to the volume of immersion fluid in any one immersion tank falling below one of an equilibrium point and a pre-set low liquid threshold, a gravitational imbalance occurs and causes cooling liquid to flow from at least one other immersion tank through the pipe distribution system 1505 towards the one immersion tank whose volume of cooling liquid is not at the point of equilibrium or has falling below the pre-set low liquid threshold. With FIG. 15, similar to FIGS. 10 and 12, the cooling liquid distribution system 1500 can include a multi-rack immersion liquid distribution system reservoir 1530.

Accordingly, the above described embodiments provide a daisy chaining (for immersion fluid sharing) of multiple immersion cooling tanks 400 together (and potentially to a reservoir 1530) to allow the immersion fluid levels within the various tanks 400 to remain relatively equal. This prevents one tank 400 from having to be pulled offline due to the immersion fluid in that one tank falling below acceptable operating levels, while the other neighboring tanks 400 have more than sufficient amounts of fluid to continue operating.

H. Techniques for Controlling Vapor Pressure within an Immersion Cooling Tank

Another aspect of the disclosure involves providing a plurality of techniques for controlling and/or mitigating the buildup of pressure within the immersion tank in order to maintain the integrity of the tank (from high pressure vapor leakage, etc.) and provide other benefits. Generally, a first aspect of the concept involves use of an expansion lid with a bellows placed within or proximate to the tank cover to allow the overall system to be able to respond to fluctuations in pressure and particularly pressure build up by altering the internal volume of the immersion cooling tank. With the use of the bellows expansion lid, an increase in the volume of rising vapor pushes upwards against the bellows, and the bellows then moves upwards and increases the volume of the tank. Then, as the volume of the tank increases, the vapor pressure within the tank decreases). A second aspect of the concept involves providing a feedback control mechanism that increases the flow of the condenser fluid and/or reduces the temperature of the condenser fluid based on a detected buildup of pressure in the tank. A third aspect of the concept involves throttling the rate and/or amount of processing occurring within the tank.

As an introduction to these aspects of the disclosure, the above described two-phase immersion cooling system will vary in the amount of heat dissipation throughout operation of the various electronic components, such as servers 200/300, causing increases and decreases in the amount of vapor mass present in the immersion cooling tank 400. The changes in the mass of vapor within the tank 400 can create pressure fluctuations inside the tank enclosure. Given the headspace above the condenser line, the compression ratio of this vapor mass can easily be 2-3 times standard operating pressure. Such an increase in pressure will induce stress on the tank (effectively creating a pressure vessel), promote vapor diffusion through weaker seal points, and change the saturation temperature of the working fluid(s).

Also, an additional aspect of the disclosure addresses the engineering challenge of preventing the cooling fluid from escaping the immersion cooling tank when using a dielectric, such as 3M Novec fluid. The 3M Novec fluid is expensive, and excessive fluid loss thus negatively impacts the overall cost of the immersion-based cooling solution. According to one embodiment, the immersion cooling tank must maintain a robust seal to prevent fluid vapor from escaping the tank. As demand on the processing components increases and decreases resulting in the proportionate increase and decrease in heat dissipation, the amount of vapor versus liquid in the tank fluctuates. This fluctuation creates a change in internal tank pressure.

Existing tank based systems that involve pressure buildup typically resolve such buildup by introducing (1) a bellows system integrated into the tank, where the bellow's membrane inflates/expands during vapor pressure buildup to increase the overall system volume and thus mitigate the pressure increase, and (2) one or more pressure relief valves, which allows for only a slight build-up of pressure (typically less than 1 psi) and then vents excess pressure (vapor) into the surrounding room. This second alternative results in excessive amounts of fluid loss at great capital cost. The present disclosure recognizes that maintaining a substantially neutral pressure within the tank will reduce the fluid loss that results from vapor escaping weak areas within the tank seal. Also, the disclosure addresses the build-up of pressure without use of a pressure relief valve or increasing the volume of the cooling tank.

Figure 16:
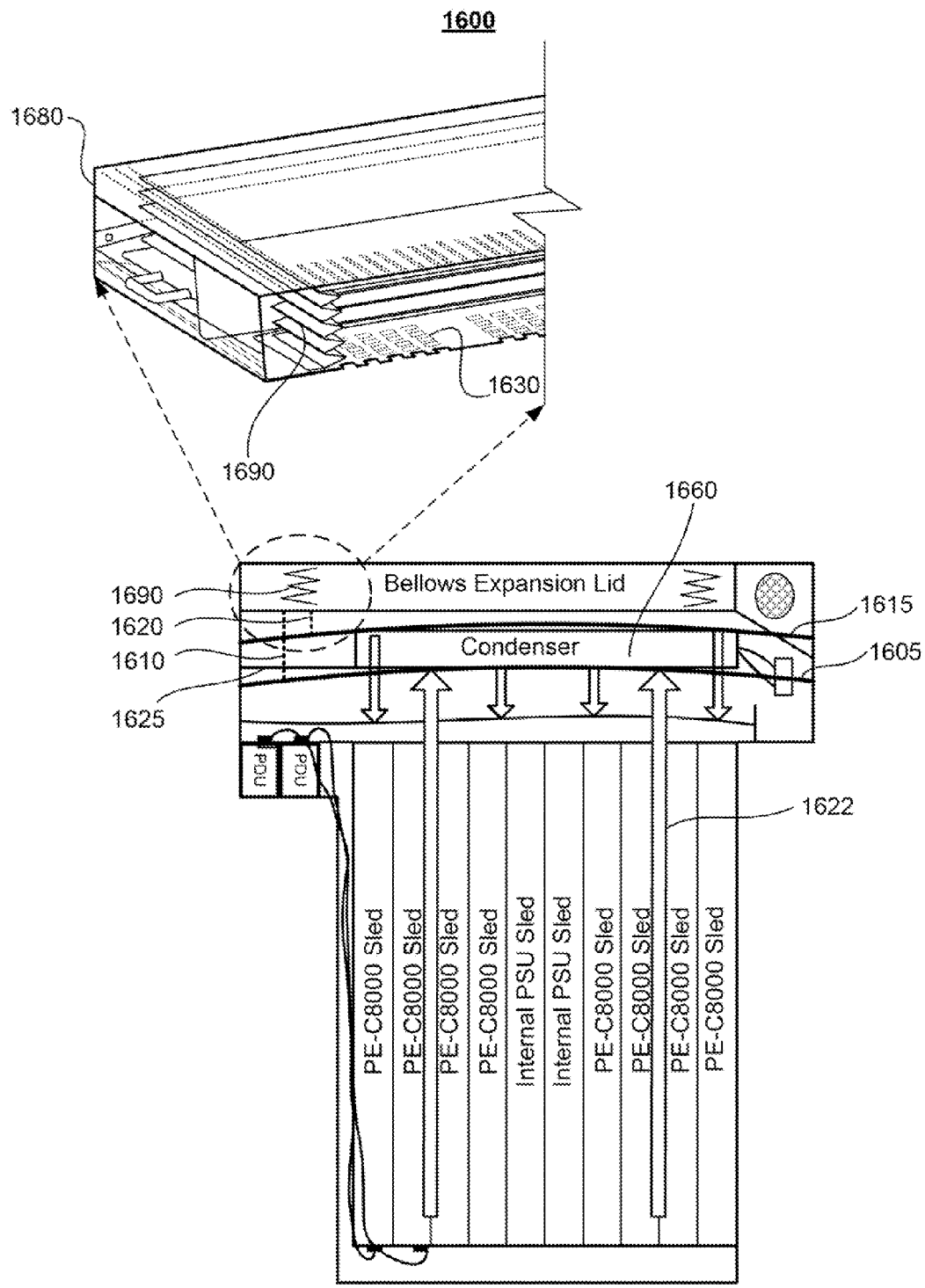
FIG. 16 illustrates an example vapor pressure control sub-system involving deployment of a bellows expansion lid within a tank cover of an immersion cooling tank having multiple adjacent bellows within the tank cover, according to one or more embodiments.

According to one aspect of the disclosure, a bellows system is installed in the tank at a specific location that allows for an "increase" in the available volume of the tank as the vapor pressure increases, in order to maintain a neutral pressure. The disclosure provides the optimal location of the bellows system to allow optimal functionality and protect the bellows system from external damage. FIGS. 4, 5, and 8 each illustrate the location of a bellows expansion lid 490/890 within the inside area of the tank cover 480. This first aspect of the solution involves providing a large enough bellows in a location within the upper volume of the immersion cooling tank 400 that is protected from damage during everyday operation. FIG. 16 illustrates an example deployment of a bellows 1690 within a tank cover (interchangeably referred to as expansion lid 1680) of an immersion cooling tank 1600, according to one or more embodiments. As shown by the inset drawing above the tank 1600, the bellows 1690 is enclosed within the upper lid or cover 1680 of the immersion cooling tank 1600 above a perforated base section off the upper lid 1680 containing a plurality of holes 1630. According to one embodiment, by enclosing the bellows 1690 within the tank cover 1680, the surface area of the bellows 1690 can match the surface area of the tank volume, which provides a sufficiently large volume to manage the fluctuating vapor layer of rising vapor 1622 (illustrated as upper directional arrows).

The holes 1630 allow the rising vapor 422 to enter the bottom of the expansion lid 1680 and compress the bellows 1690. The amount of compression is directly proportional to the amount of rising vapor within the upper tank volume and specifically the overflow amount of vapor that pushes upwards against the bellows 1690. As further shown by the figure, the amount of vapor 422 within the upper tank volume can range from between a lower vapor line 1605 to an upper vapor line 1615 above the cooling liquid surface level 1625. Each of these lines then correlates to a corresponding amount of deflection upwards by the bellows 1690. As shown, lower vapor line 1605 correlates to first deflection position 1610 of bellows 1690, while upper vapor line 1615 correlates to second deflection position 1620 of bellows 1690. As indicated by the inset drawing, providing a side view of the lid assembly, the amount of rising vapor 1622 within the upper volume causes a corresponding compression or depression of the bellows 1690, which is designed specifically to allow for this level of response to the buildup of vapor pressure within the tank volume. As further shown by the inset, and more clearly illustrated by FIGS. 17A-B, described below, the tank cover 1680 includes a porous base above which the bellows 1690 is located. A total height of the tank cover 1680 is experimentally or analytically determined to allow for sufficient volume within the tank cover 1680 for the bellows 1690 to expand fully in low vapor pressure situations (e.g., when the tank is not being utilized) and then be compressed fully (at highest supported vapor pressure).

Thus, in at least the illustrated embodiment, the pressure control system comprises: a bellows expansion lid (1680/1690) positioned above the condensers 1660 within the immersion cooling tank 400/800 and which includes a bellows 1690 that, in response to an increase in pressure of the rising vapor above a threshold normal pressure, moves upwards (i.e., is compressed) into the lid 1680 of the immersion cooling tank 400/800 towards an upper position (1620) substantially eliminate the increase in pressure. The bellows 1690 within the expansion lid 1680 also moves downwards towards a base position (1610) in response to the amount of pressure within the tank 400 being reduced to below a low threshold pressure level. The increase and decrease in the bellows position is a gradual movement between these two positions (1610 and 1620), which directly correlates to the amount of vapor that is presently collected within the upper volume of the immersion cooling tank 400/800.

Figure 17A:
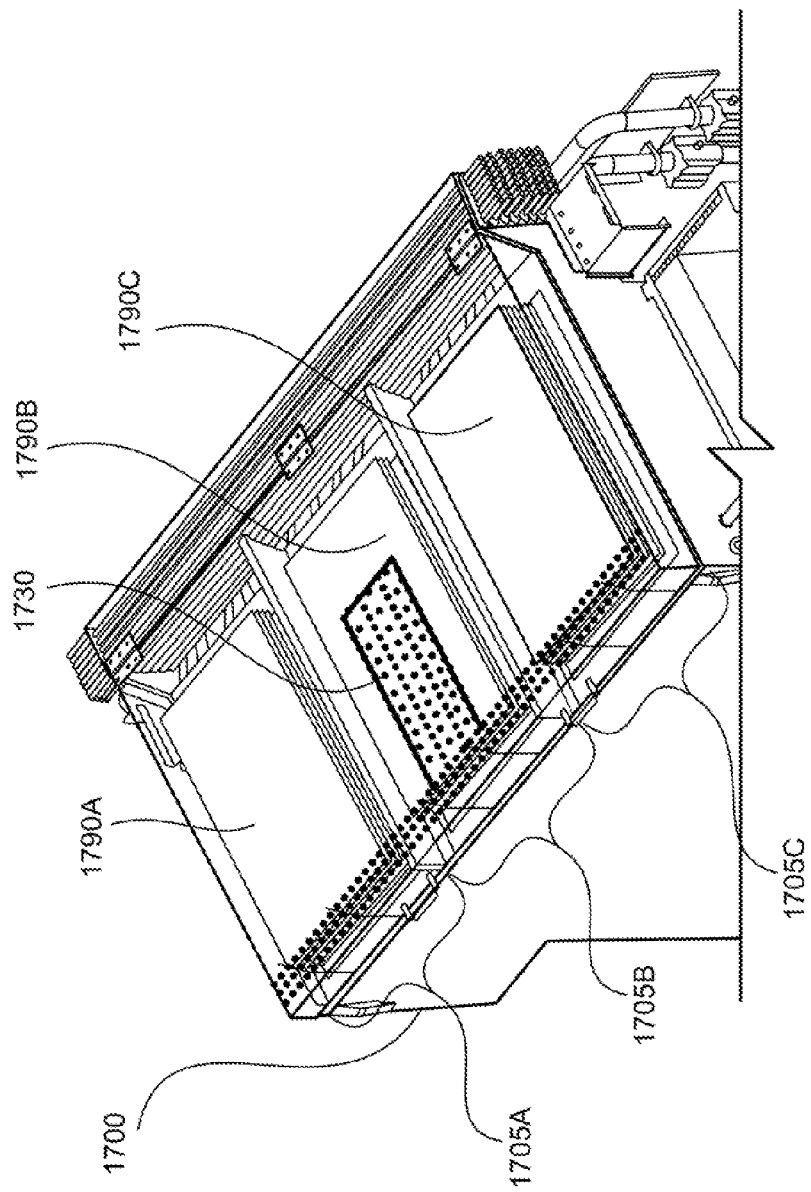
FIGS. 17A-17B provides two additional views of an example vapor pressure control sub-system including multiple adjacent bellows within the tank cover of a single immersion cooling tank, in accordance with one embodiment.
Figure 17B:
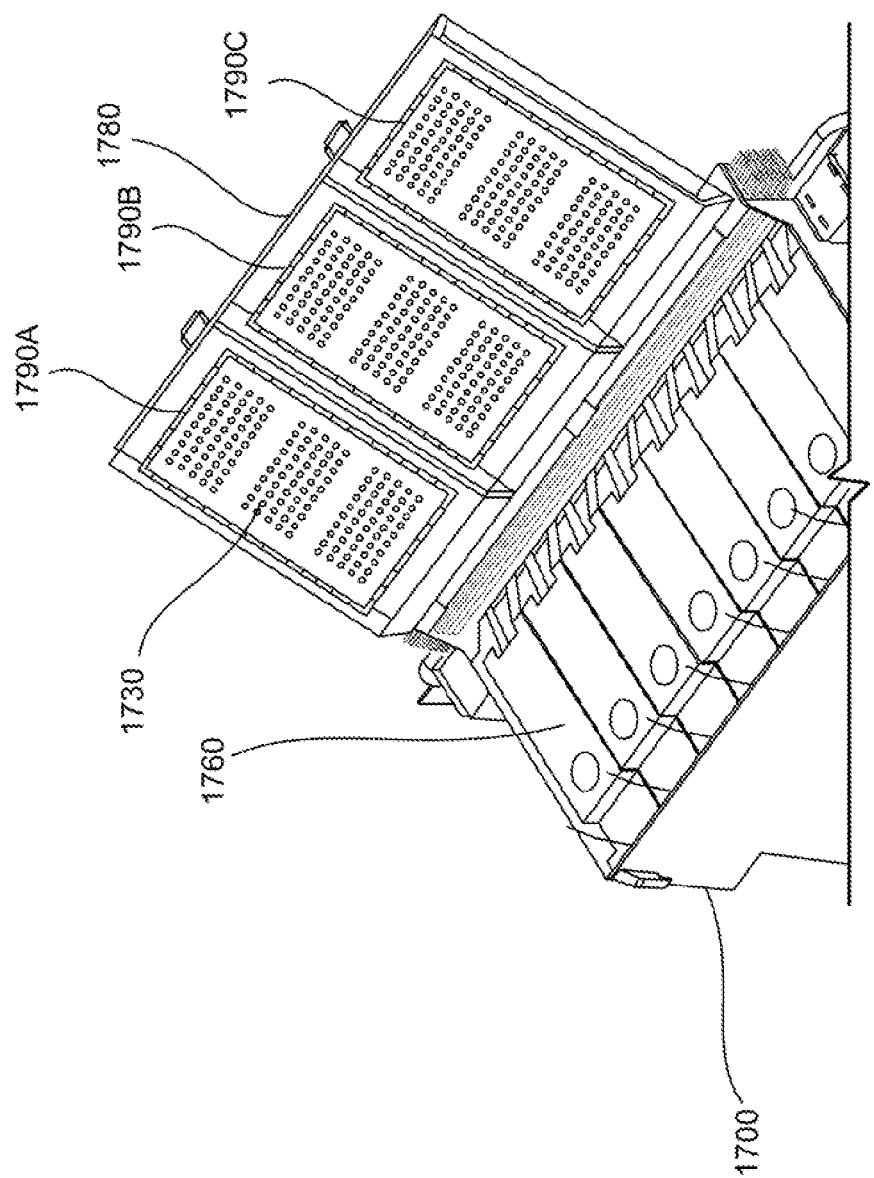

The surface area of the bellows expansion lid 1680 can be substantially proximate to the surface area of the inner tank perimeter in one embodiment. In alternate embodiments, the surface area can be much smaller than the inner tank perimeter. It is appreciated that the actual shape and size of the bellows does not have to be similar to that of the inside of the tank cover, and much smaller bellows can be utilized effectively to mitigate pressure buildup. For example, FIGS. 17A-17B illustrate two different views of an implementation of a bellows system that provides multiple adjacent bellows within the tank cover, in accordance with one or more embodiments. In FIG. 17A, tank 1700 is illustrated with the top cover of the lid 1780 removed to expose three adjacent bellows 1790A-C. The perforated lower lid surface with a plurality of holes 1730 are indicated in the presentation of the middle bellows 1790B. This split-bellows configuration represents an example vapor pressure control sub-system within an immersion cooling tank 1600. The partitioning of the bellows 1790 is one possible implementation among many alternate options, and the presentation of three side-by-side bellows 1790 is solely for illustrative purposes of the particular embodiment.

FIG. 17B presents a bottom view of the configuration of the tank cover 1780 to accommodate the three adjacent bellows 1790A-C. As shown, the lower surface of the tank cover 1780 is divided into three adjacent segments/sections 1705A-C.

Each segment 1705 includes a perforated bottom panel with a plurality of holes 1730 to allow the vapor to pass through the surface and contact the lower surface of the bellows 1790A-C located directly above the holes 1730. Below the expansion lid 1780 is shown the condenser sub-units 1760, similar to the configuration of immersion cooling tank 800 (FIG. 8).

According to one aspect, by containing the bellows 1690/1790 within the tank cover (expansion lid 1680/1780), the bellows 1690/1790 is protected from damage that could occur during assembly, shipping, and normal day to day operation. It is important to note that this placement of the bellows 1690/1790 internal to the tank and specifically within the tank cover space/volume does not impact the overall footprint of the tank or impact the density of the resulting data center.

The second and third aspects of the pressure control solution are illustrated in part by FIG. 18. This implementation of the second and/or third aspects can be in addition to the above described use of bellows and/or a separate implementation altogether. FIG. 18 provides example detection and control mechanisms and/or devices of an overall control system provided for one embodiment of immersion cooling tank 1600 (FIG. 16). The schematic of FIG. 18 illustrates a rack assembly of example first servers 200, which are inserted in a side-by-side configuration within the rack (not specifically shown), and two internal power supply units (PSUs) 1805, which can be the secondary components 830 referenced within the descriptions of FIG. 8, for example. PSUs 1805 can provide connectivity for providing a supply of power to the other components within immersion cooling tank 1600. Generally, these mechanisms and devices of the control system can include, but are not limited to, operating condition detectors, including failure condition detectors, condenser fluid flow control valves, other control devices, and the bellows expansion lid 1680. The mechanisms and/or devices collectively control various conditions that may exist or occur internal to the immersion cooling tank 1600 (FIG. 16) during operation of the immersion cooling tank 1600 as a cooling system for submerged servers 200 and/or HDDs (not specifically shown) located above the liquid level 1825. Specifically, The illustrated feedback and/or control mechanisms associated with controlling pressure within the immersion cooling tank 1600 include first differential pressure transducer 1810, non-condensable purge valve 1830, thermostatic control valve 1835, second differential pressure transducer 1840 for condenser flow, and condenser inflow control valve 1845. Additionally, at least second differential pressure transducer 1840 and condenser inflow control valve 1845 are communicatively coupled to controller 1850. In at least one embodiment, controller 1850 can be a separate processing device. However, in an alternate embodiment, controller 1850 generally represents a processor of one of the servers 200 executing code of one or more feedback control modules 170 (FIG. 1) to provide control logic.

According to one aspect of the disclosure, a plurality of techniques for controlling and/or mitigating the buildup of pressure within the immersion cooling tank is provided in order to maintain the integrity of the tank from high pressure vapor leakage and other pressure-induced problems. Referring specifically to FIG. 18, one embodiment provides a pressure control system within the two-phase heat transfer immersion cooling tank 1800. As illustrated by FIG. 18, the system includes: a differential pressure transducer 1810/1840 that measures a differential pressure between a first vapor pressure internal to the immersion tank and a second pressure outside of the immersion tank; a condenser inflow control valve (or valve assembly) 1845 that controls a flow rate of condensation liquid within the condenser 1660 located within the immersion cooling tank 1800; and a controller 1850 or control logic 170 (FIG. 1) that, in response to the measured differential pressure exceeding a pre-set threshold difference, triggers the condenser inflow control valve 1845 to increase a flow rate of the condensation liquid in order to reduce an amount of vapor (by faster condensation into a liquid condensate) within the immersion cooling tank 1800 and bring the measured differential pressure back to below the threshold differential pressure.

Another embodiment provides a pressure control system that includes: a cooling mechanism (not shown) that reduces a temperature of a portion of condensation liquid stored external to the immersion cooling tank 1800; and a controller 1850 or control logic 170 (FIG. 1) that, in response to the measured differential pressure exceeding a pre-set threshold difference, triggers the condenser inflow control valve 1845 to: provide one or both of an increased flow rate of the condensation liquid and a lower ambient temperature of the condensation liquid, in order to increase vapor condensation due to a faster rate of heat absorption from the rising vapor and decrease the amount of vapor in the immersion cooling tank 1800. The increase in the rate of vapor condensation reduces the amount of vapor 1622 (FIG. 16) (by faster condensation into a liquid condensate) within the immersion cooling tank 1800 and thus reduces the associated vapor pressure.

In one or more embodiments, the pressure control system further includes: a condenser fluid flow controller 1850 that is connected to the differential pressure transducer 1840. The differential pressure transducer 1840 is employed between the interior and exterior volumes of the cooling system in a feedback loop connected with the condenser fluid flow controller 1850. The condenser fluid flow controller 1850 dynamically modulates (increases or decreases) flow of condensation fluid into the condensers, such that the vapor mass within the upper volume of the immersion cooling tank 1800 can be kept substantially constant or below a pre-set threshold value. The process substantially eliminates any detected pressure differential, and the control logic of the condenser fluid flow controller 1850 drives a differential pressure to the pre-determined value by increasing and/or decreasing the condenser fluid flow rate. Ideally, the pressure differential will be nearly zero at all times to prevent vapor escape. The condenser fluid flow controller 1850 then modulates coolant flow into the condensers, such that the vapor mass can be kept nearly constant, and thus eliminating any detected pressure differential. The control logic of the condenser fluid flow controller 1850 would continually seek to drive differential pressure to zero by increasing or decreasing coolant flow rate.

Figure 19:
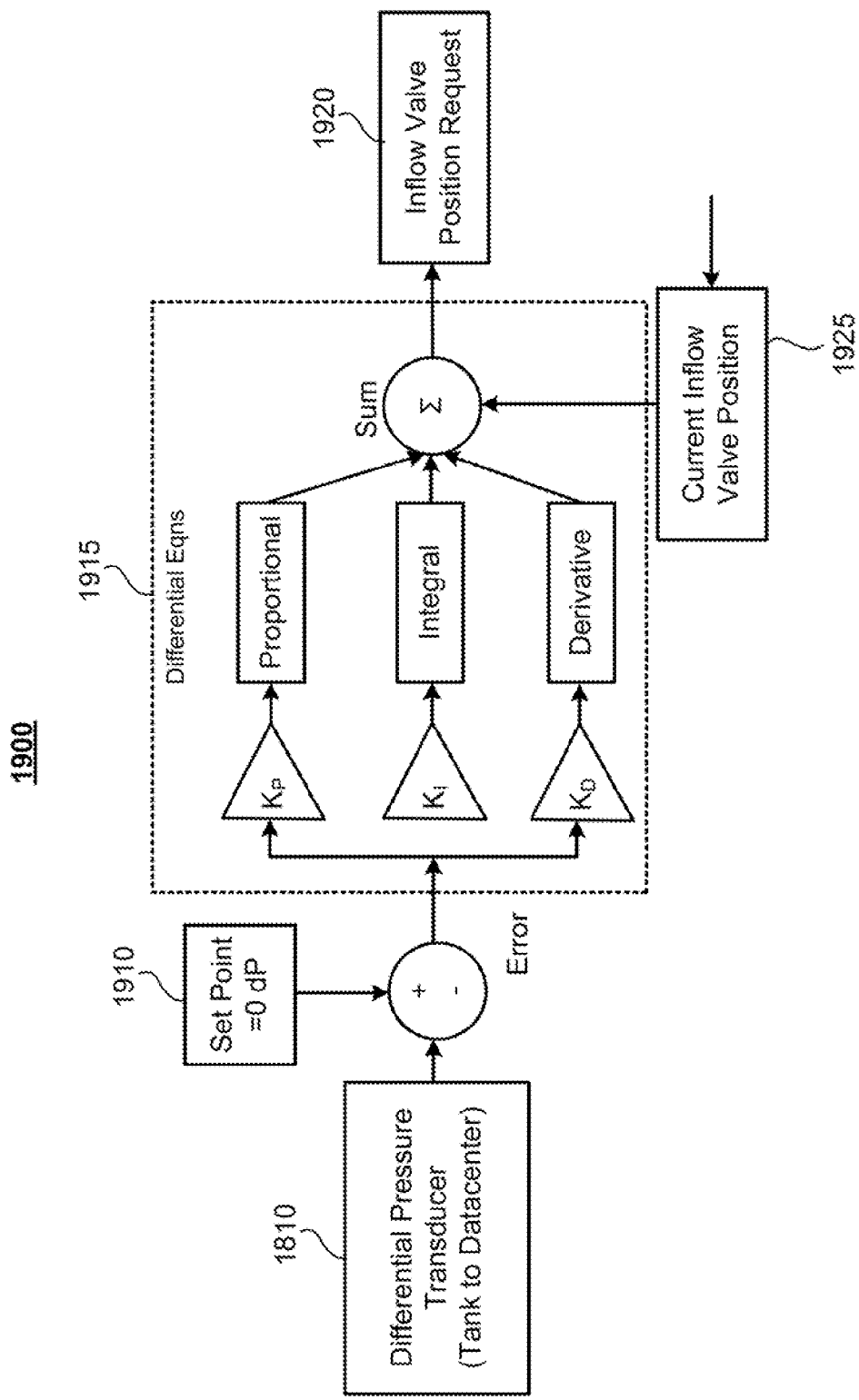
FIG. 19 illustrates an example proportional-integral-derivative (PID) algorithm that can be utilized within a pressure control system for an immersion cooling tank, in accordance with one embodiment.

According to one embodiment, and as illustrated by feedback control loop 1900 of FIG. 19, the control logic 1915 of the condenser fluid flow controller 1850 (FIG. 18) can include and/or be comprised of a proportional-integral-derivative (PID) algorithm coupled with a variable displacement solenoid valve 1845 (FIG. 18) on the supply-side of a facility cooling loop. System feedback is provided by the differential pressure transducer 1810 coupled to the immersion cooling tank 1800, with the control variable being the current inflow valve position 1925 of the solenoid valve 1845. The current inflow valve position 1925 of the solenoid valve 1845 (FIG. 18) is controlled by feedback provided by the differential pressure transducer 1810, which compares the measured differential pressure to a threshold differential pressure 1910. In the illustrated embodiment, the set point for the threshold differential pressure 1910 is indicated as 0 dP. A different set point value can be utilized within alternate embodiments. Control logic 1915 generates an inflow valve position request signal 1920 as the output. This output (1920) is communicated to the open/close control mechanism for solenoid valve 1845 (FIG. 18) to change (i.e., granularly, gradually, and/or incrementally opening or closing) the current inflow valve position 1925 until a pressure equilibrium state is obtained within the immersion cooling tank 1800.

Figure 20:
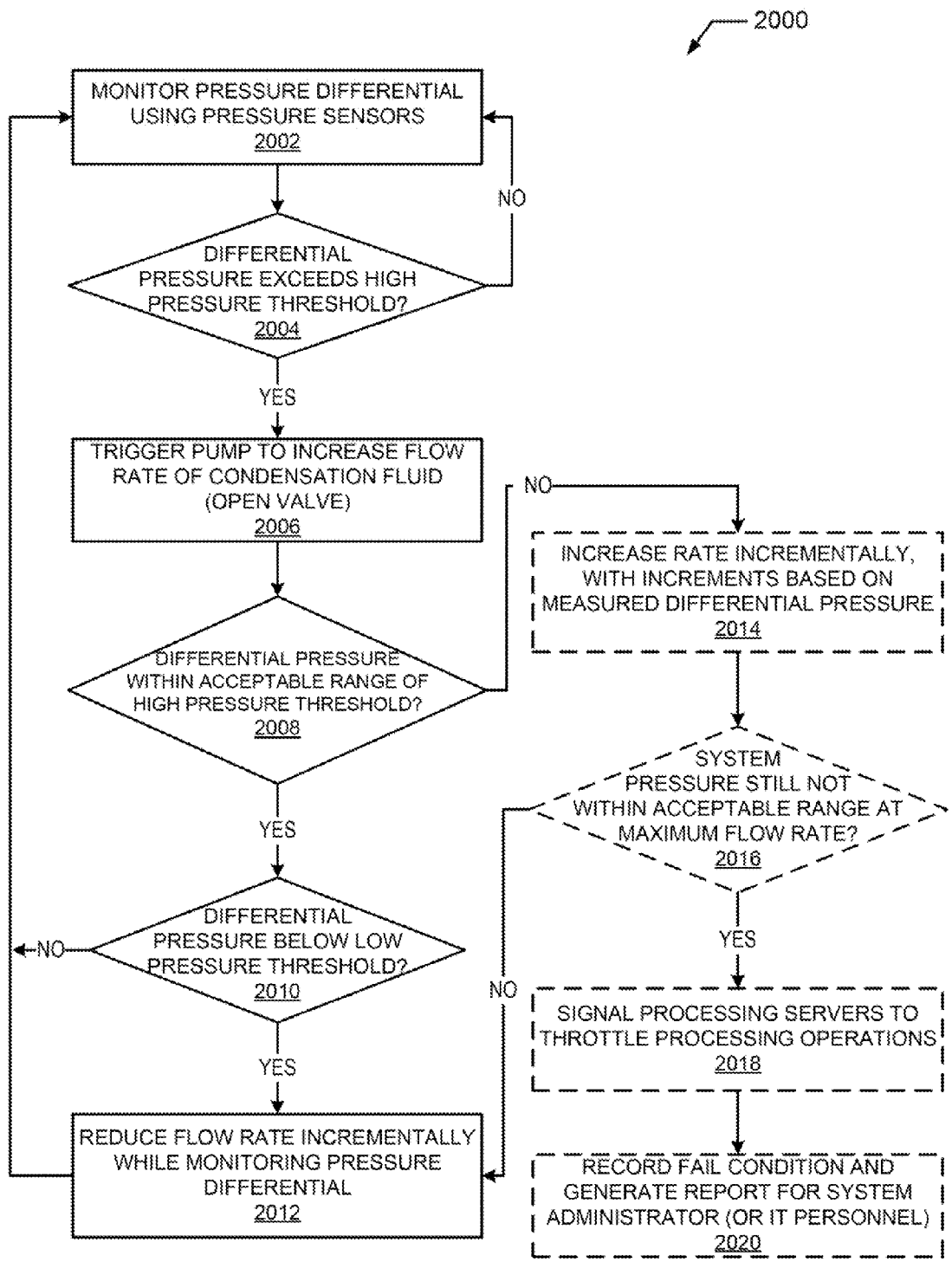
FIG. 20 is a flow chart illustrating a method of controlling pressure build up within an immersion cooling tank, in accordance with one or more embodiments.

FIG. 20 is a flow chart illustrating one embodiment of a method for controlling pressure within the immersion cooling tank 1600/1800 utilizing one or more of the above described aspects of the disclosure. Method 2000 begins at block 2002 at which the differential pressure of the interior and exterior of the tank 1800 is measured by one or more differential pressure sensors 1810. At decision block 2004, method 2000 includes controller 1850 determining whether the differential pressure exceeds a preset high pressure threshold. Method 2000 loops back to block 2002 when the differential pressure does not exceed the high pressure threshold. In response to the measured or detected differential pressure exceeding the pre-set high pressure threshold, controller 1850 opens the inflow valve 1845 to increase the rate of flow of condensation fluid through the condenser 1660 (block 2006). In one embodiment, a pump can be utilized within the feedback system, and controller 1850 then triggers the pump to increase the rate of flow of condensation liquid through the condenser.

Monitoring of the differential pressure continues and at decision block 2008, controller 1850 determines whether the differential pressure is within the acceptable range of the high pressure threshold (e.g., below the preset high pressure threshold) following the initial feedback response. If the differential pressure is below the high pressure threshold, controller 1850 further determines at decision block 2010, whether the differential pressure has fallen below a preset low pressure threshold (e.g., a negative differential pressure). In response to the differential pressure being below the preset low pressure threshold, controller 1850 then reduces the inflow rate in increments while monitoring the differential pressure until the differential pressure falls within the acceptable range (block 2012). This second check of the differential pressure and adjustment of the flow rate allows the controller to reduce the flow rate from a high flow rate that was introduced because of a positive differential pressure imbalance when the higher flow rate is no longer required, such that a regular or lower flow rate is sufficient for the control system's differential pressure equilibrium. Method 2000 then returns to block 2002.

Returning to decision block 2008, in response to the differential pressure not falling within the acceptable range of the high differential pressure threshold following the increased flow of condensation fluid, method 2000 can include a series of secondary measures to reduce the pressure within the immersion tanks. In one embodiment, the series of secondary measures can be triggered following expiration of a timer set to track the time elapsed since the increase in condensation fluid flow rate to address the high differential pressure readings within the tank. Thus, for example, the increased flow rate can be determined by empirical measurements or in the field testing to cause a percentage reduction in pressure sufficient to address the average build-up of pressure within the tank within time X following the increase in the flow rate. Thus, when the differential pressure readings do not fall below the high pressure threshold after time X following the increased flow rate, controller 1850 initiates the secondary measures to protect the overall integrity of the tank and/or the electronic devices within the tank. These secondary measures are optional and thus indicated with dashed lines.

Returning to the flow chart, at block 2014, controller 1850 increases the flow rate incrementally to a maximum flow rate. Method 2000 then includes determining at decision block 2016 whether the system's differential pressure is still not within the acceptable range of the high pressure threshold. In response to the differential pressure still remaining above the high pressure threshold, controller 1850 transmits a signal to the processing servers to throttle the processing operations occurring on the servers (block 2018). This throttling of the processors reduces the amount of heat dissipation and by extension the amount of boiling and vaporization that occurs within the immersion cooling tank 1800. The rate at which new vapor 1622 (FIG. 16) is added to the upper volume of the immersion cooling tank 1800 is thus reduced. At block 2020, method 2000 includes controller 1850 recording a failure condition and generating a failure report that can be transmitted to a terminal of an administrator or IT personnel.

Notably, one embodiment can also provide a release valve that is temporarily opened to release some of the vapor from the interior of the tank enclosure. However, this release valve can be associated with a return channel that allows the vapor to condense and return to a reservoir or to the tank volume as a cooling liquid condensate. This prevents the loss of vapor and by extension the cooling fluid required for the operation of the tank. The release valve can be controlled by a signal from the controller 1850, where the controller 1850 generates the release valve signal only once a measured differential pressure passes a preset maximum differential pressure level.

The above described embodiments provide a plurality of techniques for controlling and/or mitigating the buildup of pressure within the immersion tank in order to maintain the integrity of the tank (from high pressure vapor leakage and/or other problems). One embodiment, illustrated by various example figures (e.g., FIGS. 16-17) provides for the use of bellows 1690 within the lid (cover) 1680 of the immersion tank 1600 to allow the immersion tank 1600 to respond to fluctuations in pressure, and particularly to pressure build up. Another embodiment, illustrated within the control structure of FIGS. 18 and 19, provides a feedback control mechanism that can respond to a detected buildup of pressure in the tank by (1) increasing the flow of the condensation fluid through the condenser and/or (2) reducing the temperature of the condensation fluid and/or (3) throttling the processing operations occurring at the servers within the tank, and/or (3) passing some of the excess vapor through a valve-controlled exterior liquid return piping system.

In the above described flow charts, one or more of the method processes may be embodied in a computer readable device containing computer readable program code such that a series of steps are performed when the computer readable program code is executed on a computing device. In some implementations, certain steps of the methods are combined, performed simultaneously or in a different order, or perhaps omitted, without deviating from the scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a GPU, or other programmable data processing apparatus to produce a machine, such that the instructions, which execute via the processor of the computer or other programmable data processing apparatus, performs the method for implementing the functions/acts specified in the flowchart and/or block diagram block or blocks.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, microcode, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, an electronic, magnetic, optical, electromagnetic, infrared, or semiconductor system, apparatus, or device, or any suitable combination of the foregoing. More specific examples (a non-exhaustive list) of the computer readable storage device include: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible medium that stores a program for use by or in connection with an instruction execution system, apparatus, or device.

I. Vertically-Oriented Immersion Server with Vapor Bubble Deflector

Each of the above described aspects of the disclosure, and the various associated embodiments illustrated and described, have been described with reference to example servers 200/300, which represent a conventional design of a server that is utilized within a rack based data center or simply within a processing system. These conventional servers are typically originally designed to be air cooled by a fan within a dry environment. Thus, the immersion cooling aspects are fully applicable to these server designs where the HDDs, if included on the server, can be separated from the other heat generating processing devices, such as the processor and/or the memory modules, so that the HDDs are not immersed within the cooling fluid. As previously introduced, conventional HDDs are not designed to be submerged in a liquid medium. Thus, with the conventional liquid cooling of servers, the HDDs are either located remotely from the actual server and air cooled via use of a fan, or alternatively, according to the method provided by the present disclosure, these HDDs can be vapor cooled within the tank enclosure as the other operating components dissipate heat into and causes the vaporization of the cooling liquid located below the HDD cooling area.

Additional aspects of the disclosure provide for several novel designs of immersible servers that are specifically designed to have the processing components be submerged in a cooling liquid, and where provided, to have the physically connected HDDs be vapor-cooled within the same cooling vessel.

FIG. 21 generally provides an immersion-based liquid cooling system, which includes: a cooling vessel 2150 having an interior volume with a lower volume in which a cooling liquid (2112) is disposed and an upper volume in which one or more condensers 2160 can be provided; and a rack structure (not shown) for holding at least one vertically-oriented immersion server 2100 in an upright position relative to a directional orientation of the interior volume of the cooling vessel 2150. The vertically-oriented immersion server 2100 represents a first design aspect, which provides an embodiment of a motherboard 2105 and processors 2110 of a multiprocessor server 2100 that is designed to be liquid cooled by dissipating heat sufficient to cause the cooling liquid to boil. As shown by FIG. 21, motherboard 2105 of the example server 2100 includes two processors embedded thereon, namely first processor 2110A and second processor 2110B. Motherboard 2105 is submerged in cooling liquid 2112 within an immersion cooling vessel 2100. The cooling liquid 2112 has surface layer 2125 that is vertically above the processors 2110. Motherboard 2105 is placed in a vertically upright position within the cooling liquid, such that second processor 2110B is positioned vertically above first processor 2110A. As also shown by FIG. 21, motherboard 2105 is constructed with a vapor deflector 2120 positioned in between first processor 2110A and second processor 2110B. Vapor deflector 2120 angles away from the surface of motherboard 2105, at an angle and a distance away from motherboard 2105 which enables sufficient deflection of rising vapor 2122A (1) away from the upper portion of motherboard 2105 at which second processor 2110B is located and (2) towards the surface 2125 of the cooling liquid 2112. As first processor 2110A operates (e.g., by executing program code or instructions), first processor 2110A dissipates sufficient heat into the surrounding cooling liquid 2112 to cause the surrounding cooling liquid 2112 to boil. As the cooling liquid 2112 boils, the liquid evaporates and generates a plume of rising vapor bubbles 2122, which bubbles upwards to the surface 2125 of the cooling liquid 2112. Vapor deflector 2120 is designed with a specific length and is angled sufficiently to move the rising vapor bubbles 2122A generated by heat dissipating from first processor 2110A away from motherboard 2105, such that the vapor bubbles 2122A do not come into contact with any of the other submerged components at the upper portion of motherboard 2105 that are located vertically above the vapor deflector 2120 within the cooling liquid 2112. As shown, heat dissipation from processing operations of second processor 2110B also causes a boiling of the cooling fluid 2112, which results in the generation of a second plume of rising vapor bubbles 2122B. These rising vapor bubbles 2122 escape from the surface layer 2125 of the cooling liquid 2112 into the upper volume of the immersion cooling vessel 2150.

Thus, the illustrative embodiment provides a server 2100 comprising: a printed circuit board (PCB) (2105) having a first surface at which one or more components are physically connected; a vapor bubble deflector 2120 having a first end physically abutting the first surface of the PCB (2105) and an opposing, second end that extends away from the first surface at an angle. The deflector segregates the first surface of the PCB (2105) into an upper segment and a lower segment when the server 2100 is placed in a vertically upright orientation. Generally, the server 2100 further includes a first heat dissipating component that is physically coupled to the lower segment of the PCB (2105) below the deflector 2120; and a second heat dissipating component that is physically coupled to the upper segment of the PCB (2105) above a point of contact between the first end of the deflector 2120 and the first surface of the PCB (2105).

As illustrated, in at least one embodiment, the first heat dissipating component can be a processor, i.e., first processor 2110A, and the second heat dissipating component can also be a processor, i.e., second processor 2110B. However, within a server specific implementation, the heat dissipating components can be any lower component on the server chassis that can dissipate sufficient heat to cause the localized boiling of the cooling liquid and subsequent generation of vapor bubbles below other components on the server chassis. For example, the described features are applicable to memory modules, SSDs, PSUs, and the like. Further, it is appreciated that the functionality described herein by utilization of the deflector applies to any type of electronic device (i.e., not necessarily a server) and that the heat dissipating components are not limited to computer and/or server based components and devices. With a standard electronic device, the PCB can be replaced by a base panel or back panel.

According to the illustrated embodiment, the server 2100 is designed for immersion-based liquid cooling by submerging the PCB (2105) with the first heat dissipating component (2110A) and the second heat dissipating component (2110B) into cooling liquid within an immersion cooling vessel 2150, such that the cooling liquid surrounds the first and second heat dissipating components (2110) and absorbs heat being dissipated from the first and second heat dissipating components (2110). Consequently, portions of the cooling liquid surrounding the first heat dissipating component (2110A) absorb sufficient heat to reach a boiling point temperate and evaporate to generate one or more rising vapor bubbles 2122A that bubble to a surface of the cooling liquid 2112. The vapor bubble deflector 2120 deflects the rising vapor bubbles 2122A away from the second heat dissipating component (2110B) towards the surface of the cooling liquid 2112. The deflector is made of a material that is impervious to vapor bubbles. In one or more embodiments, the deflector is physically connected to the motherboard at the first end.

According to one embodiment, the server 2100 includes a casing (not shown) in which the PCB 2105 is placed and which is designed to orient the server 2100 in the vertically upright orientation within the immersion cooling vessel 2150. By deflecting the rising vapor bubbles away from the second heat dissipating component, the vapor deflector 2120 enables a surface area of the second heat dissipating component (2110B) to be exposed to and in full contact with the cooling liquid surrounding the second heat dissipating component (2110B) in order to maximize heat absorption by the cooling liquid of heat being dissipated from the second heat dissipating component (2110B).

In at least one embodiment, and as illustrated with the use of dashed boxes, the server 2100 can include at least one hard disk drive HDD 125 that is communicatively coupled to the processor and which is physically located vertically above the surface of cooling liquid and in a direct path of a rising plume of vapor (illustrated by the vertical arrows) 2122C produced from the rising vapor bubbles 2122. As shown, the lateral location of the HDDs 125 within the immersion cooling vessel 2150 can be set based on the direction of vertical rise of the vapor bubbles out of the cooling liquid. Thus, in order to maximize or take best advantage of the cooling effects of the rising vapor on the HDDs 125, these HDDs are specifically positioned immediately above the surface areas of the cooling liquid at which the maximum amount of rising vapor bubbles escape upwards into the upper volume of the cooling vessel 2150. Notably, the deflector 2120 causes a lateral displacement of the rising bubbles for the first processor 2110A. As a consequence, there is also a lateral gap in-between the rising bubbles (on the left) of the second processor 2110B and the rising bubbles of the first processor 2110A. In addition to the selective placement of HDDs 125, the selective location of sub-condensers 2160 in the upper volume can also be dictated by this lateral displacement of the rising bubbles, such that the sub-condensers 2160 are positioned at the horizontal location at which the maximum amount of vapor can impact the condensers as the vapor bubbles escape the cooling liquid surface and rises vertically upwards in the cooling vessel 2100.

According to one aspect, the server 2100 can include a plurality of vertically-oriented heat dissipating components separated by a plurality of vapor bubble deflectors. Thus, one embodiment provides at least one additional vapor bubble deflector located vertically above one or more heat generating components. The at least one additional vapor bubble deflector shields at least one other heat dissipating component from vapor bubbles generated by boiling of cooling liquid surrounding the one or more heat generating components.

Figure 21B:
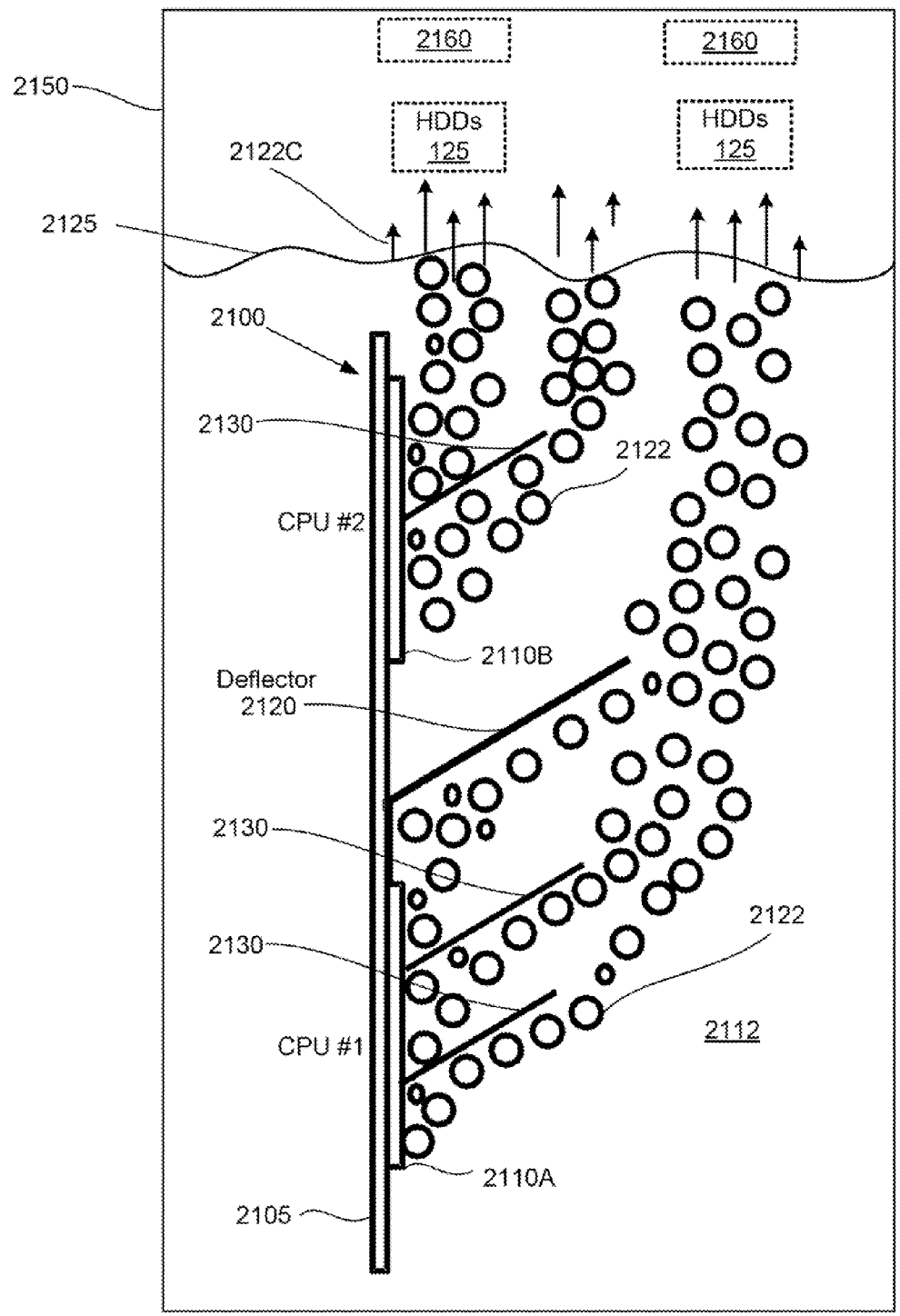
FIG. 21B illustrates a second example of a vertically-oriented server configuration in which multiple vapor deflectors are provided to direct rising vapor bubbles away from upper portions of a single component and/or upper components that are submerged in cooling liquid, according to one embodiment.
Figure 21C:
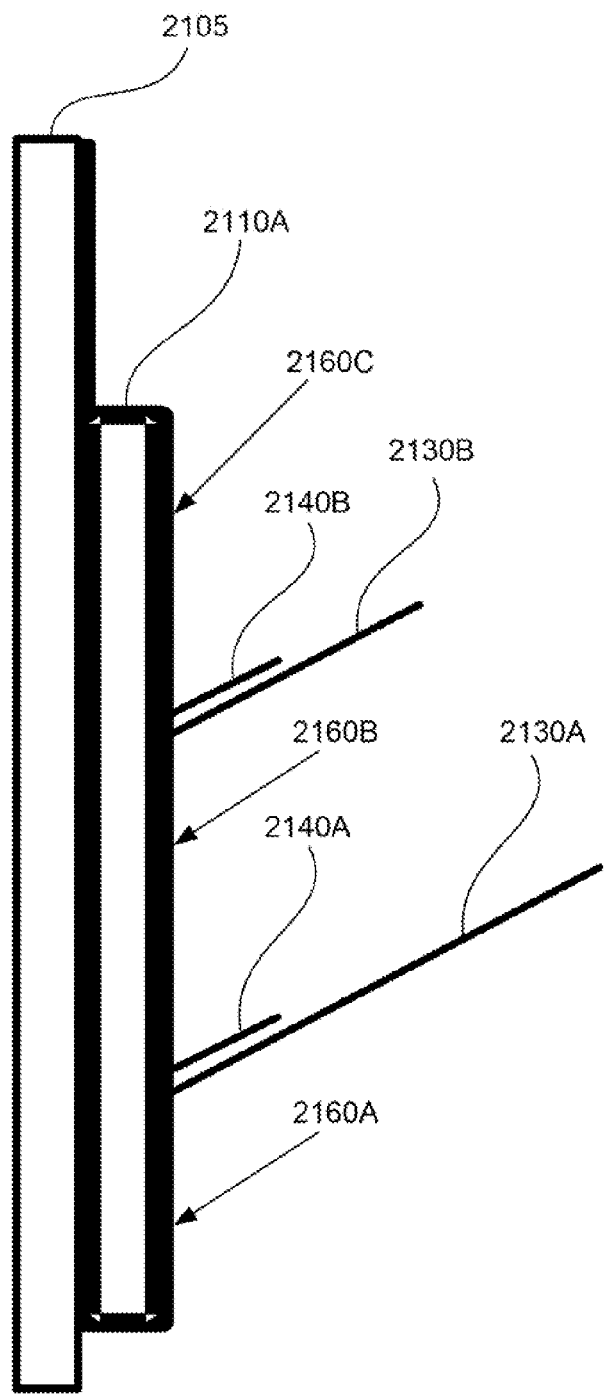
FIG. 21C illustrates an example of a high heat dissipating component that includes both deflector fins as well as heat fins attached to the surface of the component, according to one or more embodiments.

According to one or more embodiments, a plurality of bubble deflectors can be provided at different locations on the server or other submerged device. As described above, the bubble deflectors can be utilized as separators at the device level and located between individual components on and/or of the device. Additionally, according to another aspect, bubble deflectors can also be provided at and utilized on a component level, where the component level deflectors are designed to function as separators for vertical segments of the single component. FIG. 21B illustrates a second example of the vertically-oriented server configuration in which multiple vapor deflectors are provided to direct rising vapor bubbles away from upper portions of a single component, while the device level bubble deflectors and/or upper components that are submerged in cooling liquid. FIG. 21C then provides an example of a segmented high heat dissipating component that includes on-component deflectors as well as heat fins. Because of the similarity with FIG. 21A, only the newly presented aspects of FIG. 21B will be described. Overlapping features of FIGS. 21B and 21C will be described together. In the illustrative embodiments of FIGS. 21A and 21B, one or more angled deflector fins 2130 are shown extending from an exposed surface of a single component, separating the single component into a plurality of vertically-oriented segments 2160. Specifically, in FIG. 21B, first processor 2110A and second processor 2110B are shown having respective angled deflector fins 2130, directly attached to and extending at an upwards angle away from the exposed surface of the respective processor 2110A, 2110B. The deflector fins 2130 represent component level deflectors, which act as a barrier to the upward path of rising vapor bubbles coming off the surface of the lower segment (e.g., first segment 2160A, relative to deflector fin 2130A) of the single component (2110A) beneath the particular angled fin 2130A. The deflector fins 2130 thus operate to channel the vapor bubbles 2122 generated at the lower segment of the particular component (e.g., 2110A, 2110B) away from the upper segments of the particular component. Consequently, the deflector fins 2130 prevent bubble dryout for the upper portions of a single component.

As shown by FIG. 21B, each device can comprise both device level and component level deflectors. In such an implementation, device level deflectors can be a different length or dimension from component level deflectors and/or the deflectors can be constructed from different materials and/or at different angles. Also, the spacing of the deflectors can be empirically or computationally determined to best allow for cooling of the components and segments thereof without the aforementioned bubble dryout occurring. Additionally, as shown by FIG. 21C, even the component level deflectors are not necessarily symmetric. Thus deflector fins 2130 can be different lengths, dimensions, and at different angles. However, the design of the single components and of the overall device takes into consideration the bubble displacement caused by the lower placed deflectors and/or deflector fins in determination an optimal location, shape, size, and angle of each of the upper deflectors.

Additionally, in one embodiment and as illustrated by FIG. 21C, high heat dissipating components, e.g., first processor 2110A, can be designed having one or more heat fins 2140 extending outwards from the component (2110A) to increase the surface area for cooling the high heat dissipating component. When the component includes the angled deflector fins 2130, these heat fins 2140 are located immediately above a lower deflector fin (e.g., deflector fin 2130A for heat fin 2140A), in one embodiment, to enable the heat fin 2140A to not be engulfed in bubbles formed at a lower segment 2160A of the component (2110A). The bubbles being generated from that heat fin (2140A) are then directed by the upper deflector fin 2130B or by the device level deflector 2120 (FIG. 21A-21B) located above the component (2110A).

The above descriptions provide an immersion server that includes: a first surface that is exposed when the server is submerged within a cooling liquid; and at least one vapor bubble deflector physically abutting the first surface and extending away from the first surface at an angle. The deflector divides the first surface into an upper segment and a lower segment when the server is upright. When the server is submerged, the cooling liquid surrounding the lower segment absorbs sufficient heat to evaporate and generate vapor bubbles rising to the liquid surface. The vapor bubble deflector deflects the rising vapor bubbles away from the surface of the upper segment. This enables superior liquid contact with heat dissipating components at the upper segment and better cooling of those components. The deflector can be a device-level deflector separating two or more components or a component-level deflector separating a lower segment from an upper segment of a single component.

Figure 22:
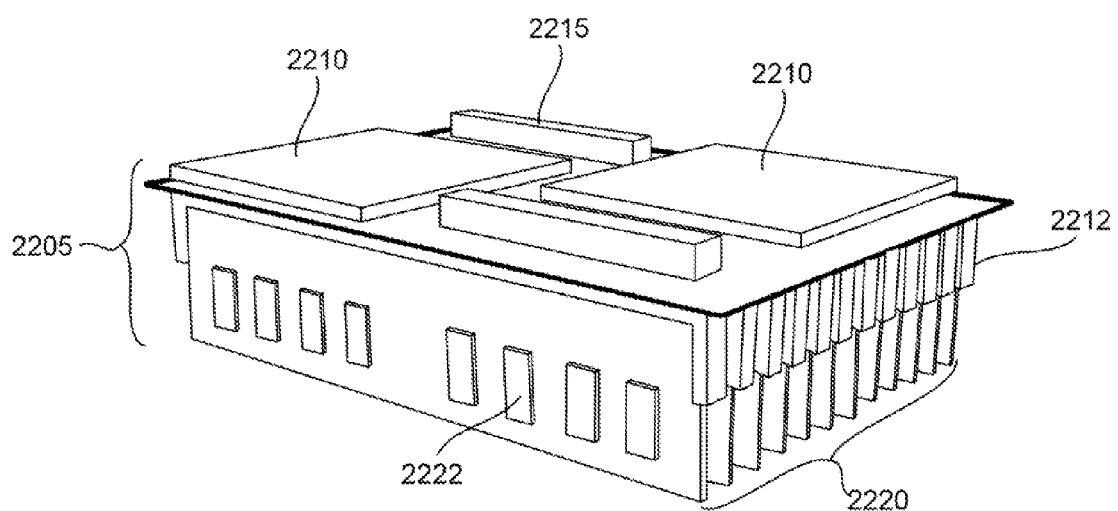
FIG. 22 is a three dimension view of an example motherboard of a vertically-oriented liquid and vapor cooled immersion server (vLVCIS) having processing components and memory modules located on opposing surfaces of a shared motherboard, in accordance with one or more embodiments.
Figure 23:
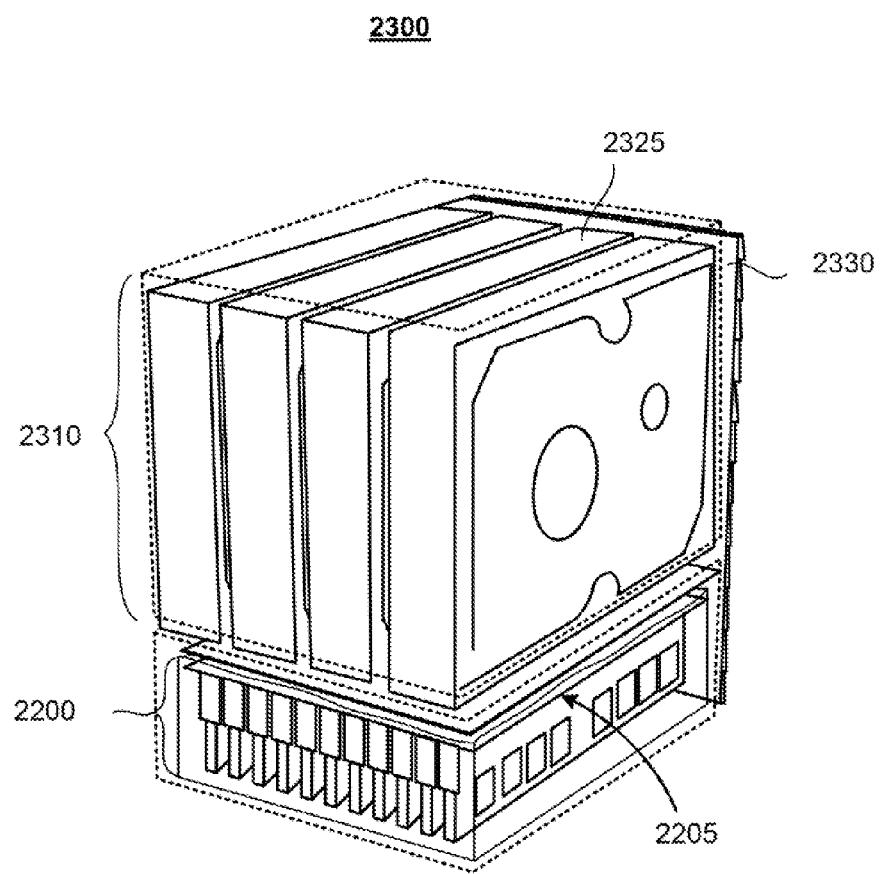
FIG. 23 presents a three dimensional view of an example vLVCIS with storage devices located vertically above the other functional components that are embedded on the opposing sides of the motherboard of FIG. 22, according to one or more embodiments.
Figure 24:
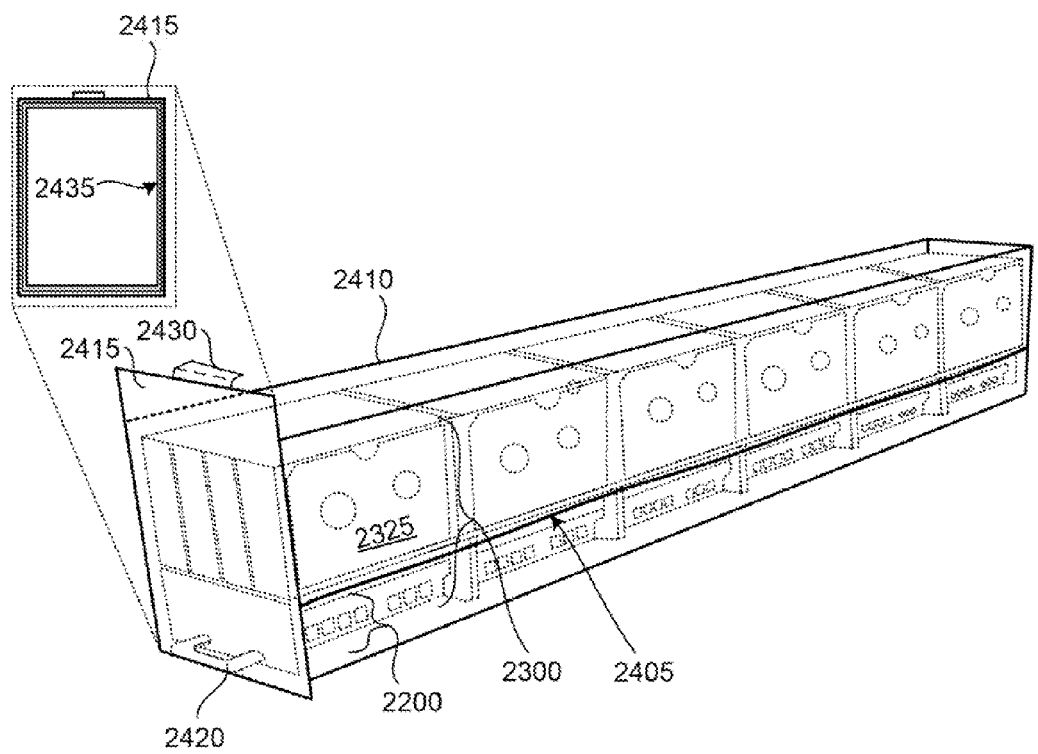
FIG. 24 is a three dimensional schematic of an immersion server drawer having multiple side-by-side vLVCISes located therein, according to one or more embodiments.
Figure 25:
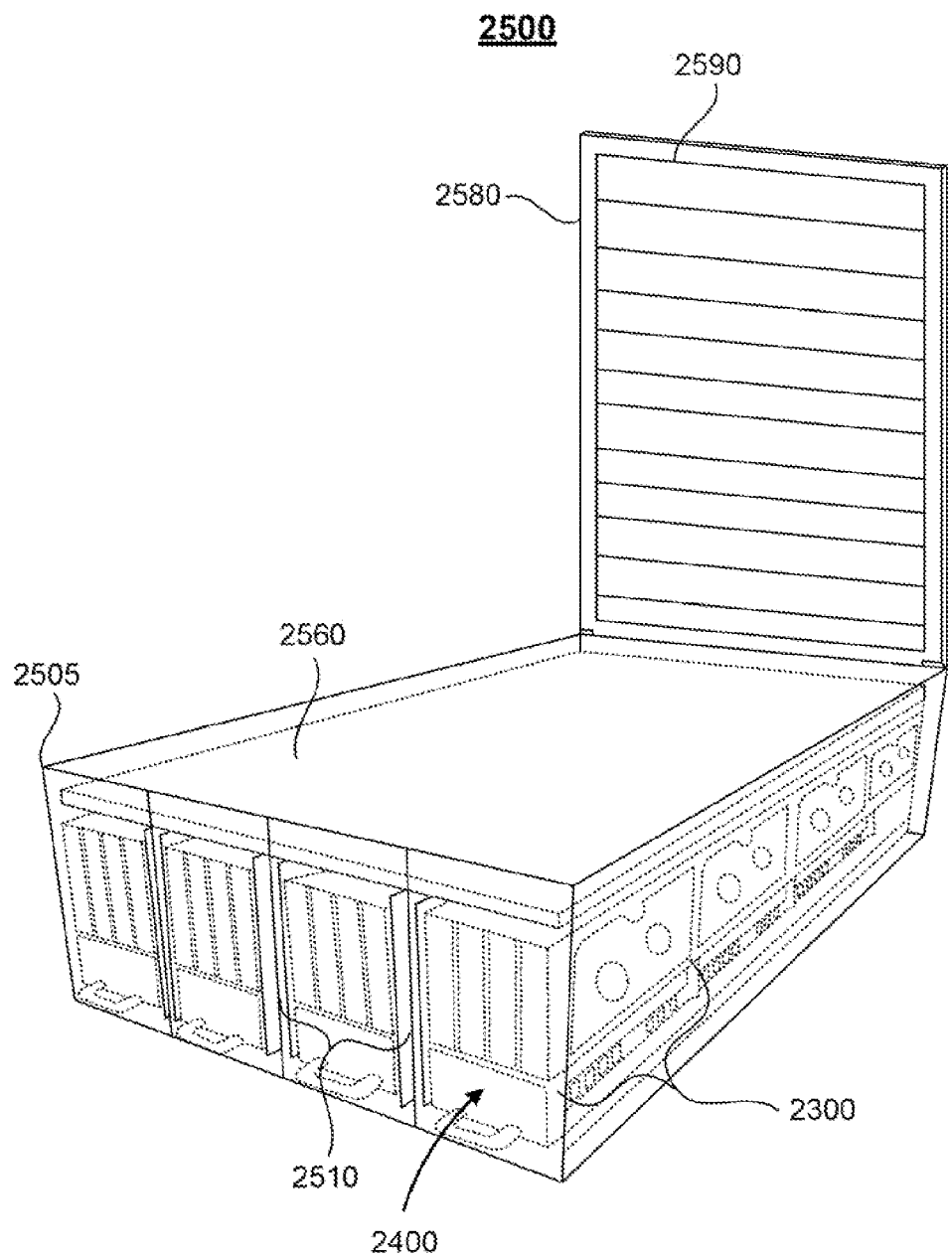
FIG. 25 presents a three dimensional illustration of an example immersion server drawer cabinet providing a vapor condensation chamber for housing multiple immersion server drawers, according to one or more embodiments.

J. Immersion Server, Immersion Server Drawer, and Immersion Server Drawer-Based Cabinet FIGS. 22-25 illustrate several additional design aspects of the disclosure, which directly address the core design of the server and cooling vessel for greater efficiency and usability of the various immersion cooling techniques described herein. Referring first to FIGS. 22 and 23, there are illustrated a motherboard and an information handling system designed and/or configured as a vertically-oriented liquid and vapor cooled immersion server (vLVCIS). FIG. 24 then illustrates an immersion server drawer, while FIG. 25 provides an immersion server drawer cabinet assembly. These designs collectively provide a method and system that enables cooling of functional components of an immersion server 2300 via an vaporization-condensation cycle utilizing a volatile (i.e., low boiling point) immersion cooling liquid provided within the immersion server drawer 2400, while providing vapor cooling of HDDs of the immersion server 2300.

According to a first aspect, illustrated by FIG. 22, example immersion server motherboard assembly 2200 comprises: a motherboard 2205 having a lower surface and an upper surface; a vertical arrangement of memory modules 2220 within receiving slots 2212 on the lower surface of the motherboard 2205; and at least one processor 2210 located on the upper surface of the motherboard 2205 and communicatively coupled to connectors of the receiving slots by signal traces (not shown) passing through the motherboard 2205 from the upper surface to the lower surface. According to one embodiment, the immersion server motherboard assembly 2200 further includes voltage regulators 2215 affixed to the upper surface of the motherboard 2205. Additional components can also be included on motherboard 2205. In one embodiment, the motherboard is a first printed circuit board (PCB). Also, in one embodiment, the memory modules 2220 include dual inline memory modules (DIMMs) 2222.

As further illustrated by FIG. 23, the immersion server motherboard assembly 2200 can be physically and communicatively connected at one edge to a vertical panel 2330 to create immersion server 2300. In one embodiment, the panel 2330 is perpendicular (e.g., approximately 90 degrees) to the motherboard 2205 and oriented vertically, such that the motherboard 2205 extends horizontally when the panel 2230 is placed in its vertical orientation, and a top portion of the panel 2330 extends vertically above the motherboard 2205 and the components located on the top surface of the motherboard 2205. In alternate embodiments, the panel 2330 is oriented at an angle that is not necessarily a 90 degree angle relative to the motherboard 2205, but which allows the panel 2330 to extend upwards above the topmost horizontal plane of the components of the motherboard.

As further illustrated, immersion server 2300 also includes one or more storage devices 2325, which are physically connected to the top portion of the panel 2330 and extend above the components on the top surface of the motherboard 2205. These storage devices 2325 are connected to and/or supported by the panel 2330, which is a solid, rigid structure that is designed to support the weight of the one or more storage devices 2325. In one embodiment, the panel 2330 can be a second PCB. The storage devices 2325 can be communicatively connected to the components on the motherboard 2205 via connecting traces or wires (not shown) extending on or through the panel 2330 to the motherboard 2205. According to one embodiment, the storage devices 2325 are hard disk drives (HDDs), which can be similar to the HDDs 125 previously introduced. Alternatively, in one or more embodiments, the storage devices 2325 are designed with an exterior surface that facilitates vapor cooling within an immersion cooling vessel and are structurally designed to be attached to panel 2330 of an immersion server 2300.

The design of the motherboard assembly 2200 and immersion server 2300 of FIGS. 22 and 23 provides a vertically-oriented arrangement of functional components that enables a bifurcation of cooling, where lower components, such as the processors 2210 and the memory modules 2220, are cooled via liquid cooling and upper components, such as the storage devices 2325, are cooled via vapor cooling. Generally, the design and/or arrangement of the vLVCIS 2300 enables a first set of components attached to the motherboard 2205 (e.g., processor 2310, memory modules 2220, etc.) to be submerged in a cooling liquid and be liquid cooled during operation, while a second set of components (specifically the HDDs 2325) attached to the upper panel 2330 and extending above the motherboard assembly 2200 are air cooled by rising vapor generated as the cooling liquid evaporates.

FIG. 24 illustrates the second design aspect, which entails an immersion server drawer 2400 designed as one part of the vessel in which the immersion server is operated and cooled. Immersion server drawer 2400 includes an external impervious enclosure configured with opposing side walls, opposing front and rear walls and a bottom wall. The use of the term "wall" or "walls" to describe the sections of the drawer 2400 is meant solely to convey a location of the enclosure relative to a top and bottom and a front and rear of the immersion server drawer 2400 when in an upright position in which cooling liquid can be maintained within the bottom of the provided enclosure. The immersion server drawer 2400 has a depth or length dimension extending from the front wall to the rear wall. The length dimension is selected as a design parameter to be appropriately sized to receive one or more immersion servers 2300 in one of a first orientation (e.g., front to back) and/or a second orientation (e.g., left to right). The immersion server drawer 2400 also has a width dimension extending from a first side wall to a second side wall that is sized appropriately to receive one or more immersion servers in one of the first orientation and the second orientation. Finally, the immersion server drawer 2400 has a height dimension extending from the bottom to a top of the opposing side walls and appropriately sized to receive a single immersion server 2300 placed in an upright position.

As shown by FIG. 24, six immersion servers 2300 are placed within the enclosure created by immersion server drawer 2400. The immersion servers 2300 are placed in an upright position, with the motherboard assembly 2200 having the processor 2210 and memory components 2220 (FIG. 22) located within a bottom region of the enclosure, and the upper panel with the storage devices 2325 located closer to the top region of the enclosure. In the illustrated embodiment, the plurality of immersion servers 2300 are placed within the immersion server drawer 2400 in a side-by-side configuration along the depth of the immersion server drawer 2400, adjacent to each other. One or more separators (not shown) can be provided within the enclosure to provide spacing between each immersion server 2300 and/or to provide a demarcation of where and in which orientation the immersion servers 2300 should be placed within the enclosure. In an alternate embodiment involving multiple immersion servers 2300, the immersion servers 2300 can be placed in a side-by-side configuration along the width of the immersion server drawer. This configuration provides a wider immersion server drawer 2400, and can include separators along the width dimension. In yet another embodiment, multiple immersion servers 2300 can be placed in both of the width dimension and the depth dimension of the immersion server drawer 2400. In this latter configuration, separators can be provided in both the width and depth/length dimensions of the enclosure.

Immersion server drawer 2400 can include a dielectric cooling fluid, which is generally illustrated using a line representing the surface layer 2405. The dielectric cooling fluid is placed within the lower portion of the enclosure of the immersion server drawer 2400 to a first cooling liquid level (2405) at which all components of motherboard assembly 2200 of immersion server 2300 would be submerged in the cooling liquid. In the illustrated embodiment, the cooling liquid level (2405) is below the storage devices 2325 of immersion server 2300. As described herein, the processing and other components on the motherboard assembly 2200 of immersion server 2200 are submerged in cooling liquid and are liquid cooled. As further described herein, the cooling of the storage devices 2325 occurs via flow of rising vapor generated from vaporization of the dielectric cooling liquid, which creates a convectional cooling of the storage devices 2325 as the vapor passes over the surfaces of the storage devices 2325. In one embodiment, the immersion server drawer 2400 further includes a handle 2420 disposed within a front (or outside) surface of the front wall 2415. Also, in the illustrated embodiment, the inside surface of the front wall 2415 includes a rubber seal 2435 (see inset) that allows the immersion server drawer 2400 to be sealed air-tight when inserted into an immersion server drawer cabinet 2500 (FIG. 25), which is designed specifically for insertion of immersion server drawer 2400. As one aspect of creating this air-tight seal, immersion server drawer 2400 (and/or the cabinet) can include a clip or other locking mechanism 2430 that allows the immersion server drawer 2400 to be fixably inserted into the drawer cabinet 2500.

FIG. 25 illustrates an example immersion server drawer (ISD) cabinet 2500, which is a third server design aspect of the disclosure. The immersion server drawer cabinet 2500 is designed to hold one or more immersion server drawers 2400, in which one or more immersions servers 2300 are partially submerged in a dielectric cooling fluid. According to at least one embodiment, the ISD cabinet 2500 is designed with specific dimensions to enable the immersion server drawer cabinet 2500 to fit within a standard IT rack, such that the immersion serer drawer 2500 can be mounted within the standard IT rack, including being mounted next to, or above or below, other servers within the IT rack. The immersion server drawer cabinet 2500 has an exterior casing 2505 and includes at least one drawer receptacle 2510 configured to accommodate insertion of an immersion server drawer 2400 therein. The example embodiment of FIG. 25 illustrates a plurality of adjacent receptacles 2510. When fully inserted into the drawer receptacle 2510, the inside surface (with rubber seal 2435 (FIG. 24)) of the front wall of the immersion drawer 2400 compresses against the exterior front surface of the drawer receptacle 2510 to create an air-tight seal. Creation of the air tight seal prevents a loss of dielectric vapor during operation of the one or more immersion servers 2300 located within immersion drawer 2400. A latching mechanism (e.g., latch 2430 (FIG. 24)) holds the immersion drawer 2400 in place to maintain the airtight seal.

The immersion server drawer cabinet 2500 includes a condenser 2560 located within an upper section of the ISD cabinet 2500 above the top of an inserted immersion server drawer 2400. The condenser 2560 receives a flow of condensation fluid from an external fluid source and operates to condense rising vapor that evaporates off the surface of the dielectric cooling liquid as the one or more immersion servers 2300 dissipate heat. In one or more embodiments, the ISD cabinet 2500 includes a top cover 2580 within which can be disposed a bellows 2590 that modulates pressure build up due to the rising vapor. Each inserted immersion cooling drawer 2400 can be individually removed from the corresponding receptacle 2510 once the latching mechanism 2430 (FIG. 24) is unlatched.

According to one aspect of the disclosure, at least one of the immersion server 2300, the immersion cooling server drawer 2400, and the immersion server drawer cabinet 2500 comprises a condensate liquid return system (not shown) that channels the condensed dielectric cooling liquid back to the lower enclosure of the immersion server drawer 2400 without the condensed dielectric liquid coming into contact with the HDDs 2325 (FIG. 23) of the one or more immersion servers 2300 within the immersion cooling server drawer 2400.

Accordingly, the above description provides an information handling system that includes an immersion server drawer (ISD) having an impervious enclosure which holds a volume of dielectric cooling liquid within/at the enclosure bottom. The ISD is configured with dimensions that enable insertion of liquid-cooled servers within the enclosure bottom. A plurality of liquid-cooled servers can be placed in a side-by-side configuration along one dimension of the ISD, with one or more heat dissipating components of the servers being placed below a surface layer of the cooling liquid. Submerged components of the immersion server are liquid-cooled, while the other heat generating components above the liquid surface are air cooled by rising vapor generated by boiling and vaporization of the cooling liquid. The ISD is placed in an ISD cabinet, which is configured with an upper condenser that allows for multi-phase cooling of the electronic devices placed within the immersion server drawer. The ISD cabinet can be rack-mountable.

K. Stand Alone Immersion Tank Data Center with Contained Cooling

The above introduced immersion based cooling solutions for cooling rack-mounted servers, as well as the newly designed immersion servers, drawers, and cabinets, are generally described as requiring a compatible condensation cooling system which includes a cooling infrastructure for channeling the condensation fluid to the exterior of the vessel. For example, the described condensation loops require an external transfer of condensation fluid utilizing a condensation fluid reservoir and/or facility-based cooling. The application of this cooling process finds applicability with large scale data centers with multiple immersion cooling tanks that can be efficiently cooled using a facility based cooling.

According to one embodiment, the SITDC includes a multi-phase heat transfer immersion cooling tank that enables direct cooling of information handling systems, such as data center servers, by submerging and operating the physical information handling systems in a volatile (i.e., low boiling point) liquid within the multi-phase heat transfer immersion cooling tank.

Figure 26:
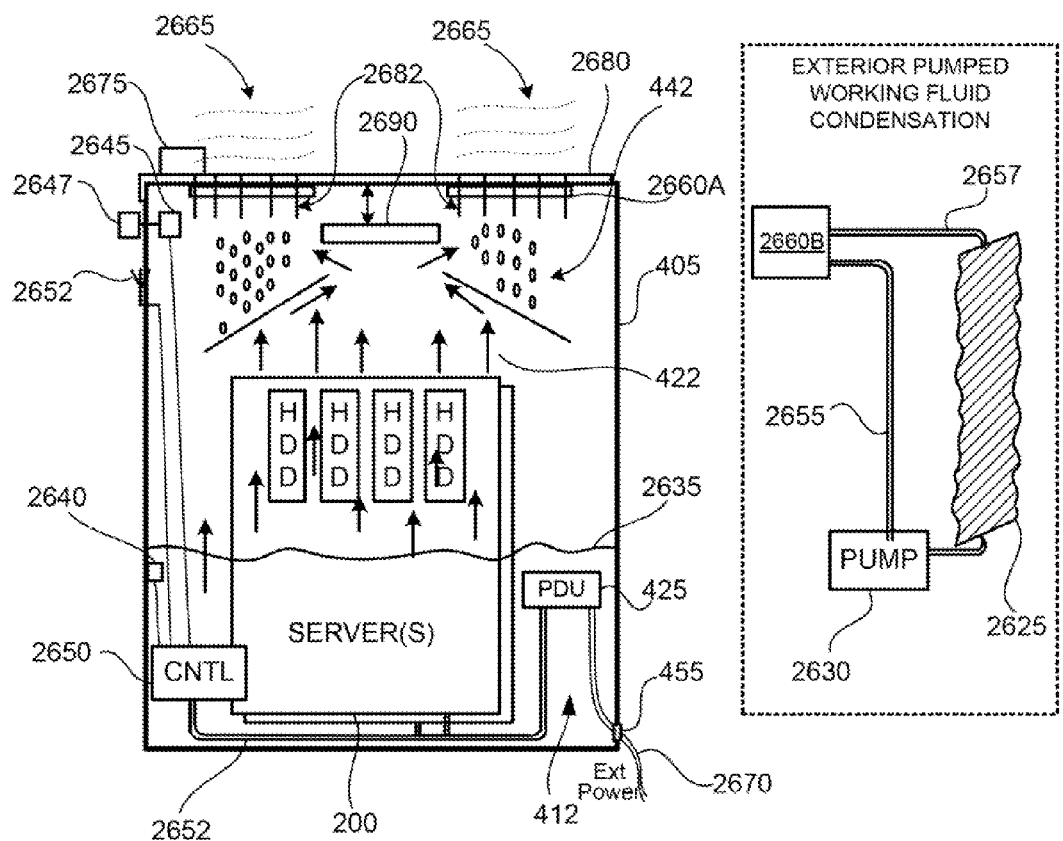
FIG. 26 is a three dimensional schematic of a stand-alone, self-contained, immersion tank data center (ITDC) including an immersion tank with one or more servers partially immersed in a dielectric liquid to enable cooling of the server components during operation, according to one or more embodiments.

FIG. 26 illustrates one embodiment of a stand-alone immersion cooling data center (SICDC), which illustrates an immersion cooling tank, such as tank 400/500, as the specific vessel. For continuity, FIG. 26 is described with reference to components of the immersion cooling tank 400 introduced in FIG. 4. SITDC 2600 includes: an enclosed immersion cooling tank casing 405 that includes a tank volume; a dielectric fluid 412 within the bottom section of the tank volume; and one or more servers (e.g., server 200/300 of FIGS. 2 and 3 or immersion server 2300 of FIG. 23) within one or more server holding structures, such as a server rack. To simplify the illustration and description thereof, these servers are represented by first server 200, which includes HDDs 125, as illustrated. Each server 200 has one or more processing components and memory submerged within the dielectric fluid for liquid-based component cooling. The immersion cooling tank 405 further includes a condenser 2660A located vertically above the plurality of servers (200) and in the direct path of rising dielectric vapor 422. According to one embodiment, the walls of the tank volume are made of a material that is weather resistant and/or the external casing or walls are coated with a surface layer that is weather resistant.

According to one embodiment that incorporates the new immersion server design, the tank volume comprises one or more server drawers 2400 (FIG. 24) with at least one vertically-oriented liquid and vapor cooled immersion servers (vLVCIS) 2300 (FIG. 23) provided therein. The tank volume is air-tight and sealed to prevent escape of dielectric fluid from the inside of the tank. One embodiment provides the use of a specific rubber grommet 455 to allow for network and power cabling to access a wall of the tank volume without allowing the escape of any of the dielectric fluid.

In one or more embodiments, the condenser 2660A is replaced with or is a passive heat exchanger, which includes the top lid 2680 of the tank being created with a heat conductive material and/or creating the lid with one or more heat conducting surface flanges 2682 as heat sinks protruding away from (i.e., extending downwards and/or upwards from) the surface of the top lid 2680. The flanges 2682 increase the surface area of the passive condenser on which the rising vapor can interface and dissipate latent heat 2665 to the exterior surface of the tank's lid. Atmospheric air (i.e., wind) blowing outside of the tank across the external surface of the tank's top lid 2680 moves the hotter air away from the tank's lid 2680 and allows the tank's lid 2680 to continue to be able to absorb more heat being dissipated by the rising dielectric vapor 422. The dielectric vapor 422 condenses on the flanges 2682 and/or the tank's lid 2680 generating a liquid condensate 442, which falls back into the lower tank volume. The provided embodiment assumes that the amount of heat being dissipated from the operating servers and other components within the tank enclosure is low enough to allow for passive heat exchange with the surrounding atmospheric air.

The SITDC 2600 also includes an electrical connector 2670 and/or an access point for running an electrical cable through which electrical power can be supplied from an external electrical power supply source (not shown). The electrical connector 2670 allows for an external supply of power to be connected to the SITDC 2600 to power the plurality of servers 200.

According to one or more embodiments, the SITDC 2600 also includes a power distribution unit (PDU) 425 located within the tank volume below a surface level 2635 of the dielectric fluid 412. PDU 425 is utilized to provide power to the plurality of servers 200 and other components or devices operating within the tank volume via one or more power cables 2652. In another embodiment, the tank volume includes an arrangement of a power distribution system that is embedded into the server rack, and which enables hot pluggable power to subsequent server chassis. The power distribution system can be configured as a Bus Bar type infrastructure.

According to an alternate embodiment, which is also illustrated by FIG. 26, the SITDC 2600 can further include components located external to the tank enclosure, including a heat exchanger 2625, an optional pump 2630, and external pipes 2655, 2657 interconnecting the components. The SITDC 2600 includes a first piping 2657 connecting the heat exchanger 2655 to the pump 2630 and connecting the pump 2630 to the intake pipes of an active condenser 2660B (i.e., a condenser with a working fluid versus a passive heat exchanger, such as condenser 2660A). A condensation fluid flows from the heat exchanger 2625 to the condenser 2660B via the first piping 2657 at a flow rate controlled by the pump 2630 and/or an intake valve mechanism (not shown). The SITDC 2600 also includes a second piping 2655 connecting the condenser 2660B to the heat exchanger 2625 and through which the condensing fluid flows from the condenser 2660B to the heat exchanger 2625. The heat exchanger 2625 can be located on an exterior wall of the tank enclosure to allow for transfer of heat to the surrounding atmosphere. Where included, the pump 2630 is also powered by the electrical power received via the electrical connector 2670. In one embodiment, the pump 2630 and any other external component can be placed within an external casing (not shown) that can be bolted onto the side of the tank 2600.

As one aspect of the disclosure, the SITDC 2600 further includes a controller 2650 located within the tank enclosure. The controller 2650 can be located below the surface layer 2635 of the dielectric fluid, in one embodiment. Additionally, in one or more embodiments, the controller 2650 can be one of, or functionality provided by one of, the immersion servers 200/300. In one or more embodiments, the tank volume includes a low-level liquid sensor 2640 that is located below a threshold surface level of the dielectric liquid (412). In yet another embodiment, the tank volume includes a plurality of pressure regulating components, including a bellows 2690 located at the top of the tank volume and air pressure sensors 2645-2647. The air pressure sensors 2645-2647 and the low-level liquid sensor 2640 are communicatively connected to the controller 2650 to provide feedback signals to the controller 2650.

When implemented within a configuration that includes an external pump 2630 (described below) for controlling fluid levels or pressure gradients within the tank, controller 2650 can be communicatively coupled to the pump 2630, and controller 2650 controls a rate at which the pump 2630 cycles the condensation fluid through the condenser 2660. Thus, in one or more embodiments, in response to receipt of a high pressure signal from the air pressure sensors 2645-2647, the controller 2650 triggers the pump 2630 to increase the cycle flow of the condensation fluid. In one or more embodiments, the controller 2650 also throttles the amount of processing being performed by one or more of the plurality of servers 200/300 to reduce an amount of heat dissipation within the tank volume. According to one embodiment, the controller 2650 includes a communication mechanism 2652 that enables communication of operating status data, including liquid levels, cooling efficiency, and average and high pressure data to an external monitoring device (not shown). In one embodiment, the communication mechanism 2652 also allows for receipt of externally-provided control parameters that can affect operation of one or more of the controller 2650, the plurality of servers 200/300, and other controllable devices or components of SITDC 2600.

In one or more embodiments, the exterior enclosure of the SITDC 2600 includes at least one secure-access service panel door (not shown). The service access panel door allows access to the various components inside of the external enclosure, including the server tray, for servicing, repair, replacement, and/or re-configuring thereof. In yet another embodiment, the SITDC also includes a dielectric fluid intake replacement assembly with a fluid intake valve (not shown). The dielectric fluid intake replacement assembly can be utilized to replenish any dielectric fluid loss that occurs, as measured by the low-level liquid sensor 2640. Finally, as illustrated, SITDC 2600 can include a handle 2675 by which a user can gain direct access to the interior of the tank by lifting the tank cover 2680 at the unhinged end.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

What is claimed is:

1. An information handling system comprising:
an immersion server drawer having:
an impervious enclosure configured with opposing side walls, opposing front and rear walls and a bottom wall;
wherein the immersion server drawer has (1) a depth dimension extending from the front wall to the rear wall that is sized to receive one or more servers in one of a first orientation and a second orientation, (2) a width dimension extending from a first side wall to a second side wall that is sized to receive one or more servers in one of a first orientation and a second orientation, and (3) a height dimension extending from the bottom wall to a top of the opposing side walls and sized to receive at least a single server; and
wherein the immersion server drawer is configured to hold a volume of immersion cooling liquid within a bottom section of the enclosure at which the one or more servers are placed to be liquid cooled.

2. The information handling system of claim 1, further comprising at least one server placed within the enclosure of the immersion server drawer in an orientation that enables one or more heat generating components of the server to be submerged under the immersion cooling liquid within the immersion server drawer to be liquid cooled.

3. The information handling system of claim 2, wherein each of the at least one server includes a motherboard having at least one processor and memory components located within a bottom region of the enclosure below a surface layer of the immersion cooling liquid.

4. The information handling system of claim 3, wherein the at least one server further comprises one or more storage devices located closer to an upper region of the enclosure, which is above the surface layer of the enclosure and at which the one or more storage devices are vapor cooled by a rising plume of vapor generated by boiling of the immersion cooling liquid within the lower enclosure.

5. The information handling system of claim 1, wherein the at least one server is an immersion server which comprises:
a motherboard having a lower surface and an upper surface;
a vertical arrangement of memory modules placed on the lower surface of the motherboard; and
at least one processor located on the upper surface of the motherboard and communicatively coupled to the memory modules by signal traces passing through the motherboard from the upper surface to the lower surface.

6. The information handling system of claim 5, wherein the immersion server further comprises:
a panel physically attached to a first perimeter edge of the motherboard and serving as a vertical support of the information handling system; and
one or more storage devices connected to the panel and communicatively connected to the at least one processor on the motherboard via connecting traces extending on the panel to the motherboard to provide data and communication buses, wherein the one or more storage devices are physically located above the components of the PCB when the information handling system is oriented vertically in an upright position to provide a vertically-oriented arrangement of functional components.

7. The information handling system of claim 5, wherein the one or more storage devices are hard disk drives (HDDs).

8. The information handling system of claim 5, wherein panel is oriented and connects at an angle relative to the motherboard such that the motherboard extends horizontally away from the panel when the panel is oriented vertically.

9. The information handling system of claim 5, wherein the vertically-oriented arrangement of functional components enables bifurcation of cooling of lower components by liquid cooling and upper components by vapor cooling, wherein the information handling system is designed to have a first set of components attached to the motherboard be submerged in a liquid and be liquid cooled during operation, while a second set of components attached on the panel above the motherboard are air cooled by rising vapor generated as the liquid reaches a boiling point and vaporizes.

10. The information handling system of claim 1, wherein the immersion server drawer comprises a plurality of immersion servers placed in a side-by-side configuration along at least one of the depth of the immersion server drawer and the width of the immersion server drawer.

11. The information handling system of claim 1, further comprising:
a dielectric cooling fluid within the lower enclosure of the immersion server drawer up to a first fluid level that covers the first set of components on the motherboard, wherein the first fluid level is below the one or more storage devices, and wherein cooling of the one or more storage devices occurs via convectional flow of rising vapor from the dielectric fluid as the dielectric fluid evaporates due to heat dissipation from the first set of components, which heat is absorbed by the dielectric fluid and raises a temperature of the dielectric fluid to a boiling point temperature.

12. The information handling system of claim 1, wherein the immersion server drawer further comprises a handle disposed within a front surface of the front wall.

13. The information handling system of claim 1, further comprising an immersion server drawer cabinet having:
at least one drawer receptacle configured to accommodate insertion of the immersion server drawer; and
a condenser located within an upper section of the enclosure, vertically above the top of the inserted immersion server drawer, and which condenses rising vapor that evaporates off the surface of the dielectric fluid held within the immersion server drawer as the one or more servers located within the immersion server drawer dissipates heat into the dielectric fluid.

14. The information handling system of claim 13, wherein the condenser receives a flow of condensation fluid from an external condensation fluid source to which the ISD cabinet is connected.

15. The information handling system of claim 13, wherein, when the immersion server drawer is fully inserted into the drawer receptacle, the front wall of the immersion drawer compresses against an exterior front perimeter surface of the drawer receptacle to create an air-tight seal, which prevents a loss of dielectric vapor generated during operation of the one or more immersion servers within the immersion server drawer.

16. The information handling system of claim 15, further comprising a latching mechanism affixed to at least one of the immersion server drawer, the drawer receptacle, and the rack enclosure and which holds the immersion server drawer in placed to maintain the air tight seal.

17. The information handling system of claim 13, wherein the immersion server drawer cabinet further comprises a top cover within which is disposed a bellows expansion lid that moderates pressure build up due to the rising vapor.

18. The information handling system of claim 13, wherein the immersion server drawer cabinet comprises multiple drawer receptacles that each accommodate a separate immersion server drawer, wherein each inserted immersion server drawer can be individually removed from a corresponding drawer receptacle while the remaining immersion server drawers continue to receive condensation of respective rising vapor via the overhead condenser.

19. The information handling system of claim 13, wherein at least one of the immersion server, the immersion server drawer, and the immersion server drawer cabinet comprises a condensate liquid deflector that channels the condensed dielectric liquid back to the lower enclosure of the immersion server drawer without the condensed dielectric liquid coming into contact with the HDDs of the one or more immersion.

20. The information handling system of claim 13, wherein the immersion server drawer cabinet is rack-mountable and designed to fit within a server rack while providing component cooling within the individual immersion server drawers.

21. An immersion server drawer cabinet assembly comprising:
an immersion server drawer cabinet having:
at least one drawer receptacle configured to accommodate insertion of an immersion server drawer; and
a condenser located within an upper section of the enclosure, vertically above the top of an inserted immersion server drawer, and which condenses rising vapor that evaporates off the surface of the dielectric fluid held within the immersion server drawer as the one or more servers located within the immersion server drawer dissipates heat into the dielectric fluid.

22. The immersion server drawer cabinet assembly of claim 21, wherein the immersion server drawer cabinet further comprises a top cover within which is disposed a bellows expansion lid that moderates pressure build up due to the rising vapor.

23. The immersion server drawer cabinet assembly of claim 21, wherein the immersion server drawer cabinet comprises multiple drawer receptacles that each accommodate a separate immersion server drawer, wherein each inserted immersion server drawer can be individually removed from a corresponding drawer receptacle while the remaining immersion server drawers continue to receive condensation of respective rising vapor via the overhead condenser.

24. The immersion server drawer cabinet assembly of claim 21, further comprising an immersion server drawer having:
an impervious enclosure configured with opposing side walls, opposing front and rear walls and a bottom wall;
wherein the immersion server drawer has (1) a depth dimension extending from the front wall to the rear wall that is sized to receive one or more servers in one of a first orientation and a second orientation, (2) a width dimension extending from a first side wall to a second side wall that is sized to receive one or more servers in one of a first orientation and a second orientation, and (3) a height dimension extending from the bottom wall to a top of the opposing side walls and sized to receive at least a single server; and
wherein the immersion server drawer is configured to hold a volume of immersion cooling liquid within a bottom section of the enclosure at which the one or more servers are placed to be liquid cooled.

25. The immersion server drawer cabinet assembly of claim 24, wherein:
when the immersion server drawer is fully inserted into the drawer receptacle, the front wall of the immersion drawer compresses against an exterior front perimeter surface of the drawer receptacle to create an air-tight seal, which prevents a loss of dielectric vapor generated during operation of the one or more immersion servers within the immersion server drawer; and the immersion server drawer cabinet assembly further comprises a latching mechanism affixed to at least one of the immersion server drawer, the drawer receptacle, and the rack enclosure, and which holds the immersion server drawer in placed to maintain the air tight seal.

26. The immersion server drawer cabinet assembly of claim 24, further comprising at least one server placed within the enclosure of the immersion server drawer in an orientation that enables one or more heat generating components of the server to be submerged under the immersion cooling liquid within the immersion server drawer to be liquid cooled.

27. The immersion server drawer cabinet assembly of claim 26, wherein the at least one server further comprises one or more storage devices located closer to an upper region of the enclosure, which is above the surface layer of the enclosure and at which the one or more storage devices are vapor cooled by a rising plume of vapor generated by boiling of the immersion cooling liquid within the lower enclosure.

* * * * *